(12) United States Patent
Misaka

(10) Patent No.: US 7,282,309 B2
(45) Date of Patent: *Oct. 16, 2007

(54) PHOTOMASK, METHOD FOR PRODUCING THE SAME, AND METHOD FOR FORMING PATTERN USING THE PHOTOMASK

(75) Inventor: Akio Misaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/598,003

(22) Filed: Nov. 13, 2006

(65) Prior Publication Data

US 2007/0054204 A1     Mar. 8, 2007

Related U.S. Application Data

(62) Division of application No. 11/312,349, filed on Dec. 21, 2005, now Pat. No. 7,144,684, which is a division of application No. 10/424,722, filed on Apr. 29, 2003, now Pat. No. 7,001,694.

(30) Foreign Application Priority Data

Apr. 30, 2002   (JP) ............................. 2002-128021

(51) Int. Cl.
    *G03F 9/00*    (2006.01)
(52) U.S. Cl. .......................................... 430/5; 430/396
(58) Field of Classification Search ................ 430/5, 430/311, 322, 323, 324, 396
    See application file for complete search history.

(56) References Cited

U.S. PATENT DOCUMENTS 5,766,805 A    6/1998  Lee et al.
5,906,910 A    5/1999  Nguyen et al.
7,001,694 B2*  2/2006  Misaka .......................... 430/5
7,144,684 B2* 12/2006  Misaka ........................ 430/311

FOREIGN PATENT DOCUMENTS

| JP | 08-227142 | 9/1996 |
| JP | 09-090601 | 4/1997 |
| JP | 10-046806 | 2/1998 |
| JP | 2000-019710 A | 1/2000 |

* cited by examiner

*Primary Examiner*—Christopher G. Young
(74) *Attorney, Agent, or Firm*—McDermott Will & Emery LLP

(57) ABSTRACT

A photomask includes a semi-light-shielding portion having a light-shielding property, a light-transmitting portion surrounded by the semi-light-shielding portion and a peripheral portion positioned in a periphery of the light-transmitting portion on a transparent substrate. The semi-light-shielding portion and the light-transmitting portion transmit the exposure light in the same phase each other, whereas the peripheral portion transmits the exposure light in a phase opposite to that of the light-transmitting portion. A phase shift film that transmits the exposure light in a phase opposite to that of the peripheral portion is formed on the transparent substrate-in the semi-light-shielding portion formation region.

20 Claims, 27 Drawing Sheets

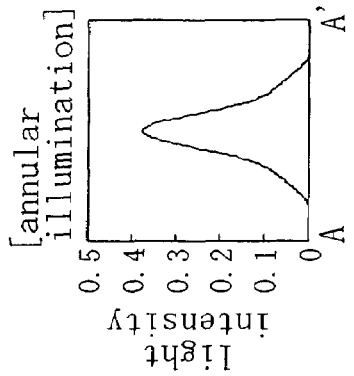
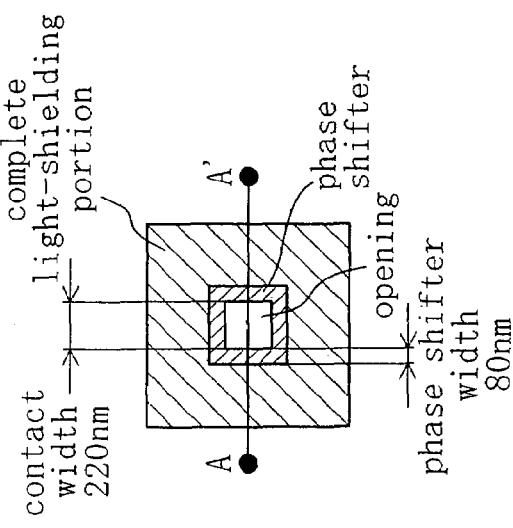
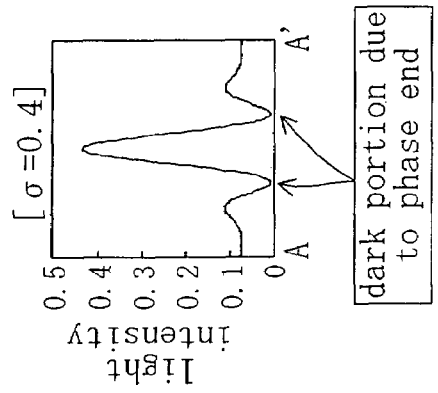
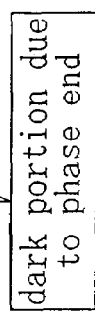
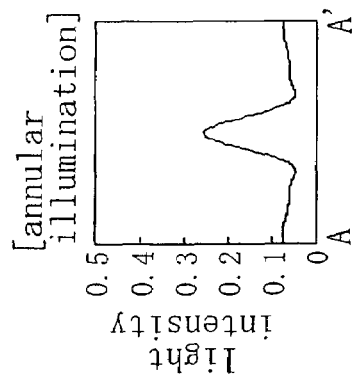
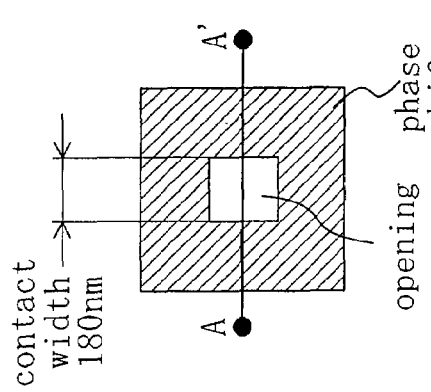

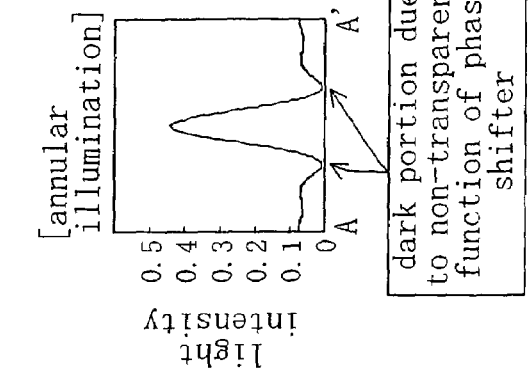
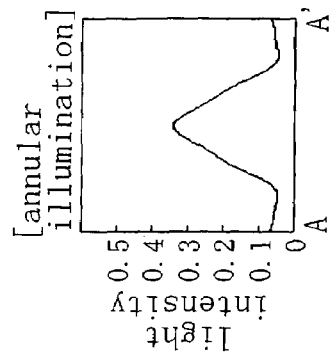
FIG. 3A
FIG. 3D
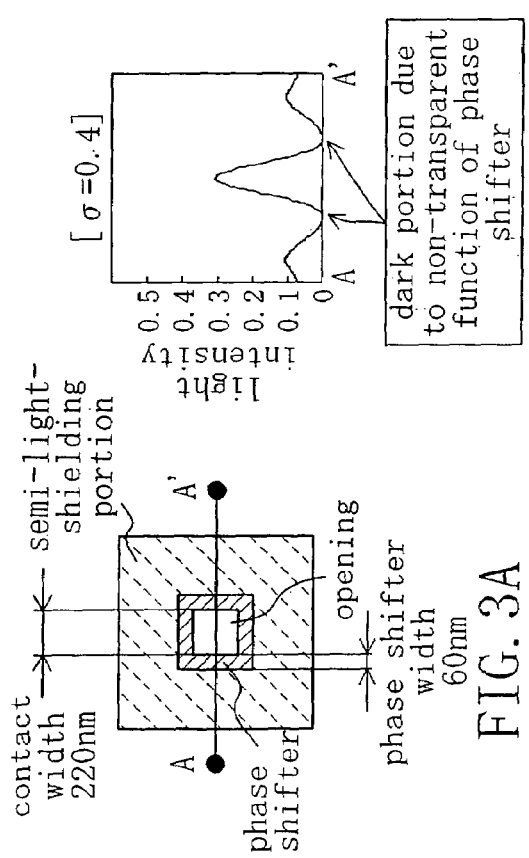
FIG. 3B
FIG. 3E
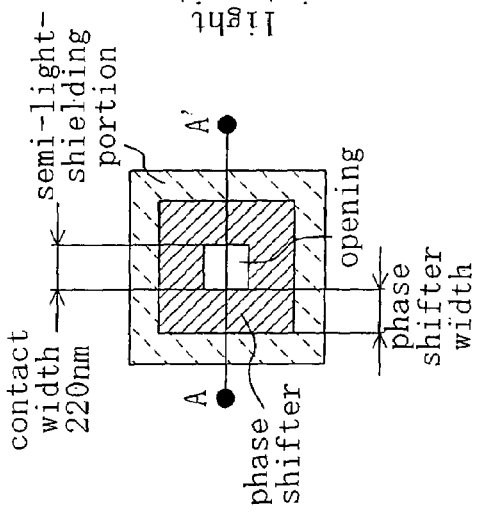
FIG. 3C
FIG. 3F

FIG. 9A

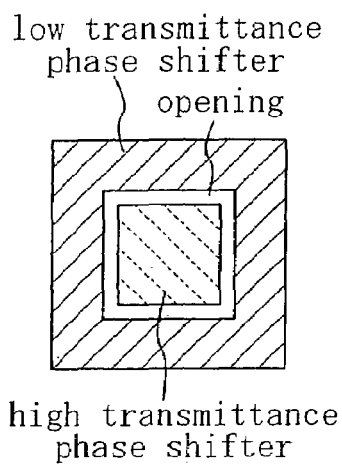

low transmittance phase shifter
opening
high transmittance phase shifter

FIG. 9B

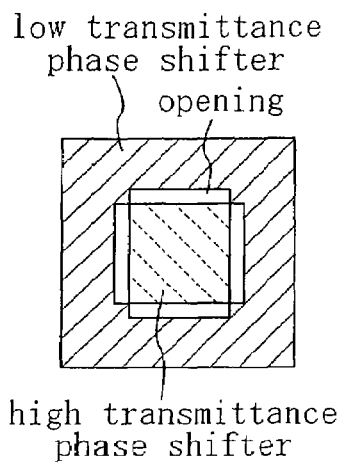

low transmittance phase shifter
opening
high transmittance phase shifter

FIG. 9C

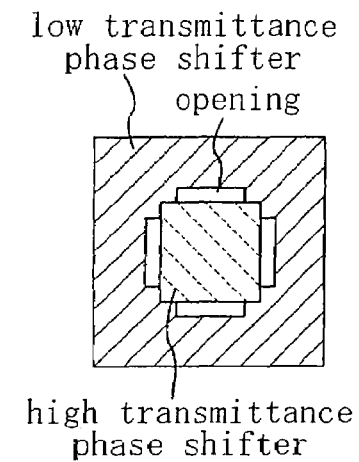

low transmittance phase shifter
opening
high transmittance phase shifter

FIG. 9D

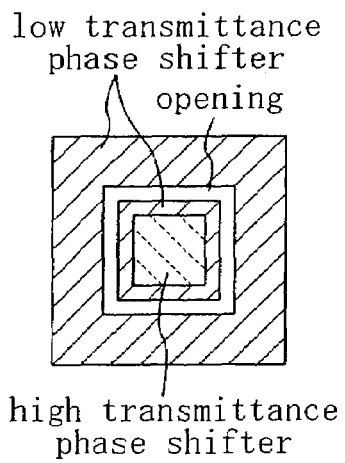

low transmittance phase shifter
opening
high transmittance phase shifter

FIG. 9E

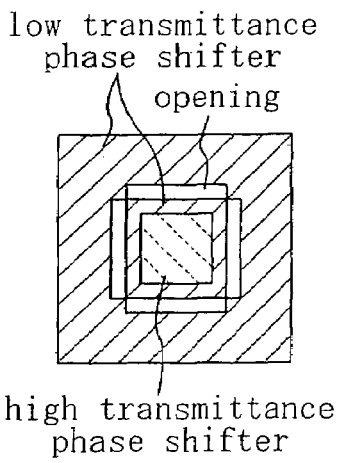

low transmittance phase shifter
opening
high transmittance phase shifter

FIG. 9F

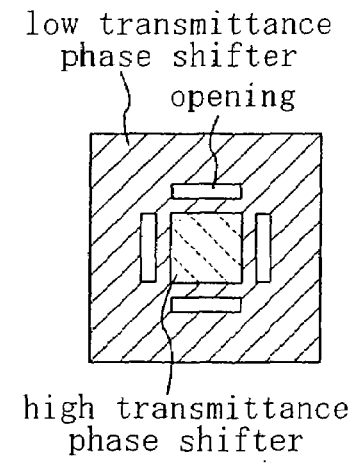

low transmittance phase shifter
opening
high transmittance phase shifter

[regular exposure light source]

[annular exposure light source]

[quadrupole exposure light source]

[annular-quadrupole mixed type exposure light source]

FIG. 13A
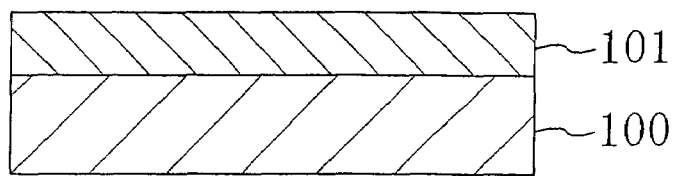
FIG. 13B
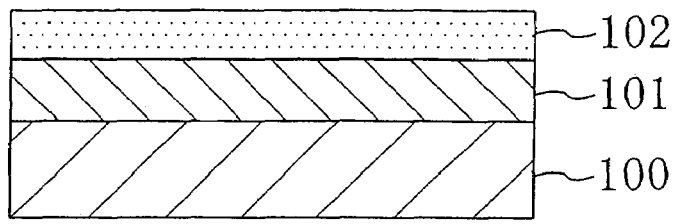
FIG. 13C
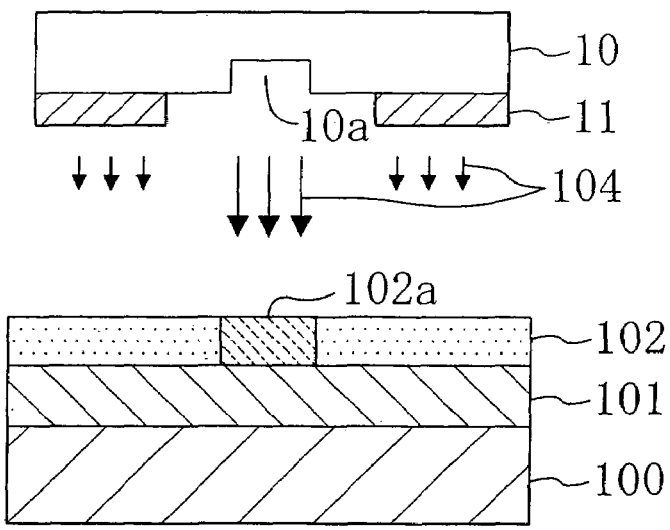
FIG. 13D
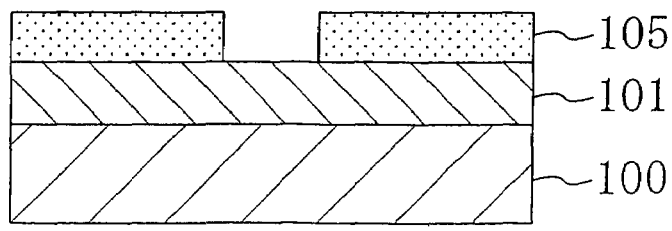

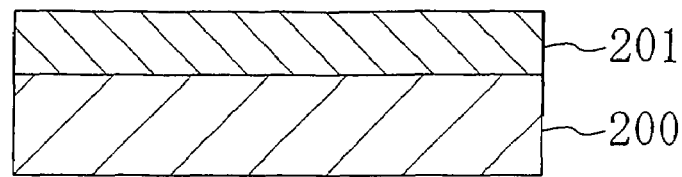
FIG. 19A
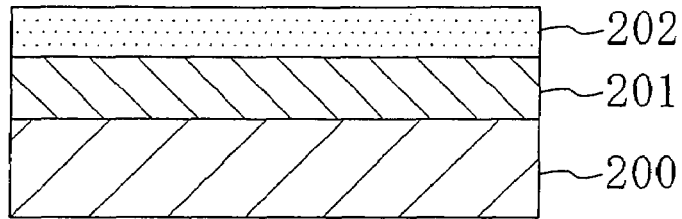
FIG. 19B
FIG. 19C
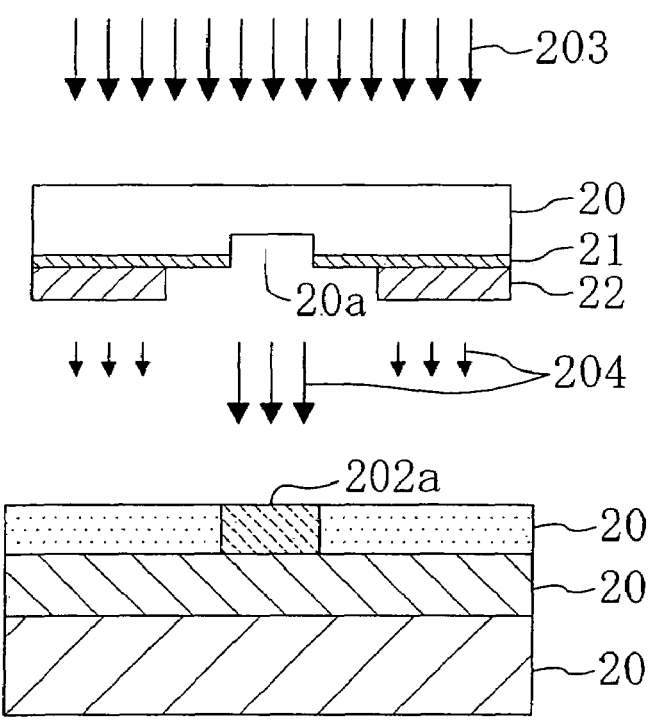
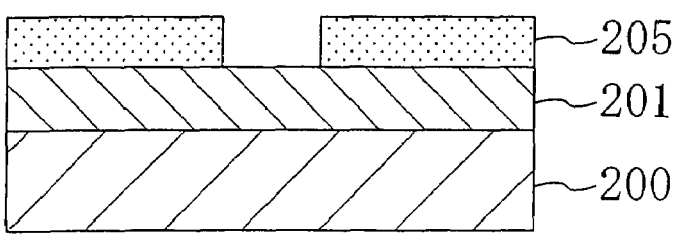
FIG. 19D

FIG. 24A
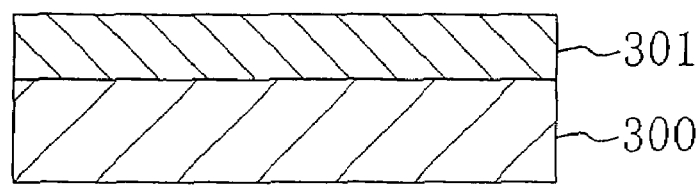
FIG. 24B
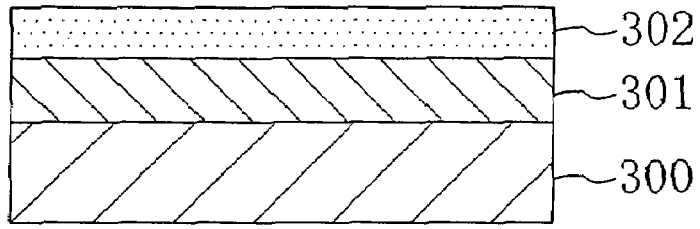
FIG. 24C
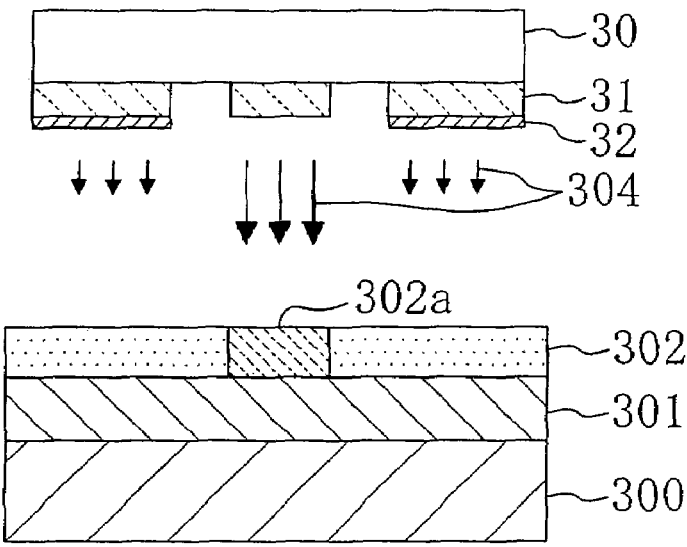
FIG. 24D
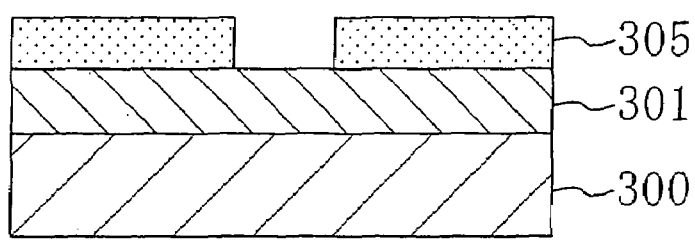

W=200nm.
d=50nm opening
transmittance:100% high transmittance phase shifter
transmittance:100%
phase difference
with opening: 180degrees low transmittance phase shifter
transmittance:7.5%
phase difference
with opening: 180 to 150 degrees

PHOTOMASK, METHOD FOR PRODUCING THE SAME, AND METHOD FOR FORMING PATTERN USING THE PHOTOMASK

RELATED APPLICATIONS

This is a divisional of U.S. patent application Ser. No. 11/312,349, filed Dec. 21, 2005 now U.S. Pat. No. 7,144,684, which is a divisional of U.S. patent application Ser. No. 10/424,722, filed Apr. 29, 2003 (now U.S. Pat. No. 7,001,694), which claims priority of Japanese application Serial No. 2002-128021, filed Apr. 30, 2002, and the contents of which are hereby incorporated by reference.

BACKGROUND OF THE INVENTION

The present invention relates to a photomask for forming a fine pattern used for producing a semiconductor integrated circuit device, a method for producing the same and a method for forming a pattern using the photomask.

In recent years, it is increasingly necessary to miniaturize circuit patterns for high integration of a large-scale integrated circuit device (hereinafter, referred to as "LSI") that can be realized with semiconductors. As a result, a reduction of the width of a line for wiring patterns constituting a circuit or miniaturization of contact hole patterns (hereinafter, referred to as "contact patterns") that connect between layered wirings formed via insulating layers have become very important.

Hereinafter, miniaturization of wiring patterns with a recent light-exposure system will be described by taking the case of using a positive resist process as an example. In a positive resist process, a line pattern refers to a line-shaped resist film (resist pattern) that are left, corresponding to a non-exposed region of a resist by exposure with a photomask and subsequent development. A space pattern refers to a portion from which a resist is removed (resist-removed pattern) corresponding to an exposed region of a resist. A contact pattern refers to a hole-like resist-removed portion and can be regarded as a small space pattern of the space patterns. When using a negative resist process instead of a positive resist process, the definition of the line pattern and the definition of the space pattern are replaced by each other.

In general, for miniaturization of wiring patterns, a method for forming a fine line pattern with oblique incident light exposure (off-axis illumination) called super resolution exposure has been used. This method is an excellent method for miniaturization of a resist pattern corresponding to a non-exposed region of a resist, and also has an effect of improving the depth of focus of dense patterns that are arranged periodically. However, this oblique incident exposure method has little effect on miniaturization of isolated resist-removed portions, and on the contrary, this method deteriorates the contrast of images (optical images) and the depth of focus. Therefore, the oblique incident exposure method is positively used to form patterns characterized in that the size of the resist-removed portion is larger than the size of a resist pattern, for example, to form gate patterns.

On the other hand, to form a micro resist-removed portion that is isolated such as a small contact pattern, it is known that it is useful to use a small light source having a low coherence degree that contains no oblique incident component. In this case, it is more useful to use a half-tone phase-shifting mask (see, for example, Japanese Laid-Open Patent Publication No. 9-90601). In the half-tone phase-shifting mask, a phase sifter that has a very low transmittance of about 3 to 6% with respect to exposure light and causes phase inversion of 180 degrees with respect to light transmitted through an opening, instead of a complete light-shielding portion, is provided as a mask pattern surrounding a light-transmitting portion (opening) corresponding to a contact pattern.

In this specification, a transmittance is represented by an effective transmittance when the transmittance of a transparent substrate is taken as 100%, unless otherwise specified. Moreover, "complete light-shielding film (complete light-shielding portion) refers to a light-shielding film (light-shielding portion) having an effective transmittance of smaller than 1%.

Hereinafter, the principle of the method for forming patterns using a half-tone phase-shifting mask will be described with reference to FIGS. 27A to 27G.

FIG. 27A is a plan view of a photomask in which an opening corresponding to a contact pattern is provided in a chromium film serving as a complete light-shielding portion provided on the surface of the mask. FIG. 27B shows the amplitude intensity corresponding to line AA' of light transmitted through the photomask shown in FIG. 27A. FIG. 27C is a plan view of a photomask in which a chromium film corresponding to a contact pattern as a complete light-shielding portion is provided in a phase shifter provided on the surface of the mask. FIG. 27D shows the amplitude intensity corresponding to line AA' of light transmitted through the photomask shown in FIG. 27C. FIG. 27E is a plan view of a photomask in which an opening corresponding to a contact pattern is provided in a phase shifter provided on the surface of the mask (i.e., a half-tone phase-shifting mask). FIGS. 27F and 28G show the amplitude intensity and the light intensity corresponding to line AA' of light transmitted through the photomask shown in FIG. 27E, respectively.

As shown in FIGS. 27B, 27D, and 27F, the amplitude intensity of light transmitted through the half-tone phase-shifting mask shown in FIG. 27E is equal to the sum of the amplitude intensities of lights transmitted through the photomasks shown in FIGS. 27A and 27C. That is to say, in the half-tone phase-shifting mask shown in FIG. 27E, the phase shifter serving as a light-shielding portion is configured so as to not only transmit light at a low transmittance, but also provide an optical path difference (phase difference) of 180 degrees with respect to the light transmitted through the opening to the light transmitted through this phase shifter. Therefore, as shown in FIGS. 27B and 27D, the light transmitted through the phase shifter has an amplitude intensity with a phase opposite to that of the light transmitted through the opening. Thus, if the amplitude intensity distribution shown in FIG. 27B and the amplitude intensity distribution shown in FIG. 27D are synthesized, a phase boundary in which the amplitude intensity is turned to 0 by a phase change is generated, as shown in FIG. 27F. As a result, as shown in FIG. 27G, in the end of the opening that is the phase boundary (hereinafter, referred to as a "phase end"), the light intensity, which is represented by a square of the amplitude intensity, becomes 0, and a significantly dark portion is formed. Accordingly, in an image of the light transmitted through the half-tone phase-shifting mask shown in FIG. 27E, strong contrast is realized in the vicinity of the opening. However, the following should be noted: This improvement of the contrast occurs with respect to light vertically incident to the mask, more specifically, that is, light incident to the mask from a small light source region having a low coherence degree. However, the contrast is not improved even in the vicinity of the opening (in the vicinity of the phase boundary in which a phase change occurs) with respect to oblique incident exposure light, for example, exposure called annular illumination in which a vertical incident component (illumination component from the center of a light source (the normal direction of the mask) is removed. Furthermore, there is another disadvantage in that compared with the case where exposure is performed with a small light source having a low coherence degree, the depth of focus is lower in the case where oblique incident exposure is performed.

As described above, in order to form a fine resist-removed pattern such as a contact pattern using a positive resist process, it was necessary to perform exposure with a small light source having a coherence degree of about 0.5 or less, which provides illumination only with vertical incident components, in combination with a half-tone phase-shifting mask. This method was very useful to form fine and isolated contact patterns.

There is a recent tendency associated with a high degree of integration of recent semiconductor devices that densely arranged patterns as well as isolated patterns are also required not only for wiring patterns but also contact patterns. In order to realize a high depth of focus when forming densely arranged contact patterns, oblique incident exposure is useful as in the case of the densely arranged wiring patterns.

Furthermore, in recent years, also when forming wiring patterns, in addition to miniaturization of line patterns serving as wiring patterns, there is an increasing demand for miniaturization of space patterns between wirings. As in the case of the isolated contact patterns, it is useful to use a light source having a low coherence degree in combination with a half-tone phase-shifting mask in order to form small isolated space patterns between wirings.

That is to say, although oblique incident exposure is essential to form high density wiring patterns and high density contact patterns, the contrast and the depth of focus of isolated contact patterns and isolated space patterns between wirings are significantly deteriorated when oblique incident exposure is performed. The contrast and the depth of focus are deteriorated even more significantly when a half-tone phase-shifting mask is used to improve the resolution.

On the other hand, when a small light source having a low coherence degree is used to form small isolated contact patterns and small isolated space patterns between wirings, it becomes difficult to form high density patterns or small line patterns.

Therefore, the optimal illumination conditions with respect to small isolated space patterns and the optical illumination conditions with respect to densely arranged patterns or small line patterns have a contradictory relationship. Therefore, in order to form small resist patterns and small isolated resist-removed patterns at the same time, a light source having a medium coherence degree (about 0.5 to 0.6) is used for a trade-off between the effect of vertical incident components from a light source and the effect of oblique incident components from a light source. However, in this case, both the effect of vertical incident components and the effect of oblique incident components are canceled, so that it is difficult to realize further high integration of semiconductor devices by miniaturizing isolated line patterns or densely arranged patterns and isolated space patterns at the same time.

SUMMARY OF THE INVENTION

Therefore, with the foregoing in mind, it is an object of the present invention to miniaturize isolated space patterns and isolated line patterns or dense patterns at the same time.

In order to achieve the above object, a photomask of the present invention includes a semi-light-shielding portion having a light-shielding property with respect to exposure light, a light-transmitting portion surrounded by the semi-light-shielding portion and having a light-transmitting property with respect to exposure light and a peripheral portion surrounded by the semi-light-shielding portion and positioned in a periphery of the light-transmitting portion on a transparent substrate. The semi-light-shielding portion and the light-transmitting portion transmit the exposure light in the same phase each other. The peripheral portion transmits the exposure light in a phase opposite to that of the semi-light-shielding portion and the light-transmitting portion. A phase shift film that has a transmittance allowing the exposure light to be transmitted partially and transmits the exposure light in a phase opposite to that of the peripheral portion is formed on the transparent substrate in a formation region for the semi-light-shielding portion formation region.

According to the photomask of the present invention, the peripheral portion that transmits exposure light in a phase opposite to that of the light-transmitting portion is sandwiched by the light-transmitting portion and the semi-light-shielding portion that transmits exposure light in the same phase as that of the light-transmitting portion. As a result, the contrast in the light intensity distribution between the light-transmitting portion and the peripheral portion can be enhanced by mutual interference between the light transmitted through the light-transmitting portion and the light transmitted through the peripheral portion. This contrast enhancement effect also can be obtained when a fine isolated resist-removed portion (i.e., a fine isolated space pattern corresponding to the light-transmitting portion) is formed with oblique incident exposure (off-axis illumination), for example, in the positive resist process. That is to say, a combination of the photomask of the present invention and oblique incident exposure can miniaturize isolated space patterns and isolated line patterns or dense patterns at the same time.

In this specification, "having light-transmitting properties with respect to exposure" means having a transmittance that allows a resist to be exposed, and "having light-shielding properties with respect to exposure" means having a transmittance that does not allow a resist to be exposed. The "same phase" means a phase difference of $(-30+360 \times n)$ degrees or more and $(30+360 \times n)$ degrees or less, (where n=an integer), and the "opposite phase" means a phase difference of $(150+360 \times n)$ degrees or more and $(210+360 \times n)$ degrees or less.

In the photomask of the present invention, the transparent substrate in a formation region for the light-transmitting portion may be dug down so as to have a thickness that transmits the exposure light in a phase opposite to that of the peripheral portion. In other words, the light-transmitting portion may be a substrate-dug portion serving as a high transmittance phase shifter.

The photomask of the present invention, the surface of the transparent substrate in a formation region for the peripheral portion may be exposed.

The photomask of the present invention, the phase shift film may be a metal-containing oxide film.

The photomask of the present invention, it is preferable that the phase shift film includes a transmittance adjusting film having a transmittance lower than that of the transparent substrate with respect to the exposure light, and a phase adjusting film that is formed on the transmittance adjusting film and transmits the exposure light in a phase opposite to that of the peripheral portion.

With this feature, a combination of a desired phase change and a desired transmittance can be selected arbitrarily for the phase shift film. Moreover, a combination of the material of the transmittance adjusting film and the material of the phase adjusting film makes it possible to improve the selection ratio at etching for processing the phase shift film.

When the phase shift film has a transmittance adjusting film and a phase adjusting film, the transmittance adjusting film may be a thin film made of a metal or a metal alloy. The transmittance adjusting film may have a thickness of 30 nm or less.

When the phase shift film has a transmittance adjusting film and a phase adjusting film, the phase adjusting film may be an oxide film.

When the phase shift film has a transmittance adjusting film and a phase adjusting film, it is preferable that the peripheral portion is disposed apart from the light-transmitting portion by a predetermined distance, and only the transmittance adjusting film of the phase shift film is formed between the peripheral portion and the light-transmitting portion. With this feature, the average of the transmittance of the peripheral portion and the transmittance of a portion in which only the transmittance adjusting film is formed between the peripheral portion and the light-transmitting portion (hereinafter, referred to as "phase adjusting film removed portion) becomes smaller than the transmittance of the peripheral portion. That is to say, the transmittance (effective transmittance) of the peripheral portion including the phase adjusting film removed portion is smaller than 1, so that a margin for size control of the peripheral portion can be increased. Furthermore, when the transmittance adjusting film is made of a single layered thin film, the light transmitted through the peripheral portion has substantially the same phase as that of the light transmitted through the phase adjusting film removed portion. In this case, compared with the case where a transmittance adjusting film in a multilayered structure is used, the peeling of the transmittance adjusting film is prevented when the transmittance adjusting film having a small width is formed between the peripheral portion and the light-transmitting portion.

In the photomask of the present invention, the peripheral portion may be disposed so as to be in contact with the light-transmitting portion or may be disposed apart from the light-transmitting portion by a predetermined distance.

In the photomask of the present invention, it is preferable that the phase shift film includes a transmittance adjusting film having a transmittance lower than that of the transparent substrate with respect to the exposure light, a phase adjusting film that is formed on the transmittance adjusting film and transmits the exposure light in a phase opposite to that of the peripheral portion, and that the transmittance adjusting film is also formed on the transparent substrate in a formation region for the peripheral portion.

With this feature, a combination of a desired phase change and a desired transmittance can be selected arbitrarily for the phase shift film. Moreover, a combination of the material of the transmittance adjusting film and the material of the phase adjusting film makes it possible to improve the selection ratio at etching for processing the phase shift film. Furthermore, since only the transmittance adjusting film is formed on the transparent substrate in the formation region for the peripheral portion, the transmittance of the peripheral portion is lower than that of the transparent substrate, and therefore the peripheral portion serves as a transmittance adjusting portion. That is to say, the transmittance of the peripheral portion can be adjusted to a desired value by the transmittance adjusting film. Therefore, it is avoided that the transmittance of the peripheral portion is the highest on the photomask, so that the degree of miniaturization required for the peripheral portion can be reduced. In other words, the problem that the upper limit of the size of the peripheral portion, i.e., the opening in the outline enhancement mask is small, which makes it difficult to produce a photomask, can be prevented.

In this case, the transmittance adjusting film may be made of a metal or a metal alloy and transmits the exposure light in the same phase as that of peripheral portion. In this case, the transmittance adjusting film may have a thickness of 30 nm or less.

In this case, the phase adjusting film may be an oxide film.

Furthermore, in this case, the peripheral portion may be disposed so as to be in contact with the light-transmitting portion or may be disposed apart from the light-transmitting portion by a predetermined distance.

In the photomask of the present invention, it is preferable that the phase shift film includes a phase adjusting film that transmits the exposure light in a phase opposite to that of the peripheral portion and a transmittance adjusting film that is formed on the phase adjusting film and has a transmittance lower than that of the transparent substrate with respect to the exposure light, the phase adjusting film is also formed on the transparent substrate in a formation region for the light-transmitting portion, and the surface of the transparent substrate in a formation region for the peripheral portion is exposed.

With this feature, a combination of a desired phase change and a desired transmittance can be selected arbitrarily for the phase shift film. Moreover, a combination of the material of the transmittance adjusting film and the material of the phase adjusting film makes it possible to improve the selection ratio at etching for processing the phase shift film.

In this case, the transmittance adjusting film may be a thin film that is made of a metal or a metal alloy and transmits the exposure light in the same phase as that of peripheral portion. In this case, the transmittance adjusting film may have a thickness of 30 nm or less.

In this case, the phase adjusting film may be an oxide film.

Furthermore, in this case, the peripheral portion may be disposed so as to be in contact with the light-transmitting portion or may be disposed apart from the light-transmitting portion by a predetermined distance.

In the photomask of the present invention, it is preferable that the transmittance with respect to the exposure light of the phase shift film is 6% or more and 15% or less.

With this feature, the contrast enhancement effect can be obtained reliably while preventing a reduction in thickness of the resist film in pattern formation.

A method for forming a pattern of the present invention uses the photomask of the present invention and includes the steps of forming a resist film on a substrate; irradiating the resist film with the exposure light via the photomask, and developing the resist film irradiated with the exposure light so as to pattern the resist film.

According to the method for forming a pattern of the present invention, the same effects as those provided by the photomask of the present invention can be obtained. Those effects can be obtained by using off-axis illumination (oblique incident exposure) in the step of irradiating the resist film with the exposure light.

A first method for producing a photomask of the present invention is a method for producing a photomask including a semi-light-shielding portion having a light-shielding property with respect to exposure light, a light-transmitting portion surrounded by the semi-light-shielding portion and having a light-transmitting property, and a peripheral portion surrounded by the semi-light-shielding portion and positioned in a periphery of the light-transmitting portion on a transparent substrate. More specifically, the method includes a first step of forming a phase shift film that has a transmittance allowing the exposure light to be transmitted partially and transmits the exposure light in a phase opposite to that of the peripheral portion on the transparent substrate in the semi-light-shielding portion formation region, and a second step of digging down the transparent substrate in the light-transmitting portion formation region so as to have a thickness that transmits the exposure light in a phase opposite to that of the peripheral portion after the first step.

According to the first method for producing a photomask, after the phase shift film that transmits exposure light partially in an opposite phase is formed on the transparent substrate in the light-shielding portion formation region, the transparent substrate in the light-transmitting portion formation region is dug down so as to have a thickness that transmits the exposure light in the opposite phase. Therefore, the peripheral portion that transmits exposure light in a phase opposite to that of the light-transmitting portion is sandwiched by the light-transmitting portion serving as a high transmittance phase shifter and the semi-light-shielding portion serving as a low transmittance phase shifter that transmits exposure light in the same phase as that of the light-transmitting portion. Consequently, the contrast in the light intensity distribution between the light-transmitting portion and the peripheral portion can be enhanced by mutual interference between the light transmitted through the light-transmitting portion and the light transmitted through the peripheral portion. This contrast enhancement effect also can be obtained when a fine isolated resist-removed portion (i.e., a fine isolated space pattern corresponding to a light-transmitting portion) is formed with oblique incident exposure, for example, in the positive resist process. That is to say, oblique incident exposure can miniaturize isolated space patterns and isolated line patterns or dense patterns at the same time.

In the first method for producing a photomask, it is preferable that the first step includes the step of removing the phase shift film in the light-transmitting portion formation region and the peripheral portion formation region after the phase shift film is formed on the entire surface of the transparent substrate.

With this feature, after the phase shift film is formed on the transparent substrate, the phase shift film and the transparent substrate are etched selectively, and therefore a mask pattern with any shape can be easily realized that has the semi-light-shielding portion serving as a low transmittance phase shifter and the peripheral portion, and a light-transmitting portion with any shape can be easily realized that serves as a high transmittance phase shifter. Furthermore, when the light-transmitting portion and the peripheral portion are apart, in other words, when the phase shift film is left between the light-transmitting portion and the peripheral portion, using the phase shift film patterned in the first step as a mask, the transparent substrate can be etched in a self-alignment manner in the second step. Therefore, photomask process can be performed precisely.

In the first method for producing a photomask, it is preferable that the first step includes the step of removing the phase shift film in the peripheral portion formation region after the phase shift film is formed on the entire surface of the transparent substrate, and the second step includes the step of removing the phase shift film in the light-transmitting portion formation region before digging down the transparent substrate in the light-transmitting portion formation region.

With this feature, after the phase shift film is formed on the transparent substrate, the phase shift film and the transparent substrate are etched selectively, and therefore a mask pattern with any shape can be easily realized that has the semi-light-shielding portion serving as a low transmittance phase shifter and the peripheral portion, and a light-transmitting portion with any shape can be easily realized that serves as a high transmittance phase shifter. Furthermore, the step of removing the phase shift film in the peripheral portion formation region and the step of removing the phase shift film in the light-transmitting portion formation region can be performed separately, so that when the light-transmitting portion formation region and the peripheral portion formation region are apart by a small distance, that is, when the phase shift film having a small width is left between the light-transmitting portion and the peripheral portion, a margin for photomask processing can be increased.

In the first method for producing a photomask, it is preferable that the phase shift film includes a transmittance adjusting film having a transmittance lower than that of the transparent substrate with respect to the exposure light, and a phase adjusting film that is formed on the transmittance adjusting film and transmits the exposure light in a phase opposite to that of the peripheral portion.

With this feature, a combination of a desired phase change and a desired transmittance can be selected arbitrarily for the phase shift film. Moreover, a combination of the material of the transmittance adjusting film and the material of the phase adjusting film makes it possible to improve the selection ratio at etching for processing the phase shift film.

In the first method for producing a photomask, it is preferable that the first step includes the step of forming a transmittance adjusting film having a transmittance lower than that of the transparent substrate with respect to the exposure light and a phase adjusting film that transmits the exposure light in a phase opposite to that of the peripheral portion sequentially on the entire surface of the transparent substrate, and then removing the phase adjusting film in the light-transmitting portion formation region and the peripheral portion formation region, so that the phase shift film including the transmittance adjusting film and the phase adjusting film is formed on the transparent substrate in the semi-light-transmitting portion formation region, and the second step includes the step of removing the transmittance adjusting film in the light-shielding portion formation region before digging down the transparent substrate in the light-transmitting portion formation region.

With this feature, since the transmittance adjusting film is formed on the transparent substrate in the formation region for the peripheral portion, the transmittance of the peripheral portion is lower than that of the transparent substrate, and therefore the peripheral portion serves as a transmittance adjusting portion. That is to say, the transmittance of the peripheral portion can be adjusted to a desired value by the transmittance adjusting film. Therefore, it is avoided that the transmittance of the peripheral portion is the highest on the photomask, so that the degree of miniaturization required for the peripheral portion can be reduced. In other words, the problem that the upper limit of the size of the peripheral portion, i.e., the opening in the enhancement mask is small, which makes it difficult to produce a photomask, can be prevented. Furthermore, after the transmittance adjusting film and the phase adjusting film are formed sequentially on the transparent substrate, the phase adjusting film, the transmittance adjusting film and the transparent substrate are etched, and therefore a mask pattern with any shape can be easily realized that has the semi-light-shielding portion serving as a low transmittance phase shifter and the peripheral portion serving as a transmittance adjusting portion, and a light-transmitting portion with any shape can be easily realized that serves as a high transmittance phase shifter. Furthermore, when the light-transmitting portion and the peripheral portion are apart, in other words, when the phase adjusting film is left between the light-transmitting portion and the peripheral portion, using the patterned phase adjusting film as a mask, the transparent substrate can be etched in a self-alignment manner. Therefore, photomask process can be performed precisely.

In the first method for producing a photomask, it is preferable that the first step includes the step of forming a transmittance adjusting film having a transmittance lower than that of the transparent substrate with respect to the exposure light and a phase adjusting film that transmits the exposure light in a phase opposite to that of the peripheral portion sequentially on the entire surface of the transparent substrate, and then removing the phase adjusting film in the peripheral portion formation region, so that the phase shift film including the transmittance adjusting film and the phase adjusting film is formed on the transparent substrate in the semi-light-shielding portion formation region, and the second step includes the step of sequentially removing the phase adjusting film and the transmittance adjusting film in the light-transmitting portion formation region before digging down the transparent substrate in the light-transmitting portion formation region.

With this feature, since the transmittance adjusting film is formed on the transparent substrate in the formation region for the peripheral portion, the transmittance of the peripheral portion is lower than that of the transparent substrate, and therefore the peripheral portion serves as a transmittance adjusting portion. That is to say, the transmittance of the peripheral portion can be adjusted to a desired value by the transmittance adjusting film. Therefore, it is avoided that the transmittance of the peripheral portion is the highest on the photomask, so that the degree of miniaturization required for the peripheral portion can be reduced. In other words, the problem that the upper limit of the size of the opening in the outline enhancement mask is small, which makes it difficult to produce a photomask, can be prevented. Furthermore, after the transmittance adjusting film and the phase adjusting film are formed sequentially on the transparent substrate, the phase adjusting film, the transmittance adjusting film and the transparent substrate are etched, and therefore a mask pattern with any shape can be easily realized that has the semi-light-shielding portion serving as a low transmittance phase shifter and the peripheral portion serving as a transmittance adjusting portion, and a light-transmitting portion with any shape can be easily realized that serves as a high transmittance phase shifter. Furthermore, the step of removing the phase adjusting film in the peripheral portion formation region and the step of removing the phase adjusting film in the light-transmitting portion are performed separately, so that when the light-transmitting portion formation region and the peripheral portion formation region are apart by a small distance, that is, when the phase adjusting film having a small width is left between the light-transmitting portion and the opening, a margin for photomask processing can be increased.

A second method for producing a photomask of the present invention is a method for producing a photomask including a semi-light-shielding portion having a light-shielding property with respect to exposure light, a light-transmitting portion surrounded by the semi-light-shielding portion and having a light-transmitting property with respect to exposure light, and a peripheral portion surrounded by the semi-light-shielding portion and positioned in a periphery of the light-transmitting portion on a transparent substrate. More specifically, the method includes a first step of forming a phase adjusting film that transmits the exposure light in a phase opposite to that of the peripheral portion and a transmittance adjusting film having a transmittance lower than that of the transparent substrate with respect to the exposure light sequentially on the entire surface of the transparent substrate, a second step of removing the phase adjusting film and the transmittance adjusting film on the peripheral portion formation region, and a third step of removing the transmittance adjusting film in the light-transmitting portion formation region after the second step. The phase adjusting film and the transmittance adjusting film formed on the transparent substrate in the semi-light-shielding portion formation region constitute the phase shift film that has a transmittance that allows the exposure light to be transmitted partially and transmits the exposure light in a phase opposite to that of the peripheral portion.

According to the second method for producing a photomask, after the phase adjusting film and the transmittance adjusting film are formed on the transparent substrate, the phase adjusting film and the transmittance adjusting film in the peripheral portion formation region are removed. Then, the transmittance adjusting film in the light-transmitting portion formation region is removed. As a result, a phase shift film including the phase adjusting film and the transmittance adjusting film, that is, a phase shift film that transmits exposure light partially in an opposite phase is formed on the transparent substrate in the semi-light-shielding portion formation region, and a single layered structure of the phase adjusting film is formed on the transparent substrate in the light-transmitting portion formation region. Therefore, the peripheral portion that transmits exposure light in a phase opposite to that of the light-transmitting portion is sandwiched by the light-transmitting portion serving as a high transmittance phase shifter and the semi-light-shielding portion serving as a low transmittance phase shifter that transmits exposure light in the same phase as that of the light-transmitting portion. Consequently, the contrast in the light intensity distribution between the light-transmitting portion and the peripheral portion can be enhanced by mutual interference between the light transmitted through the light-transmitting portion and the light transmitted through the peripheral portion. This contrast enhancement effect also can be obtained when a fine isolated resist-removed portion (i.e., a fine isolated space pattern corresponding to a light-transmitting portion) is formed with oblique incident exposure, for example, in the positive resist process. That is to say, oblique incident exposure can miniaturize isolated space patterns and isolated line patterns or dense patterns at the same time. After the phase adjusting film and the transmittance adjusting film are formed sequentially on the transparent substrate, the transmittance adjusting film and the phase adjusting film are etched, and therefore a mask pattern with any shape can be easily realized that has the semi-light-shielding portion serving as a low transmittance phase shifter and the peripheral portion, and a light-transmitting portion with any shape can be easily realized that serves as a high transmittance phase shifter.

In the first and second methods for producing a photomask, it is preferable that the transmittance with respect to the exposure light of the phase shift film is 6% or more and 15% or less.

With this feature, the contrast enhancement effect can be obtained reliably while preventing a reduction in thickness of the resist film in pattern formation.

BRIEF DESCRIPTION OF THE DRAWINGS

FIGS. 2A to 2F are diagrams illustrating the dependence of the conventional image enhancement effect utilizing phase end on the shape of a light source.

FIGS. 3A to 3F are diagrams illustrating the limit of the size of a phase shifter in the outline enhancement method of the present invention.

PIGS. 9A to 9F are diagrams illustrating variations of the layout of a light shielding mask patterns constituted by a low transmittance phase shifter and an opening in the outline enhancement mask provided with a high transmittance phase shifter corresponding to a contact pattern.

Figure 10A:
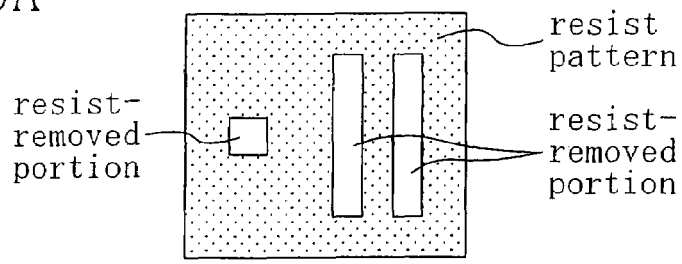
Figure 10B:
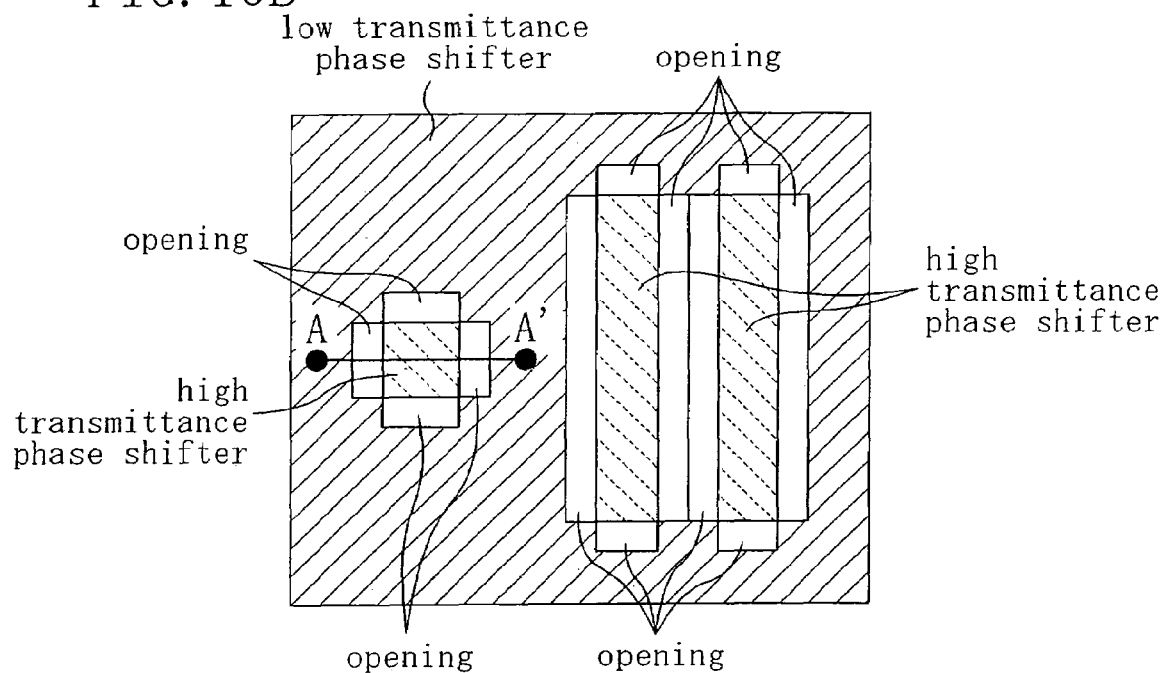
Figure 10C:
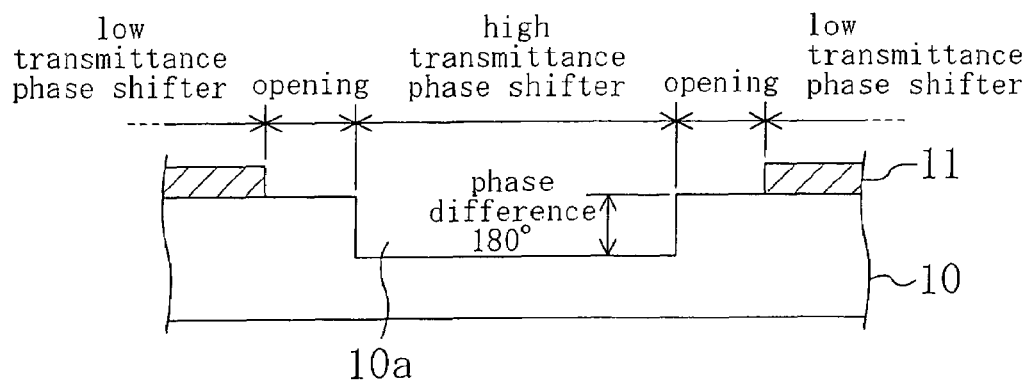

FIG. 10A shows a view showing an example of a desired pattern to be formed with a photomask of a first embodiment of the present invention. FIG. 10B is a plan view of the photomask of the first embodiment of the present invention. FIG. 10C is a cross-sectional view taken along line AA' in FIG. 10B.

Figure 11A:
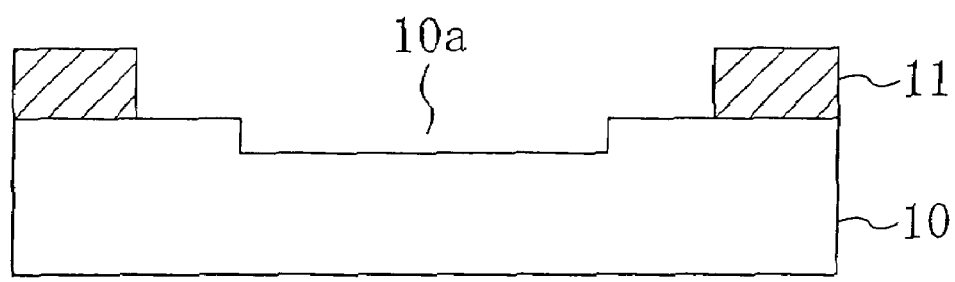
Figure 11B:
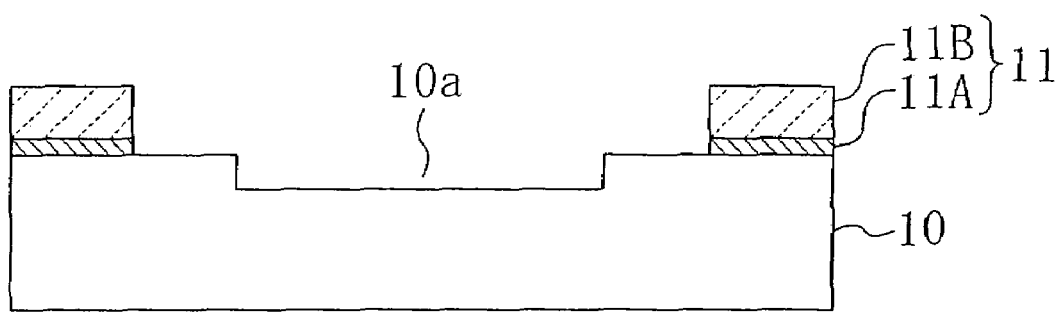

FIG. 11A is a cross-sectional view when the phase shift film is a single layered film in the photomask of the first embodiment of the present invention. FIG. 11B is a cross-sectional view when the phase shift film is a layered film of a transmittance adjusting film and a phase adjusting film in the photomask of the first embodiment of the present invention.

Figure 12A:
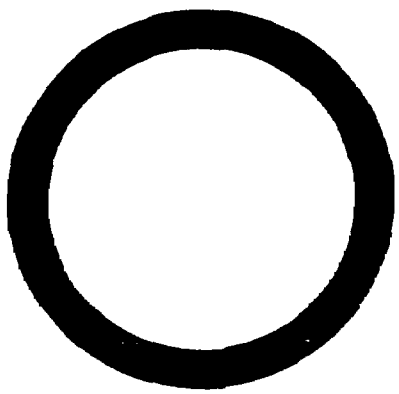
Figure 12B:
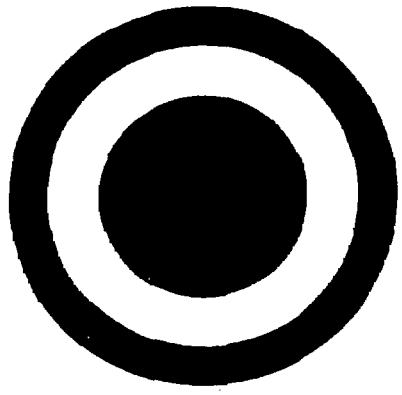
Figure 12C:
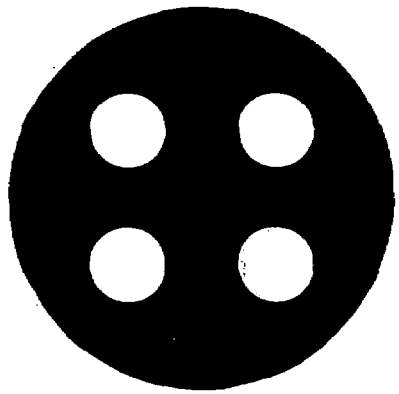
Figure 12D:
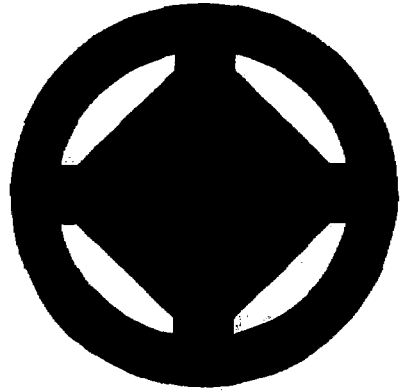

FIG. 12A is a view showing the shape of a regular exposure light source. FIG. 12B is a view showing the shape of an annular exposure light source. FIG. 12C is a view showing the shape of a quadrupole exposure light source. FIG. 12D is a view showing the shape of an annular— quadrupole mixed type exposure light source.

FIGS. 13A to 13D are cross-sectional views showing the processes of a method forming a pattern with the photomask of the first embodiment of the present invention.

Figure 14A:
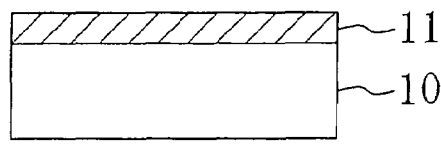
Figure 14B:
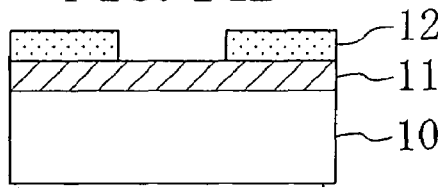
Figure 14C:
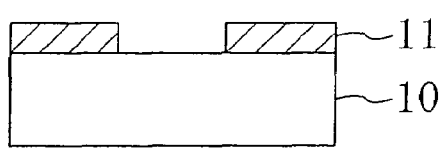

FIGS. 14A to 14E are cross-sectional views showing the processes of a method producing the photomask of the first embodiment of the present invention. FIG. 14F is a plan view corresponding to the cross-sectional view of FIG. 14C, and FIG. 14G is a plan view corresponding to the cross-sectional view of FIG. 14E.

Figure 15A:
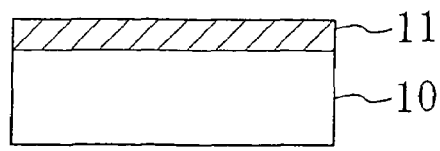
Figure 15B:
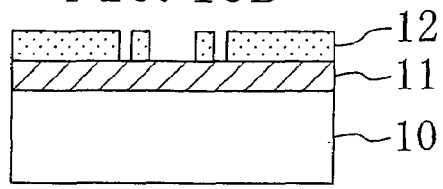
Figure 15C:
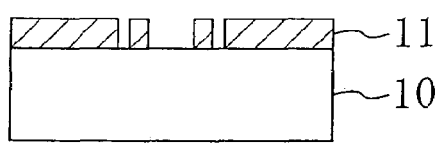

FIGS. 15A to 15E are cross-sectional views showing the processes of a method producing the photomask of a first variation example of the first embodiment of the present invention. FIG. 15F is a plan view corresponding to the cross-sectional view of FIG. 15C, and FIG. 15G is a plan view corresponding to the cross-sectional view of FIG. 15E.

Figure 16A:
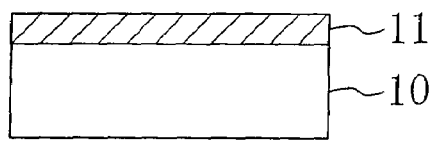
Figure 16B:
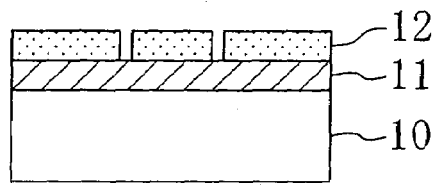
Figure 16C:
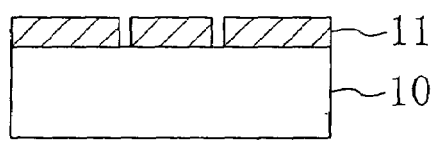

FIGS. 16A to 16E are cross-sectional views showing the processes of a method producing the photomask of a second variation example of the first embodiment of the present invention. FIG. 16F is a plan view corresponding to the cross-sectional view of FIG. 16C, and FIG. 16G is a plan view corresponding to the cross-sectional view of FIG. 16E.

Figure 17A:
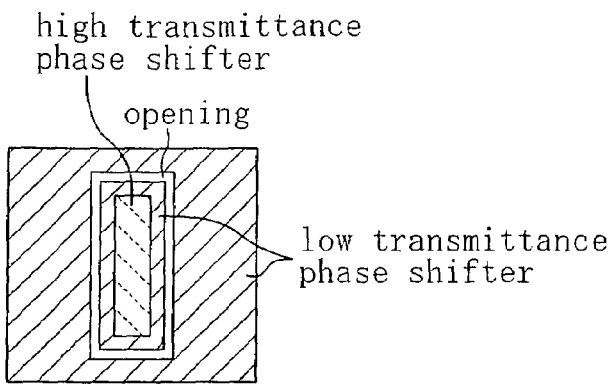
Figure 17B:
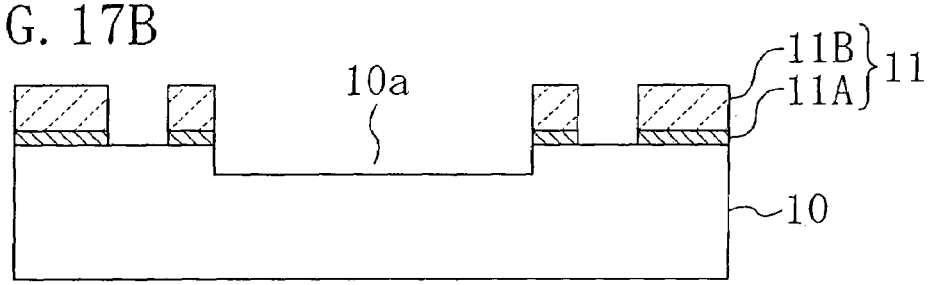
Figure 17C:
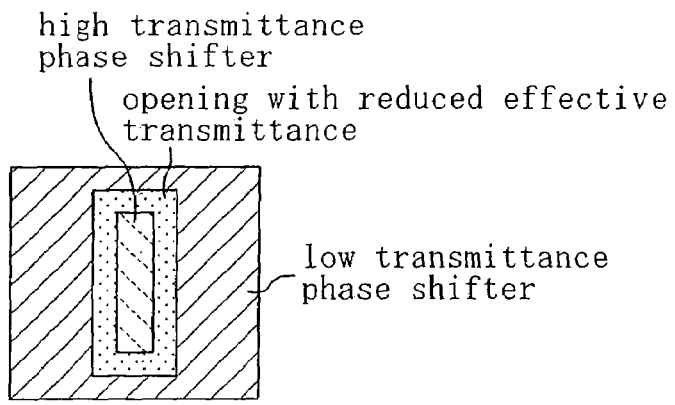
Figure 17D:
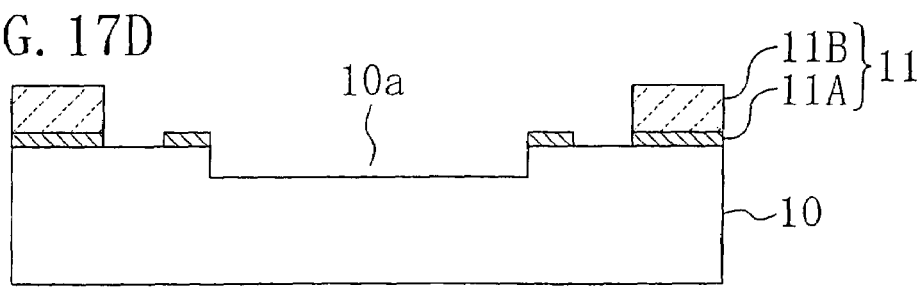

FIGS. 17A and 17B are a plan view and a cross-sectional view of the photomask of a third variation example of the first embodiment of the present invention, respectively. FIGS. 17C and 17D are a plan view and a cross-sectional view of the photomask of the third variation example of the first embodiment of the present invention in which the phase adjusting film between the opening and the high transmittance phase shifter has been removed, respectively.

Figure 18A:
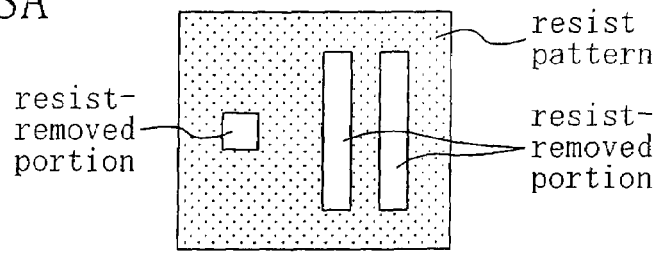
Figure 18B:
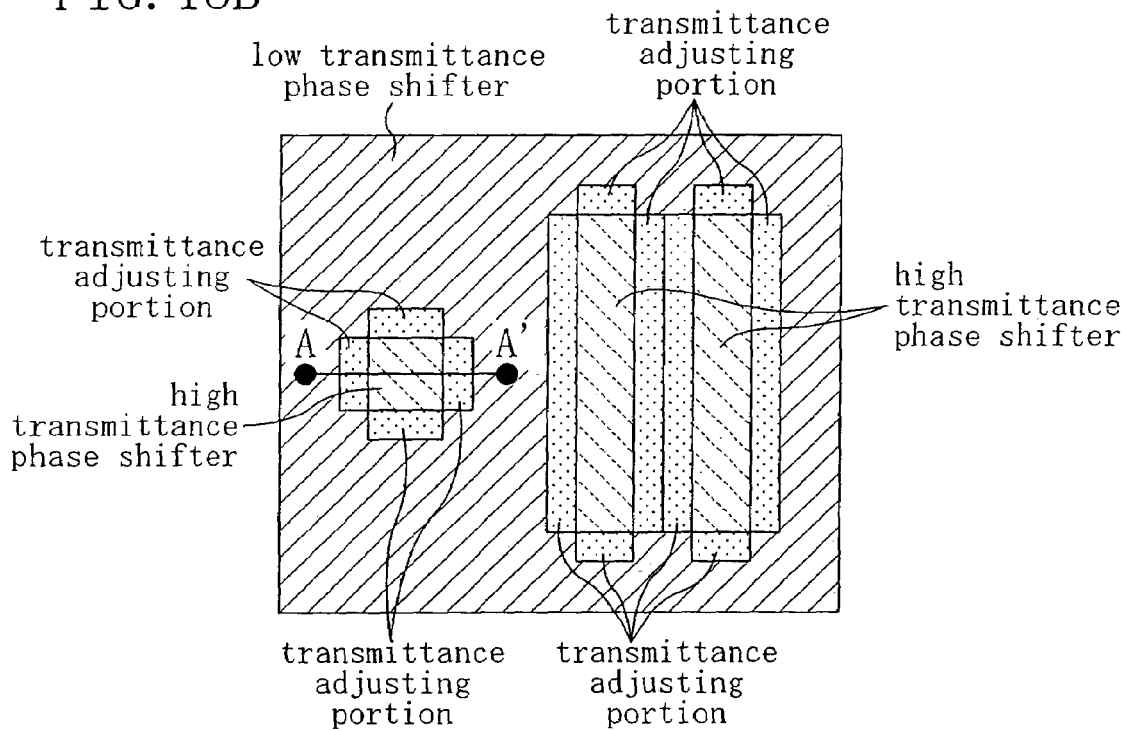
Figure 18C:
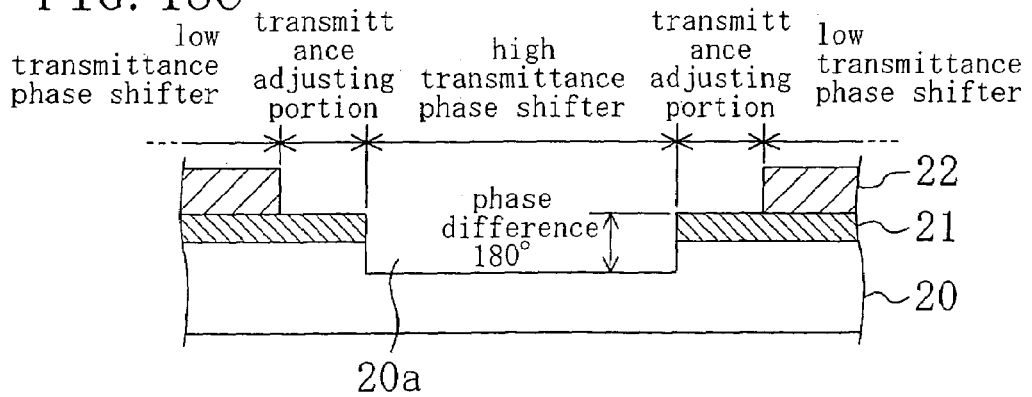

FIG. 18A is a view showing an example of a desired pattern to be formed with the photomask of a second embodiment of the present invention. FIG. 18B is a plan view of the photomask of the second embodiment of the present invention. FIG. 18C is a cross-sectional view taken along line AA' of FIG. 18B.

FIGS. 19A to 19D are cross-sectional views showing the processes of a method forming a pattern with the photomask of the second embodiment of the present invention.

Figure 20A:
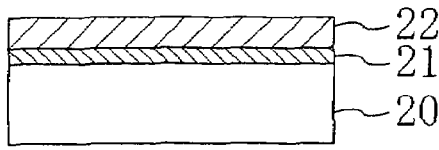
Figure 20B:
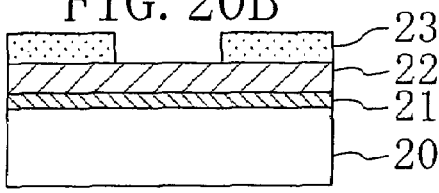
Figure 20C:
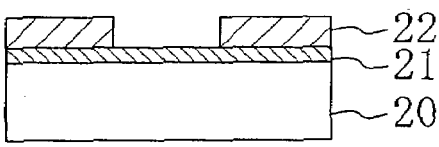

FIGS. 20A to 20E are cross-sectional views showing the processes of a method producing the photomask of the second embodiment of the present invention. FIG. 20F is a plan view corresponding to the cross-sectional view of FIG. 20C, and FIG. 20G is a plan view corresponding to the cross-sectional view of FIG. 20E.

Figure 21A:
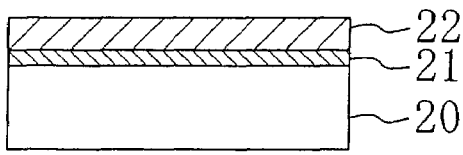
Figure 21B:
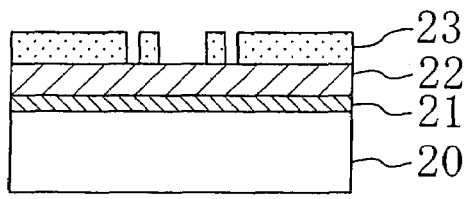
Figure 21C:
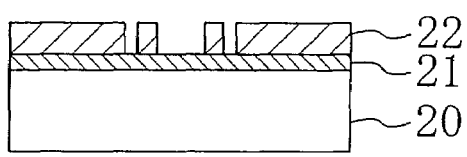

FIGS. 21A to 21E are cross-sectional views showing the processes of a method producing the photomask of a first variation example of the second embodiment of the present invention. FIG. 21F is a plan view corresponding to the cross-sectional view of FIG. 21C, and FIG. 21G is a plan view corresponding to the cross-sectional view of FIG. 21E.

Figure 22A:
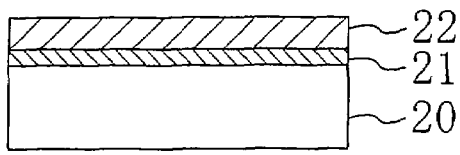
Figure 22B:
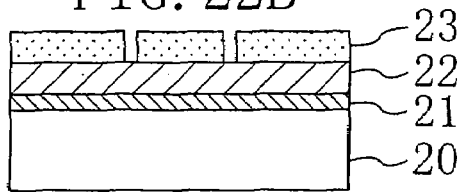
Figure 22C:
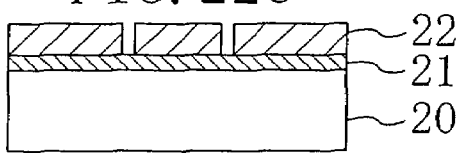

FIGS. 22A to 22E are cross-sectional views showing the processes of a method producing the photomask of a second variation example of the second embodiment of the present invention. FIG. 22F is a plan view corresponding to the cross-sectional view of FIG. 22C, and FIG. 22G is a plan view corresponding to the cross-sectional view of FIG. 22E.

Figure 23A:
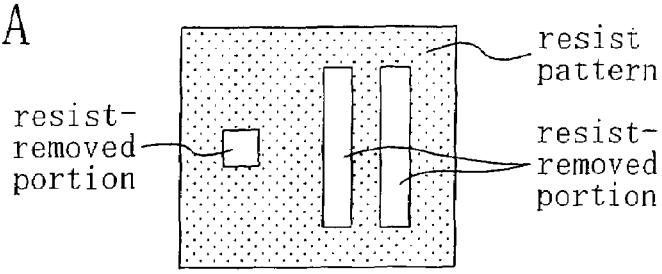
Figure 23B:
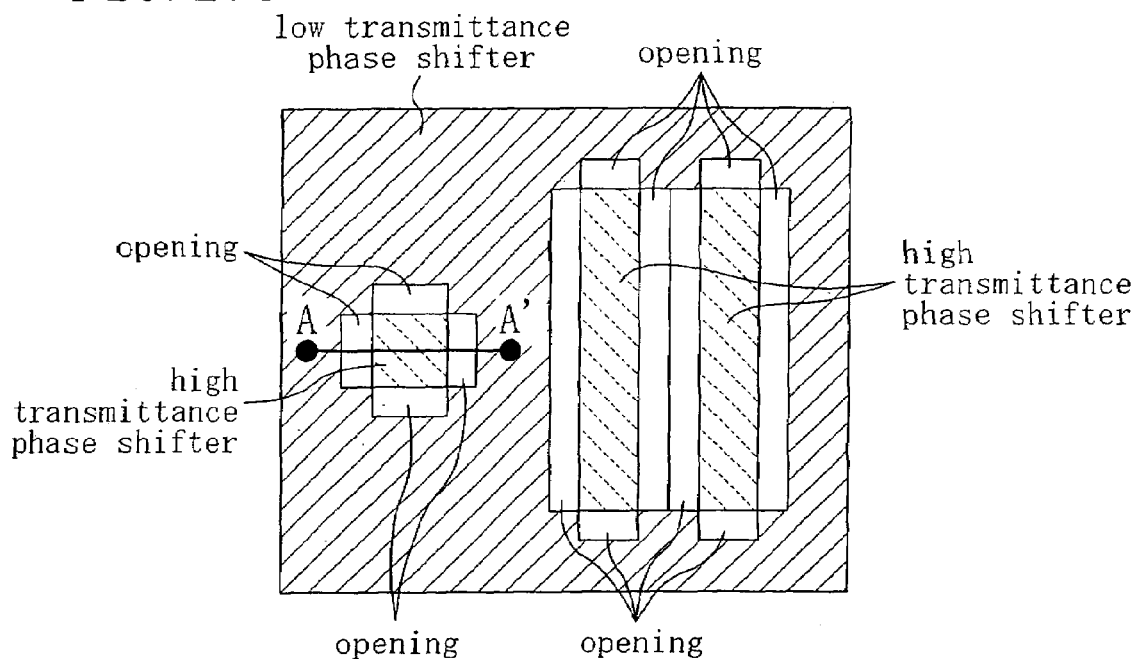
Figure 23C:
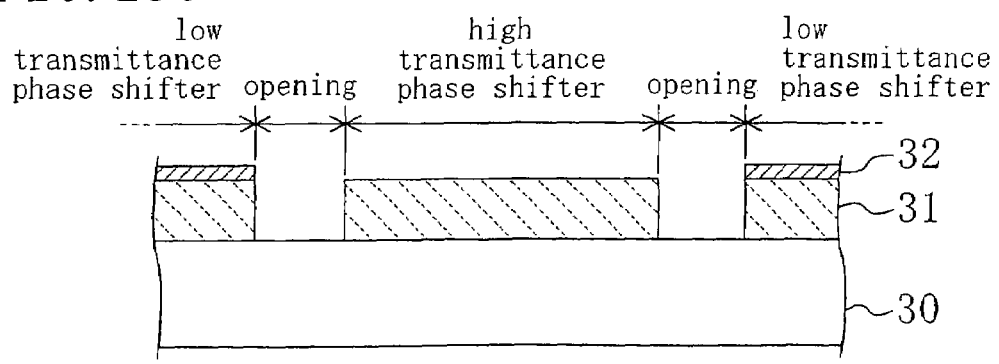

FIG. 23A is a view showing an example of a desired pattern to be formed with the photomask of a third embodiment of the present invention. FIG. 23B is a plan view of the photomask of the third embodiment of the present invention. FIG. 23C is a cross-sectional view taken along line AA' of FIG. 23B.

FIGS. 24A to 24D are cross-sectional views showing the processes of a method forming patterns with the photomask of the third embodiment of the present invention.

Figure 25A:
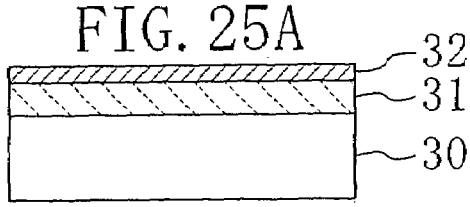
Figure 25B:
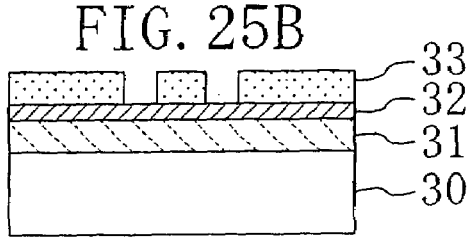
Figure 25C:
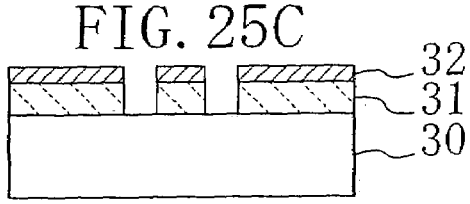

FIGS. 25A to 25E are cross-sectional views showing the processes of a method producing the photomask of the third embodiment of the present invention. FIG. 25F is a plan view corresponding to the cross-sectional view of FIG. 25C, and FIG. 25G is a plan view corresponding to the cross-sectional view of FIG. 25E.

Figure 26A:
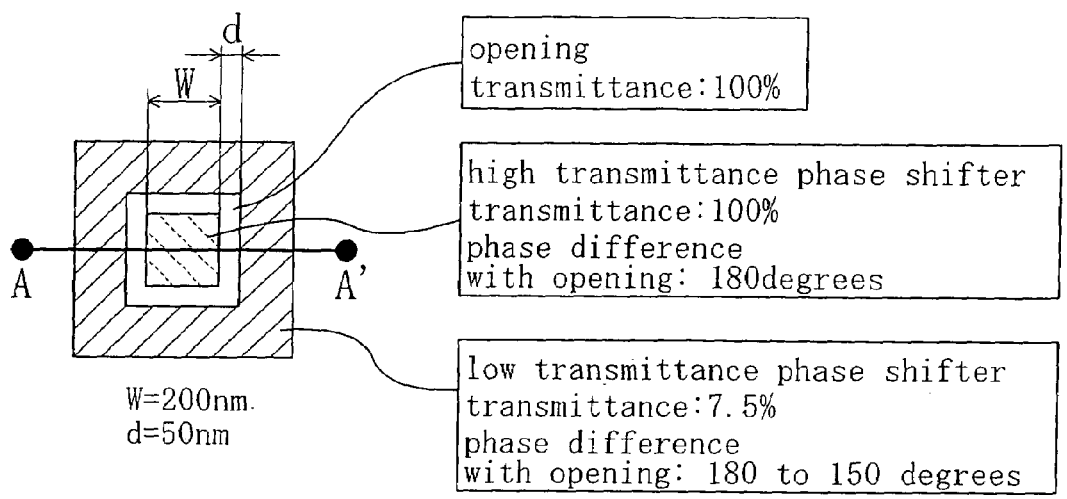
Figure 26B:
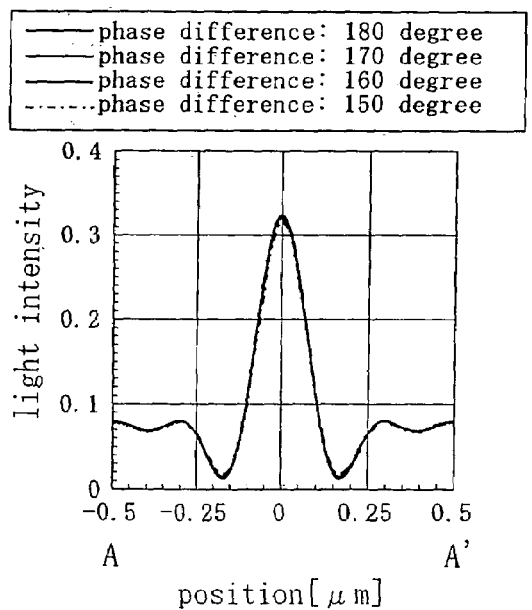
Figure 26C:
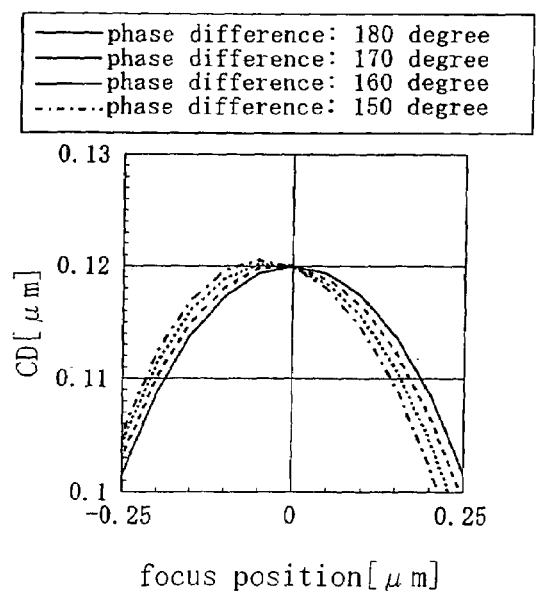

FIGS. 26A to 26C are diagrams illustrating the influence of a phase change caused by use of a thin light-shielding film as the transmittance adjusting film of the photomask of the third embodiment of the present invention on the formation of patterns.

FIGS. 27A to 27G are diagrams illustrating the image enhancement principle with a conventional half-tone phase-shifting mask.

DETAILED DESCRIPTION OF THE INVENTION

First, a method for improving the resolution with the photomask invented by the inventors of the present application to realize the present invention, more specifically, an "outline enhancement method" to improve the resolution of isolated space patterns will be described below.

Outline Enhancement Method

Hereinafter, the outline enhancement method will be described by taking formation of contact patterns by a positive resist process as an example. The "outline enhancement method" is a principle that can be used for any patterns, regardless of its shape, as long as the patterns are small space patterns in a positive resist process. Furthermore, the "outline enhancement method" can be applied to a negative resist process totally in the same manner, if the small space patterns (resist-removed patterns) in the positive resist process are replaced by small patterns (resist patterns).

FIGS. 1A to 1G are diagrams illustrating the principle to enhance the contract of transferred images of light in exposure for forming contact patterns.

Figure 1A:
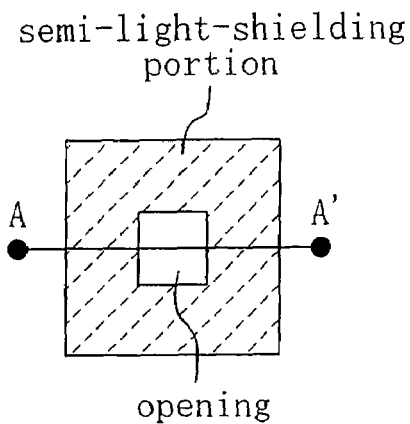
FIGS. 1A to 1G are diagrams illustrating the principle of the outline enhancement method of the present invention.
Figure 1B:
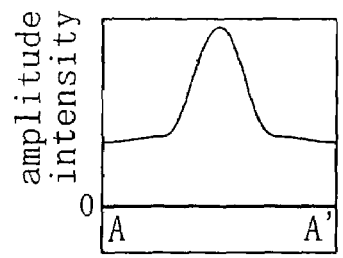

FIG. 1A is a plan view of a photomask in which an opening (i.e., light-transmitting portion) corresponding to a contact pattern is surrounded by a semi-light-shielding portion having a transmittance of 6% or more and 15% or less with respect to exposure light. FIG. 1B shows the amplitude intensity corresponding to line AA' of light transmitted through the photomask shown in FIG. 1A.

Figure 1C:
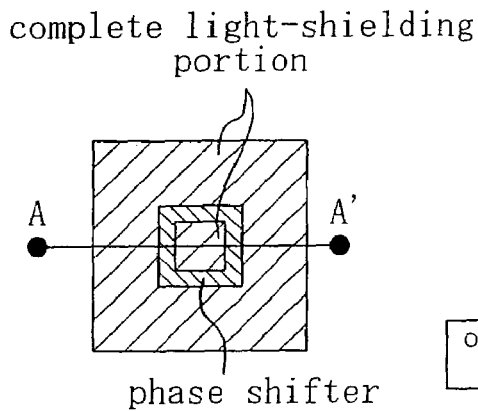
Figure 1D:
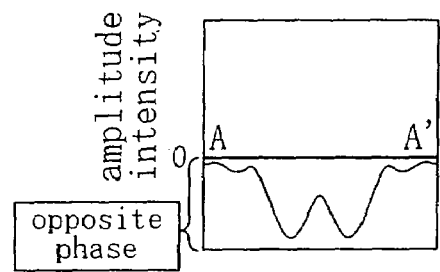

FIG. 1C is a plan view of a photomask in which a phase shifter is disposed in a peripheral area of the opening shown in FIG. 1A, and a complete light-shielding portion is disposed in the other area. FIG. 1D shows the amplitude intensity corresponding to line AA' of light transmitted through the photomask shown in FIG. 1C. The amplitude intensity of light shown in FIG. 1D is that of the light transmitted through a phase shifter, and therefore this amplitude intensity has an opposite phase with respect to the amplitude intensity of light shown in FIG. 1B.

Figure 1E:
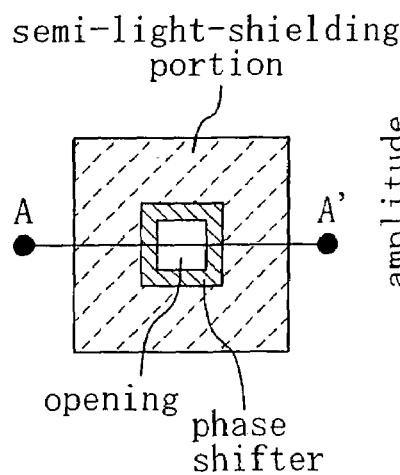
Figure 1F:
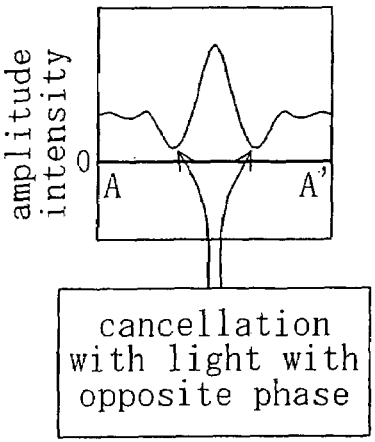
Figure 1G:
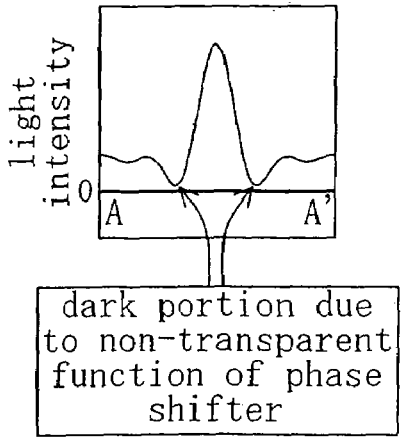

FIG. 1E is a plan view of a photomask in which an opening corresponding to a contact pattern and a phase shifter disposed in the peripheral area of the opening are surrounded by a semi-light-shielding portion having a transmittance of 6% or more and 15% or less with respect to exposure light. FIGS. 1F and 1G are the amplitude intensity and the light intensity (a square of the amplitude intensity of light) corresponding to line AA' of light transmitted through the photomask shown in FIG. 1E. The photomask shown in FIG. 1E is a photomask obtained by disposing a phase shifter in a peripheral area of the opening in the photomask shown in FIG. 1A. The photomask shown in FIG. 1E is an example of the photomask of the present invention that can realize the outline enhancement method (hereinafter, referred to as "outline enhancement mask");

The photomask shown in FIG. 1A or 1E, the light transmitted through the semi-light shielding portion and the light transmitted through the opening have the same phase (more specifically, a phase difference of (−30+360×n) degrees or more and (30+360×n) degrees or less, where n=an integer). In the photomask shown in FIG. 1E, the light transmitted through the phase shifter and the light transmitted through the opening have opposite phases (more specifically, a phase difference of (150+360×n) degrees or more and (210+360×n) degrees or less, where n=an integer).

The principle based on which transferred image of light transmitted through the outline enhancement mask shown in FIG. 1E is as follows. The structure of the photomask shown in FIG. 1E is a structure in which the photomasks shown in FIGS. 1A and 1C are overlapped each other. Therefore, as shown in FIGS. 1B, 1D, and 1F, the amplitude intensity of light transmitted through the photomask shown in FIG. 1E has a distribution similar to that obtained by overlapping the amplitude intensities of the lights transmitted through the photomasks shown in FIGS. 1A and 1C. As seen from FIG. 1F, in the photomask shown in FIG. 1E, if the intensity of light transmitted through the phase shifter disposed in the periphery of the opening can cancel a part of each of the lights transmitted through the opening and the semi-light shielding portion. Therefore, in the photomask shown in FIG. 1E, if the intensity of the light transmitted through the phase shifter is adjusted such that light in the periphery of the opening is canceled, it is possible to form a light intensity distribution in which the light intensity corresponding to the periphery of the opening is reduced to nearly 0, as shown in FIG. 1G.

In the photomask shown in FIG. 1E, the light transmitted through the phase shifter cancels the light in the periphery of the opening to a high degree, but cancels the light in the vicinity of the center of the opening to a low degree. As a result, there is another advantage that the slope of the profile of the light intensity distribution of the light transmitted through the photomask shown in FIG. 1E in which the light intensity changes from the center of the opening to the periphery of the opening is increased, as shown in FIG. 1G. Therefore, the light intensity distribution of the light transmitted through the photomask shown in FIG. 1E has a sharp profile, so that images having a high contrast can be formed.

Above described is the principle based on which optical images (images of light intensity) in the present invention are enhanced. In other words, a phase shifter is disposed along the outline of an opening in a mask formed of a semi-light shielding portion having a low transmittance, so that it is possible to form a very dark portion corresponding to the outline of the opening in a light intensity image formed with the photomask shown in FIG. 1A. Thus, a light intensity distribution in which the contrast between the light intensity in the opening and the light intensity in the periphery of the opening is enhanced can be formed. In this specification, a method by which image enhancement is performed based on this principle is referred to as the "outline enhancement method", and the photomask that realizes this principle is referred to as an "outline enhancement mask".

Hereinafter, the difference between the outline enhancement method, which is the basic principle of the present invention, and the principle of a conventional method using a half-tone phase-shifting mask will be described. The most important point of the principle of the outline enhancement mask is that a part of the light transmitted through each of the semi-light shielding portion and the opening is canceled by the light transmitted through the phase shifter, so that a dark portion is formed in the light intensity distribution, that is, that the phase shifter behaves in a manner similar to a non-transparent pattern (opaque pattern). Therefore, as shown in FIG. 1F, a dark portion is formed by a change in intensity on the same phase side in the amplitude intensity of the light transmitted through the outline enhancement mask. Only in this state, the contrast can be improved by oblique incident exposure, which will be described in detail later.

Figure 27A:
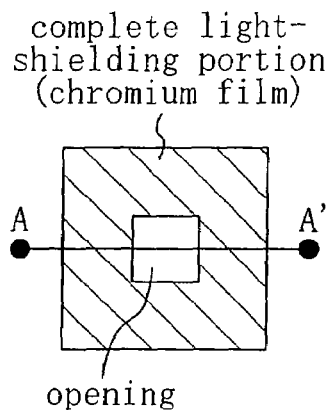
Figure 27B:
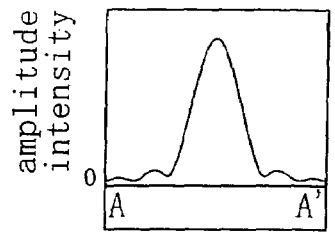
Figure 27C:
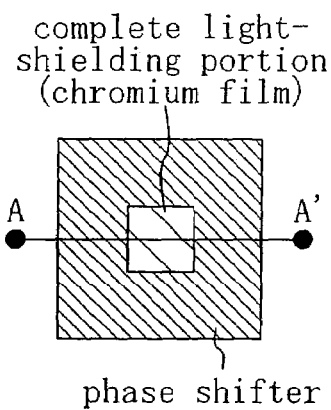
Figure 27D:
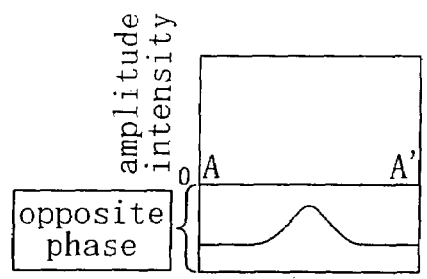
Figure 27E:
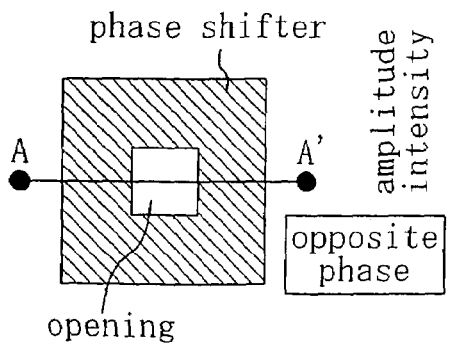
Figure 27F:
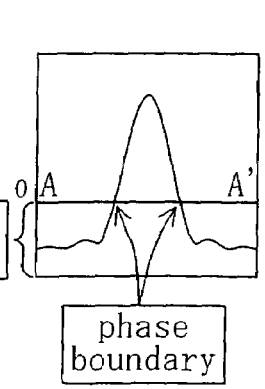
Figure 27G:
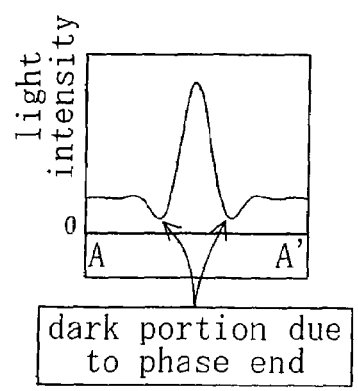

On the other hand, also in the light intensity distribution obtained by exposure with the conventional half-tone phase-shifting mask having an opening corresponding to a contact pattern, a very dark portion is formed in the periphery of the opening, as shown in FIG. 27G. However, when the amplitude intensity of the light shown in FIG. 27F obtained by exposure with the half-tone phase-shifting mask is compared with the amplitude intensity of the light shown in FIG. 1F obtained by exposure with the outline enhancement mask, the following difference is clearly present. As shown in FIG. 27F, in the amplitude intensity distribution obtained by exposure with the half-tone phase-shifting mask, a phase boundary in which a phase inversion occurs is present. As shown in FIG. 27G, this phase boundary constitutes a dark portion of the light intensity distribution due to the phase end and thus image enhancement is realized. However, in order to form a dark portion due to the phase end to obtain an enhancement effect of the contract, a component of light incident vertically to the photomask is required. On the other hand, oblique incident exposure cannot provide a dark portion due to a phase end, even if the phase boundary is generated, and consequently the contrast enhancement effect cannot be obtained. This is the reason why the contrast enhancement effect cannot be obtained when oblique incident exposure is performed with the half-tone phase-shifting mask. In other words, in order to obtain the contrast enhancement effect with the half-tone phase-shifting mask, it is necessary to perform exposure using a small light source having a low coherence degree.

As described above, in forming contact patterns, although the light intensity distribution with the half-tone phase-shifting mask is similar to that with the outline enhancement mask, the outline enhancement method can provide a higher contrast to a transferred image of light, which is necessary for forming small isolated space patterns, even with oblique incident exposure, because of the difference in the principle for formation of a dark portion (the phase boundary is not generated in the amplitude intensity distribution of the light transmitted through the outline enhancement mask (see FIG. 1F).

FIG. 2A is a plan view of a half-tone phase-shifting mask in which an opening corresponding to a contact pattern is surrounded by a phase shifter. FIG. 2B shows calculation results of the light intensity distribution corresponding to line AA' when exposure is performed with a small light source having a small coherence degree σ=0.4 with respect to the half-tone phase-shifting mask shown in FIG. 2A. FIG. 2C shows calculation results of the light intensity distribution corresponding to line AA' when exposure is performed with annular illumination, which is one type of oblique incident exposure, with respect to the half-tone phase-shifting mask shown in FIG. 2A. In this case, what is called ⅔ annular illumination having an outer diameter σ of 0.75 and an inner diameter σ of 0.5 is used as the annular illumination. For the exposure conditions, the light source wavelength λ is 193 nm (ArF light source) and the numerical aperture NA is 0.6. The contact size is 180 nm square, and the transmittance of the phase shifter is 6%. In the following description, the light intensity is shown by a relative light intensity when taking the light intensity of exposure light as 1, unless otherwise specified.

As shown in FIGS. 2B and 2C, when the half-tone phase-shifting mask is used, a dark portion due to a phase end is formed in the light intensity distribution from exposure with a small light source and an image having a high contrast can be formed. On the other hand, in the light intensity distribution from oblique incident exposure, a dark portion due to a phase end is not formed, and therefore an image having a very poor contrast is formed.

FIG. 2D is a plan view of an edge enhancement phase-shifting mask in which an opening corresponding to a contact pattern and a phase shifter positioned in an area surrounding the opening are surrounded by a chromium film serving as a complete light-shielding portion. FIG. 2E shows calculation results of the light intensity distribution corresponding to line AA' when exposure is performed with a small light source having a small coherence degree σ=0.4 with respect to the edge enhancement phase-shifting mask shown in FIG. 2D. FIG. 2F shows calculation results of the light intensity distribution corresponding to line AA' when exposure is performed with annular illumination with respect to the edge enhancement phase-shifting mask shown in FIG. 2E. Herein, similarly to the half-tone phase-shifting mask, the "edge enhancement phase-shifting mask" is a mask that can realize image enhancement by forming a dark portion due to a phase end between an opening and a phase shifter. The type of annular illumination, the exposure conditions and the transmission of the phase shifter are the same as those in the case of the half-tone phase-shifting mask shown in FIGS. 2A to 2C. The contact size is 220 nm square, and the width of the phase shifter is 80 nm.

As shown in FIGS. 2E and 2F, when the edge enhancement phase-shifting mask is used, similarly to the case of the half-tone phase-shifting mask, a dark portion due to a phase end is formed in the light intensity distribution from exposure with a small light source, and an image having a high contrast can be formed. On the other hand, in the light intensity distribution from oblique incident exposure, a dark portion due to a phase end is not formed, and therefore an image having a very poor contrast is formed.

Next, in the outline enhancement method, before showing in detail that oblique incident exposure components can provide high contrast, the fact that the structure of the outline enhancement mask as shown in FIG. 1E cannot provide the outline enhancement effect when the width of the phase shifter becomes too large will be described.

FIG. 3A is a plan view of an outline enhancement mask in which an opening corresponding to a contact pattern and a phase shifter having a small width positioned in an area surrounding the opening are surrounded by a semi-light shielding portion having a transmittance of 6% or more and 15% or less with respect to exposure light. FIG. 3B shows calculation results of the light intensity distribution corresponding to line AA' when exposure is performed with a small light source having a small coherence degree σ=0.4 with respect to the outline enhancement mask shown in FIG. 3A. FIG. 3C shows calculation results of the light intensity distribution corresponding to line AA' when exposure is performed with annular illumination with respect to the outline enhancement mask shown in FIG. 3A.

FIG. 3D is a plan view of an outline enhancement mask in which an opening corresponding to a contact pattern and a phase shifter having a large width positioned in an area surrounding the opening are surrounded by a semi-light shielding portion having a transmittance of 6% or more and 15% or less with respect to exposure light. FIG. 3E shows calculation results of the light intensity distribution corresponding to line AA' when exposure is performed with a small light source having a small coherence degree σ=0.4 with respect to the outline enhancement mask shown in FIG. 3D. FIG. 3F shows calculation results of the light intensity distribution corresponding to line AA' when exposure is performed with annular illumination with respect to the outline enhancement mask shown in FIG. 3D.

In this case, it is assumed that the width of the phase shifter in the outline enhancement mask shown in FIG. 3D is set to be too large to satisfy the principle of the outline enhancement method. More specifically, the sizes of the openings shown in FIGS. 3A and 3D are both 220 nm square, and the width of the phase shifter shown in FIG. 3A is 60 nm and the width of the phase shifter shown in FIG. 3D is 150 nm. The types of the annular illumination and the exposure conditions are the same as those in the case of the half-tone phase-shifting mask shown in FIGS. 2A to 2C.

As shown in FIGS. 3B and 3C, when the outline enhancement mask shown in FIG. 3A that satisfies the principle of the outline enhancement method is used, a dark portion due to a non-transparent function of the phase shifter appears regardless of the type of the light source and the contrast in the light intensity distribution is higher in the annular illumination.

On the other hand, when the outline enhancement mask shown in FIG. 3D with an excessively large phase shifter is used, the light transmitted through the phase shifter is too strong, so that an amplitude intensity distribution having an opposite phase is formed. In this situation, the same principle as in the case of the half-tone phase-shifting mask or the edge enhancement phase-shifting mask acts. In other words, as shown in FIGS. 3E and 3F, a dark portion due to a phase end is formed in the light intensity distribution obtained by exposure with a small light source and the contrast enhancement effect is provided, whereas no dark portion due to a phase end is formed in the light intensity distribution obtained by oblique incident exposure, so that an image having very poor contrast is formed.

In other words, in order to realize the outline enhancement method, in the mask structure, it is necessary that not only the phase shifter is disposed in the periphery of the opening surrounded by the semi-light shielding portion, but also that the light transmitted through the phase shifter is limited. According to the mechanism of the principle, the latter means that the light transmitted through the phase shifter has an intensity that at least can cancel the lights transmitted through the semi-light shielding portion and the opening, and the intensity distribution having an opposite phase with a predetermined size or more is not formed in its amplitude intensity distribution.

In order to actually limit the light transmitted through the phase shifter, a condition (more specifically the upper limit) can be imposed on the width of the phase shifter, depending on the transmittance of the phase shifter. Hereinafter, the condition will be described with reference to the results of observing conditions under which the light from the periphery of the phase shifter is cancelled by the light transmitted through the phase shifter (see FIGS. 4A and 4B).

Figure 4A:
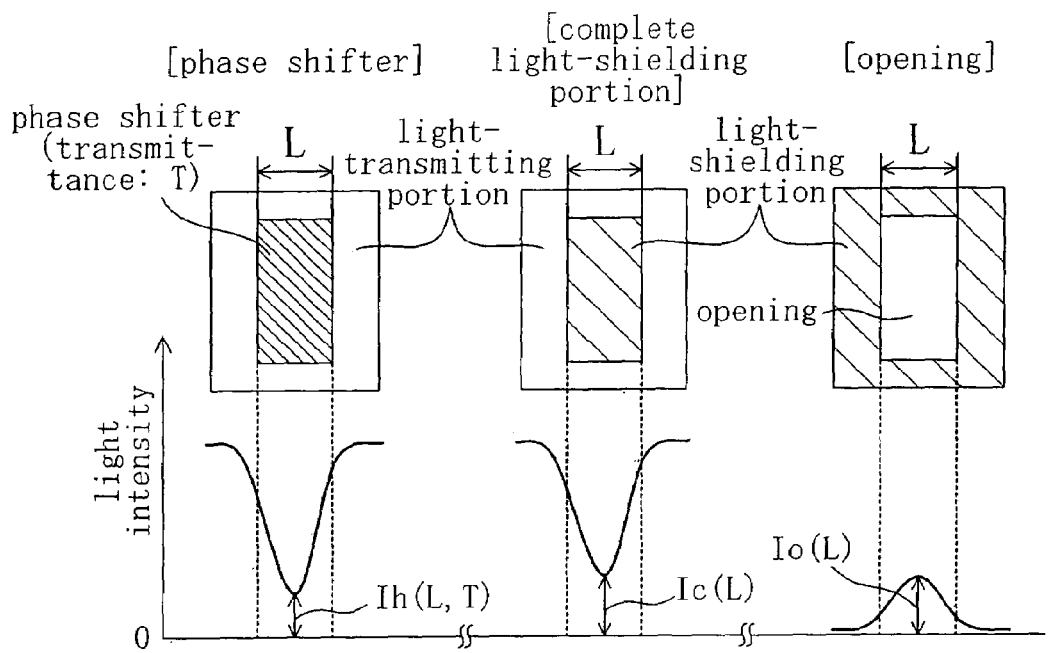
FIGS. 4A and 4B are diagrams illustrating the limit of the size of a phase shifter in the outline enhancement method of the present invention.

As shown in FIG. 4A, in exposure with a photomask (phase shifter mask) in which a phase shifter having a transmittance T and a line width L is provided on a transparent substrate is used, the light intensity generated in a position corresponding to the center of the phase shifter in an exposed material is expressed as Ih (L, T). In exposure with a photomask (light-shielding mask) in which the phase shifter of the phase-shifting mask is replaced by a complete light-shielding portion is used, the light intensity generated in a position corresponding to the center of the complete light-shielding portion in an exposed material is expressed as Ic (L). In exposure with a photomask (light-transmitting mask) in which the phase shifter of the phase-shifting mask is replaced by an opening (light-transmitting portion) and the light-transmitting portion of the phase-shifting mask is replaced by a complete light-shielding portion is used, the light intensity generated in a position corresponding to the center of the opening in an exposed material is expressed as Io (L).

Figure 4B:
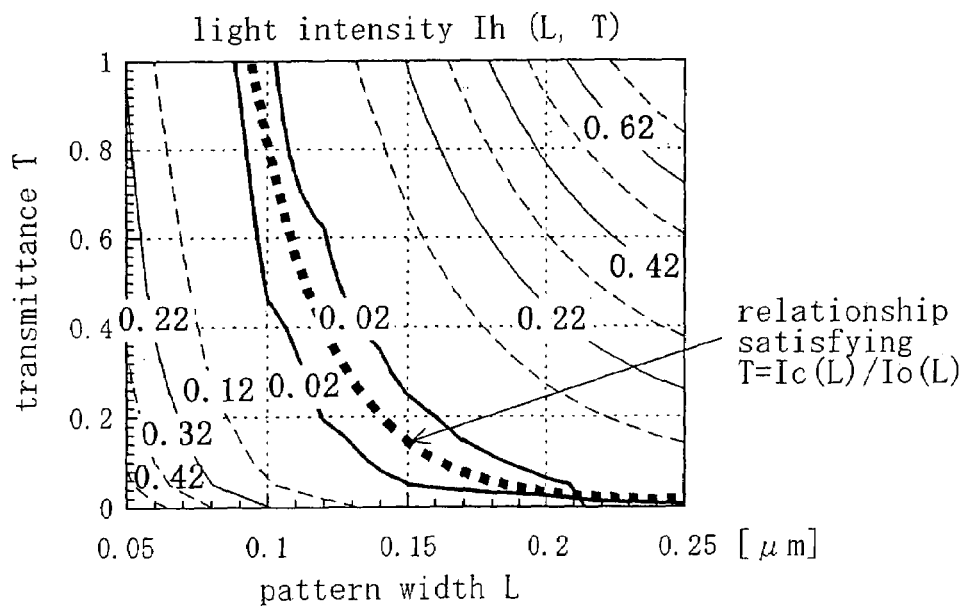

FIG. 4B is a graph showing the simulation results of the light intensity Ih (L, T) when the transmittance T and the line width L of the phase shifter are varied in exposure with the phase-shifting mask shown in FIG. 4A, represented by contour lines of the light intensity with the transmittance T and the line width L in the vertical axis and the horizontal axis, respectively. In this graph, a graph indicating the relationship of T=Ic (L)/Io (L) is superimposed. The simulation conditions are such that the wavelength of the exposure light $\lambda$=0.193 μm (ArF light source), the numerical aperture NA of the projection optical system of the exposure apparatus =0.6, and the coherence degree σ of the exposure light source =0.8 (regular light source).

As shown in FIG. 4B, the condition under which the light intensity Ih (L, T) becomes smallest can be expressed by a relationship T=Ic (L)/Io (L). This physically represents a relationship in which T×Io (L) indicating the light intensity of the light transmitted through the phase shifter is in equilibrium with Ic (L) indicating the light intensity of the light transmitted outside the phase shifter. Therefore, the width L of the phase shifter that provides an amplitude intensity of an opposite phase in the amplitude intensity distribution because of excessive light transmitted through the phase shifter is a width L that allows T×Io(L) to be larger than Ic (L).

It is empirically obtained from various simulation results that the width L that allows the light transmitted through the phase shifter having a transmittance of 1 to be in equilibrium with the light transmitted outside the phase shifter is about 0.3×$\lambda$ (light source wavelength)/NA (numerical aperture) (about 100 nm in the case of FIG. 4B), although this may depend on the type of the light source. Furthermore, as seen from FIG. 4B, in order to prevent too much light from being transmitted through the phase shifter having a transmittance of 6% (0.06) or more, the width L should be not more than twice the width of the phase shifter having a transmittance of 100% (1.0). That is to say, in order to prevent too much light from being transmitted through the phase shifter having a transmittance of 6% or more, the upper limit of the width L of the phase shifter should be not more than 0.6×$\lambda$/NA.

If the above-described findings are applied to the outline enhancement mask, the upper limit of the width L of the phase shifter in the outline enhancement mask can be considered to be a half of the upper limit in the above findings because the light transmitted outside the phase shifter in the outline enhancement mask to be taken into consideration is significantly only light on one side rather than both sides of the phase shifter. Therefore, the upper limit of the width L of the phase shifter in the outline enhancement mask is not more than 0.3×$\lambda$/NA when the transmittance of the phase shifter is 6% or more. However, this is not a sufficient condition, and the upper limit of the width L of the phase should be smaller than 0.3×$\lambda$/NA, depending on how high the transmittance of the phase shifter is. That is to say, when the transmittance of the phase shifter is as high as 100% or 50% or more, the width L of the phase shifter should be $0.2 \times \lambda/NA$ or less, preferably $0.15 \times \lambda/NA$ or less. When forming fine hole patterns, in order to obtain the effect of enhancing the profile of the light intensity distribution by interference between the light transmitted though the phase shifter and the light transmitted through the light-transmitting portion corresponding to a hole pattern, it is preferable to arrange the phase shifter in a region with a distance from the center of the light-transmitting portion, that is, the hole of $0.5 \times \lambda/NA$ or less. Therefore, when the width L of the phase shifter is $0.3 \times \lambda/NA$ or less, it is preferable in forming hole patterns that the phase shifter surrounding the light-transmitting portion is present in a region with a distance from the center of the light-transmitting portion corresponding to the hole pattern of $0.5 \times \lambda/NA$ or more and $0.8 \times \lambda/NA$ or less.

In this specification, unless otherwise specified, various mask sizes such as the width of a phase shifter are shown by the sizes on an exposed material. The actual mask size can be obtained easily by multiplying the sizes on an exposed material by the reduction ratio M of a reduction projection optical system of an exposure apparatus.

Next, the image enhancement that can be realized with oblique incident exposure in the outline enhancement method will be described in detail, based on a change in the contrast of the light intensity distribution when exposure is performed from various light source positions with respect to the outline enhancement mask.

Figure 5C:
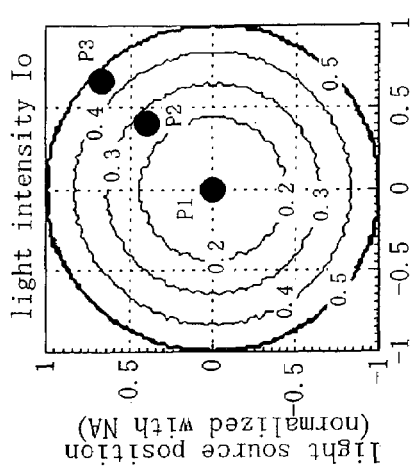
FIGS. 5A to 5F are diagrams illustrating the light intensity distribution produced by exposure light incident from various light source positions in forming isolated patterns with an outline enhancement mask of the present invention.
Figure 5B:
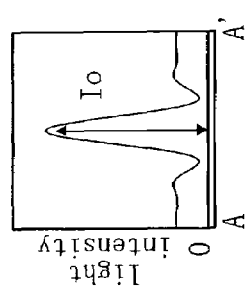
Figure 5A:
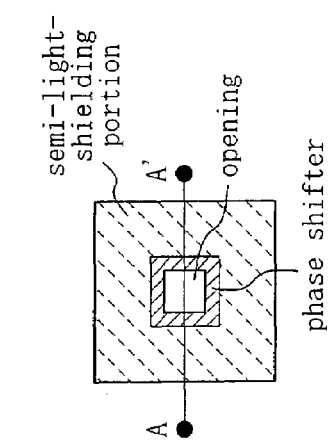

FIG. 5A is a plan view of the outline enhancement mask. In this case, the transmittance of the semi-light-shielding portion is 7.5%, and the transmittance of the phase shifter and the opening is 100%. The size of the opening is 200 nm square, and the width of the phase shifter is 50 nm.

FIG. 5C shows the results obtained by calculating the light intensity distribution corresponding to line AA' of FIG. 5A when exposure is performed from a point light source in various positions normalized with the numerical aperture NA with respect to the outline enhancement mask shown in FIG. 5A with optical simulations, reading the light intensity Io in a position corresponding to the center of the opening in the calculation results (e.g., the light intensity distribution shown in FIG. 5B) and plotting the light intensity Io against each light source position. The results shown in this plot are from the optical calculations that are performed assuming that the light source wavelength $\lambda$ is 193 nm (ArF light source) and the numerical aperture NA is 0.6. In the following description, unless otherwise specified, in the optical simulations, a calculation is performed under the conditions that the light source wavelength $\lambda$ is 193 nm (ArF light source) and the numerical aperture NA is 0.6.

Figure 5F:
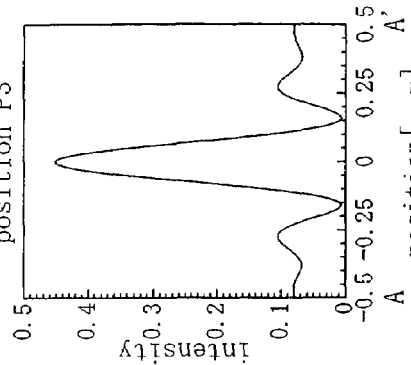
Figure 5E:
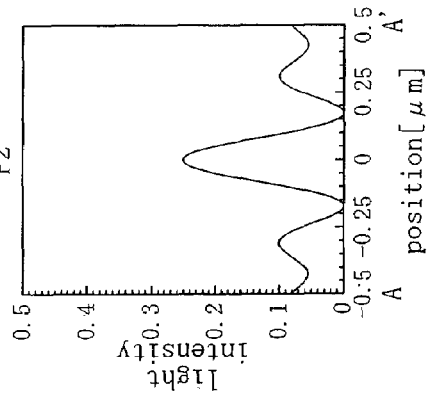
Figure 5D:
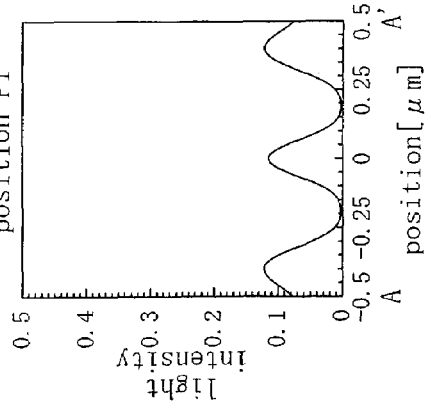

As shown in FIG. 5C, the light intensity Io in the center of the opening is larger, as exposure is performed with a point light source in a light position on the outer side (a light source position more apart from the origin in FIG. 5C). That is to say, the plot shows that as exposure is performed with a light source having a larger oblique incident component, the contrast is larger. This will be described more specifically with reference to the drawings. FIGS. 5D, 5E, and 5F are graphs obtained by plotting the light intensity distribution corresponding to line AA' of FIG. 5A in sample points P1, P2 and P3 of the point light sources shown in FIG. 5C, respectively. As shown in FIGS. 5D, 5E, and 5F, as the position of the point light source is on the outer side, in other words, as the light source is in the position that provides larger oblique incident light, an image of a higher contrast is formed.

Next, for comparison, a change in the contrast of the light intensity distribution when exposure is performed from various light source positions with respect to the half-tone phase-shifting mask will be described. FIG. 6A is a plan view of the half-tone phase-shifting mask. In this case, the transmittance of the phase shifter is 6%, and the transmittance of the opening is 100%. The size of the opening (size on an exposed wafer) is 180 nm square.

Figure 6C:
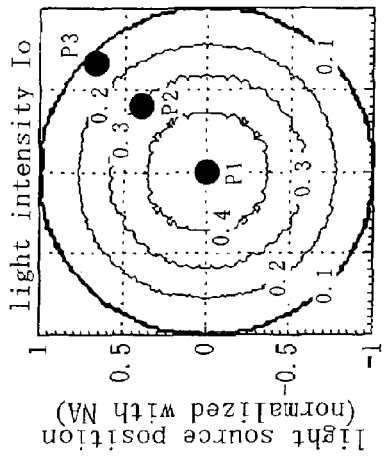
FIGS. 6A to 6F are diagrams illustrating the light intensity distribution produced by exposure light incident from various light source positions in forming isolated patterns with a conventional half-tone phase-shifting mask.
Figure 6F:
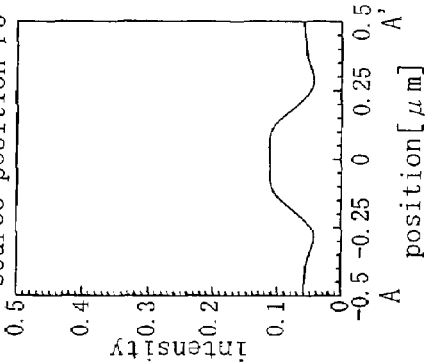
Figure 6B:
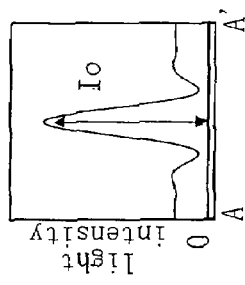
Figure 6E:
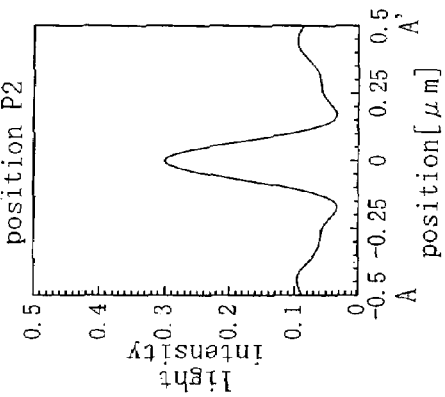
Figure 6A:
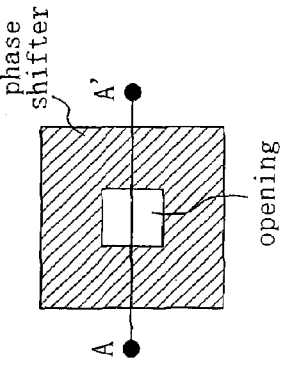

FIG. 6C shows the results obtained by calculating the light intensity distribution corresponding to line AA' of FIG. 6A when exposure is performed from a point light source in various positions normalized with the numerical aperture NA with respect to the half-tone phase-shifting mask shown in FIG. 6A with optical simulations, reading the light intensity Io in a position corresponding to the center of the opening in the calculation results (e.g., the light intensity distribution shown in FIG. 6B) and plotting the light intensity Io against each light source position.

Figure 6D:
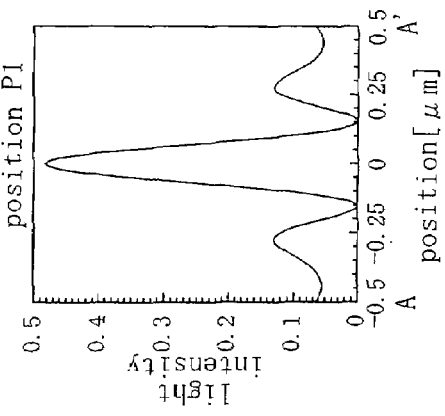

As shown in FIG. 6C, the light intensity Io in the center of the opening is larger, as exposure is performed with a point light source in a light position on the inner side (a light source position closer to the origin in FIG. 6C). That is to say, the plot shows that as exposure is performed with a light source having a larger vertical incident component, the contrast is larger. This will be described more specifically with reference to the drawings. FIGS. 6D, 6E, and 6F are graphs obtained by plotting the light intensity distribution corresponding to line AA' of FIG. 6A in sample points P1, P2 and P3 of the point light sources shown in FIG. 6C, respectively. As shown in FIGS. 6D, 6E, and 6F, as the position of the point light source is on the inner side, in other words, as the light source is in the position that provides larger vertical incident light, an image of a higher contrast is formed.

As seen from the comparison between the results shown in FIGS. 5A to 5F and the results shown in FIGS. 6A to 6F, the outline enhancement method makes it possible to enhance the contrast of the light intensity distribution obtained by oblique incident exposure in forming small isolated space patterns such as contact patterns, which cannot be realized by the conventional methods.

Figure 7A:
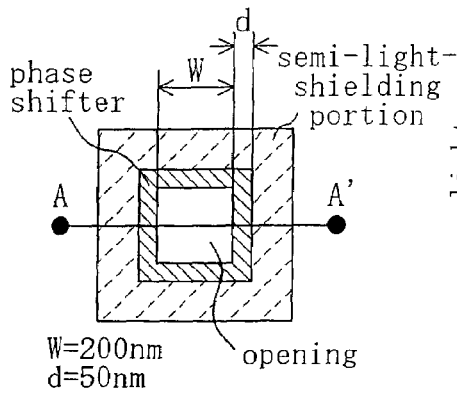
FIGS. 7A to 7F are diagrams illustrating the dependence of the contrast and the DOF on the transmittance of a semi-light shielding portion in the outline enhancement mask of the present invention.
Figure 7B:
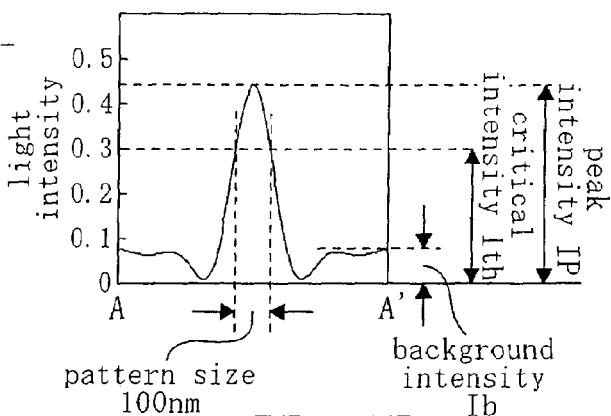

The fact that the contrast is improved by the outline enhancement mask has been described so far. Next, the dependence of the contrast and the DOF on the transmittance of the semi-light-shielding portion in the outline enhancement mask will be described below. The following description is based on the results obtained by simulations of various margins in pattern formation, using the outline enhancement mask shown in FIG. 7A. FIG. 7B shows the light intensity distribution formed when exposure is performed with respect to the outline enhancement mask shown in FIG. 7A. In FIG. 7B, values regarding various margins defined when forming a hole pattern with a width of 100 nm using the outline enhancement mask shown in FIG. 7A are also shown. More specifically, the critical intensity Ith is the light intensity that allows a resist film to be exposed, and the margin is defined with respect to this value. For example, if Ip is the peak value of the light intensity distribution, Ip/Ith is proportional to the sensitivity with which a resist mask is exposed, and the higher value is more preferable. If Ib is the background intensity of light transmitted through the semi-light-shielding portion, a higher Ith/Ib means that a reduction in thickness of the resist film hardly occurs at pattern formation, and the higher value is more preferable. In general, it is preferable that a value of Ith/Ib is at least 2. With the foregoing in mind, each margin will be described.

Figure 7C:
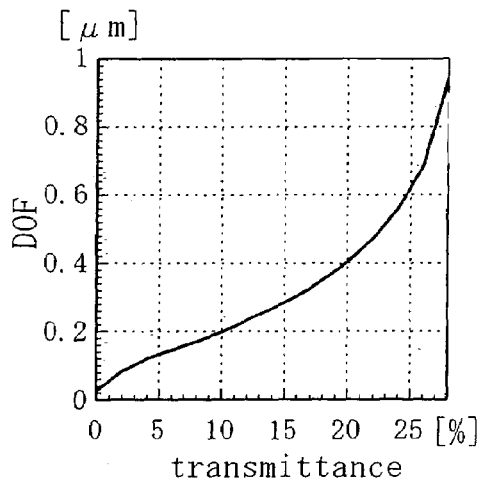
Figure 7D:
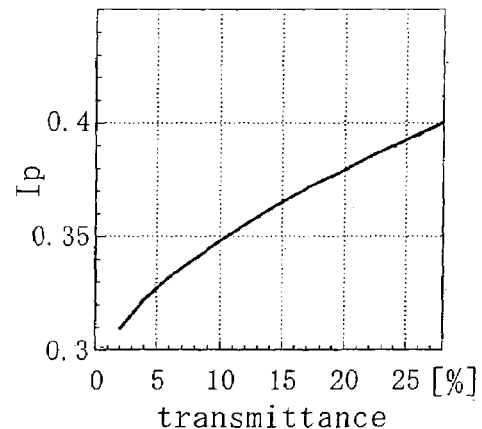

FIG. 7C shows the calculation results regarding the dependence of the DOF on the transmittance of a semi-light-shielding portion in pattern formation using the outline enhancement mask shown in FIG. 7A. Here, the DOF is defined as the width of the focus position in which a change in the size of a finished pattern is within 10%. As shown in FIG. 7C, the higher transmittance the semi-light-shielding portion has, the more preferable it is for improvement of the DOF. FIG. 7D shows the calculation results regarding the peak value Ip with respect to the transmittance of the semi-light shielding portion in pattern formation using the outline enhancement mask shown in FIG. 7A. As shown in FIG. 7D, the higher transmittance the semi-light-shielding portion has, the more preferable it is for improvement of the peak value Ip, that is, the contrast as well. From the above-described results, in the outline enhancement mask, the higher transmittance the semi-light-shielding portion has, the more preferable it is. More specifically, as shown in FIGS. 7C and 7D, the improvement rate of the exposure margin is increased with an increase of the transmittance from 0% to about 6% and it can be appreciated that it is preferable to use a semi-light-shielding portion having a transmittance of about 6% or more.

Figure 7E:
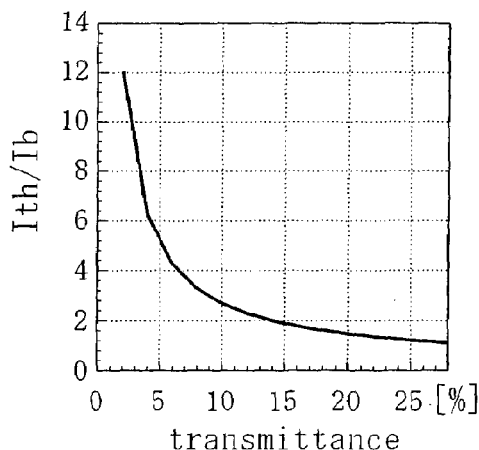
Figure 7F:
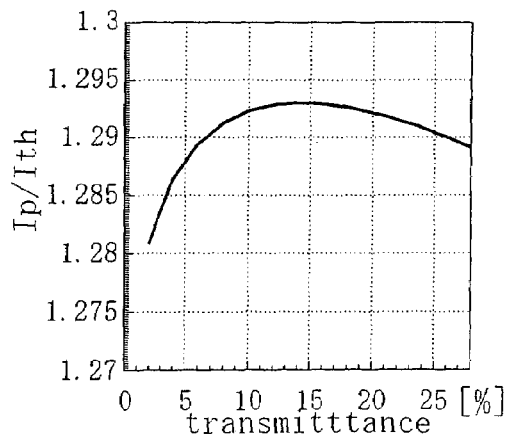

FIG. 7E shows the calculation results regarding the Ith/Ib with respect to the transmittance of the semi-light shielding portion in pattern formation using the outline enhancement mask shown in FIG. 7A. As shown in FIG. 7E, the higher transmittance the semi-light-shielding portion has, the lower the value of Ith/Ib is. It is not preferable for improvement of Ith/Ib that the transmittance is too high. More specifically, Ith/Ib is less than 2 when the transmittance of the semi-light-shielding portion is about 15%. FIG. 7F shows the calculation results regarding the Ip/Ith with respect to the transmittance of the semi-light shielding portion in pattern formation using the outline enhancement mask shown in FIG. 7A. As shown in FIG. 7F, the Ip/Ith has a peak at a transmittance of about 15% of the semi-light-shielding portion.

As described above, in the outline enhancement mask, the DOF and the contrast are improved more, as the transmittance of the semi-light-shielding portion is higher, and this effect is more significant when the transmittance of the semi-light-shielding portion exceeds 6%. On the other hand, to prevent a reduction in thickness of the resist film during pattern formation or to optimize the resist sensitivity, it is preferable that the maximum of the transmittance of the semi-light-shielding portion is about 15%. Therefore, the optimal value of the transmittance of the semi-light-shielding portion in the outline enhancement mask is 6% or more and 15% or less. That is to say, the semi-light-shielding portion transmits exposure light partially to an extent that the resist is not exposed. In other words, the semi-light-shielding portion transmits a part of the total amount of exposure light. Such a semi-light-shielding portion can be formed of oxides such as ZrSiO, CrAlO, TaSiO, MoSiO or TiSiO.

FIGS. 8A to 8F are plan views showing variations of a light shielding mask patterns constituted by a semi-light shielding portion and a phase shifter in the outline enhancement mask provided with an opening corresponding to a contact pattern.

Figure 8A:
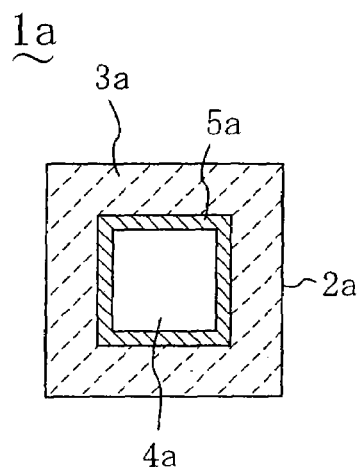
FIGS. 8A to 8F are diagrams illustrating variations of the layout of a light shielding mask patterns constituted by a semi-light shielding portion and a phase shifter in the outline enhancement mask provided with an opening corresponding to a contact pattern.

An outline enhancement mask 1a shown in FIG. 8A has the same structure of that of the outline enhancement mask shown in FIG. 1E. That is, the outline enhancement mask 1a is a photomask using a transparent substrate 2a and includes a semi-light-shielding portion 3a having a transmittance that allows a part of exposure light to be transmitted, an opening 4a surrounded by the semi-light-shielding portion 3a and corresponding to an isolated contact pattern, and a ring-shaped phase shifter 5a positioned around the opening 4a.

Figure 8B:
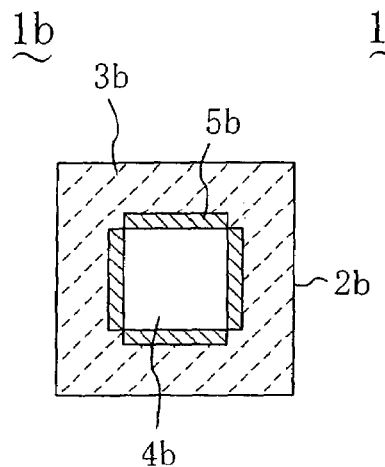

The outline enhancement mask 1b shown in FIG. 8B is a photomask using a transparent substrate 2b and includes a semi-light-shielding portion 3b having a transmittance that allows a part of exposure light to be transmitted, an opening 4b surrounded by the semi-light-shielding portion 3b and corresponding to an isolated contact pattern, and a phase shifter 5b constituted by four rectangular phase shifter portions that have a side having the same length of each side of the opening 4b and are in contact with the respective sides of the opening 4b. This outline enhancement mask 1b has substantially the same characteristics as those of the outline enhancement mask 1a in isolated pattern formation.

Figure 8C:
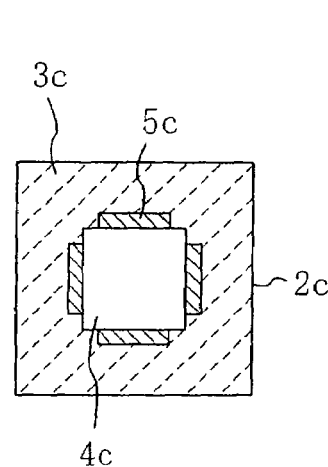

The outline enhancement mask 1c shown in FIG. 8C is a photomask using a transparent substrate 2c and includes a semi-light-shielding portion 3c having a transmittance that allows a part of exposure light to be transmitted, an opening 4c surrounded by the semi-light-shielding portion 3c and corresponding to an isolated contact pattern, and a phase shifter 5c constituted by four rectangular phase shifter portions that have a side having a length smaller than each side of the opening 4c and are in contact with the respective sides of the opening 4c. The center of each phase shifter portion of the phase shifter 5c is aligned with the center of the respective side of the opening 4c. In this outline enhancement mask 1c, the size of the resist pattern to be formed after exposure can be adjusted by changing the length of each phase shifter portion of the phase shifter 5c with the width (size) of the opening 4c unchanged. For example, as the length of each phase shifter portion of the phase shifter 5c is smaller, the size of the resist pattern becomes larger. In this case, the lower limit within which the length of each phase shifter portion of the phase shifter 5c can be changed without losing the function of outline enhancement is limited to about a half of the wavelength of the light source (exposure light). On the other hand, since the pattern size is changed only to an extent of about a half of the change amount of the mask size, adjusting the length of the phase shifter portion is an excellent approach to adjust the pattern size.

Figure 8D:
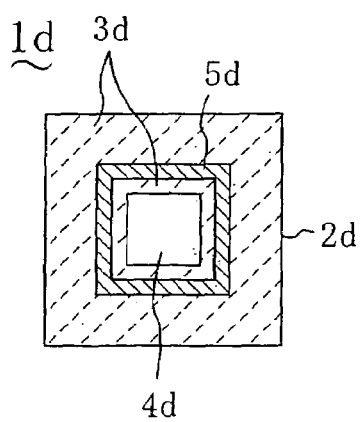

The outline enhancement mask 1d shown in FIG. 8D is a photomask using a transparent substrate 2d and includes a semi-light-shielding portion 3d having a transmittance that allows a part of exposure light to be transmitted, an opening 4d surrounded by the semi-light-shielding portion 3d and corresponding to an isolated contact pattern, and a ring-shaped phase shifter 5d positioned apart from the boundary of the semi-light-shielding portion 3d and the opening 4d by a predetermined distance on the side of the semi-light-shielding portion 3d. That is to say, a ring-shaped semi-light-shielding portion 3d is present between the phase shifter 5d and the opening 4d.

Figure 8E:
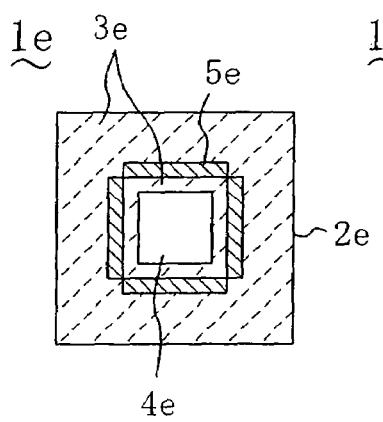

The outline enhancement mask 1e shown in FIG. 8E is a photomask using a transparent substrate 2e and includes a semi-light-shielding portion 3e having a transmittance that allows a part of exposure light to be transmitted, an opening 4e surrounded by the semi-light-shielding portion 3e and corresponding to an isolated contact pattern, and a phase shifter 5e positioned apart from the boundary of the semi-light-shielding portion 3e and the opening 4e by a predetermined distance on the side of the semi-light-shielding portion 3e. The phase shifter 5e is constituted by four phase shifter portions, each of which is a rectangular shape having a length larger than each side of the opening 4e and whose corner is in contact with the corners of the adjacent portions on the diagonal line of the opening 4e. In this case, a ring-shaped semi-light-shielding portion 3e is present between the phase shifter 5e and the opening 4e. In this outline enhancement mask 1e, the size of the resist pattern to be formed after exposure can be adjusted by changing only the width (size) of the opening 4e with the size and the arrangement of the phase shifter 5e with unchanged. For example, as the width of the opening 4e is increased, the size of the resist pattern is increased. According to this approach of adjusting the pattern size by changing only the width of the opening, MEEF (Mask Error Enhancement Factor: the ratio of the change amount of the pattern size with respect to the change amount of the mask size) is reduced to about a half of that obtained by an approach of scaling both the opening and the phase shifter at the same time to adjust the pattern size.

Figure 8F:
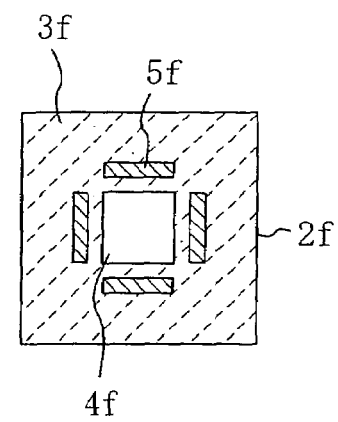

The outline enhancement mask 1f shown in FIG. 8F is a photomask using a transparent substrate 2f and includes a semi-light-shielding portion 3f having a transmittance that allows a part of exposure light to be transmitted, an opening 4f surrounded by the semi-light-shielding portion 3f and corresponding to an isolated contact pattern, and a phase shifter 5f positioned apart from the boundary of the semi-light-shielding portion 3f and the opening 4f by a predetermined distance on the side of the semi-light-shielding portion 3f. The phase shifter 5f is constituted by four phase shifter portions, each of which is a rectangular shape having the same length as that of each side of the opening 4f and whose side is opposed to the corresponding side of the opening 4f. In this case, the length of each phase shifter portion of the phase shifter 5f may be larger or smaller than that of the side of the opening 4f. According to this outline enhancement mask 1f, the size of the resist pattern can be adjusted as in the case of the outline enhancement mask 1c shown in FIG. 8C.

In the outline enhancement masks shown in FIGS. 8D to 8F, in order to increase the effect of reducing the MEEF, it is preferable that the width of the semi-light-shielding portion between the opening and the phase shifter is about ⅕ of λ/NA (λ is the wavelength of the exposure light and NA is the numerical aperture). In order to obtain the effect of improving the DOF, it is preferable that the width of the semi-light-shielding portion is a size that allows an interference effect of light by the phase shifter to be provided, that is, about 1/10 of λ/NA or less. In the outline enhancement masks shown in FIGS. 8A to 8F, a square is used as the shape of the opening. However, a polygon such as an octagon or a circle, or other shapes can be used. The shape of the phase shifter is not limited to a continuous ring shape or a plurality of rectangles. For example, the phase shifter can be formed by aligning a plurality of square phase shifter portions.

All the above description has been based on the positive resist process in which the portion corresponding to a resist-removed portion in the outline enhancement mask is defined as the opening. However, if a phase shifter having a sufficiently high transmittance can be used, in the outline enhancement mask used for the above description, the portion defined as the opening can be replaced by a phase shifter having a high transmittance, the portion defined as the phase shifter can be replaced by an opening, and the portion defined as the semi-light-shielding portion can be replaced by a phase shifter having a low transmittance (e.g., a phase shifter of a half-tone phase-shifting mask). In this case, the relationship of the relative phase difference between the elements is the same as in the above-described case, so that an outline enhancement mask having the same effect can be realized. FIGS. 9A to 9F are plan views showing variations of a light shielding mask patterns constituted by a low transmittance phase shifter and an opening in the outline enhancement mask provided with a high transmittance phase shifter corresponding to a contact pattern. The masks shown in FIGS. 9A to 9F have the structures in which the opening, the phase shifter and the semi-light-shielding portion in the FIGS. 8A to 8F are replaced by a high transmittance phase shifter, an opening and a low transmittance phase shifter, respectively. In this case, it is preferable that the high transmittance phase shifter has a transmittance of at least 60%. That is to say, in the mask structure in which the high transmittance phase shifter is surrounded by the low transmittance phase shifter, in order to have the low transmittance phase shifter correspond to a non-exposed portion of the resist film and the high transmittance phase shifter correspond to an exposed portion of the resist film, the transmittance of the high transmittance phase shifter should be about a value at least three times, preferably ten times the transmittance of the low transmittance phase shifter. Therefore, it is preferable that the transmittance of the low transmittance phase shifter is 6 to 15%, whereas the transmittance of the high transmittance phase shifter is 60% or more. In the following embodiments, the outline enhancement masks shown in FIGS. 9A to 9F will be discussed.

FIRST EMBODIMENT

Hereinafter, a photomask according to a first embodiment of the present invention, a method for producing the photomask and a method for forming a pattern using the photomask will be described with reference to the accompanying drawings. The photomask of the first embodiment is a photomask of a reduction projection exposure system to realize the above-described outline enhancement method.

FIG. 10A shows an example of a desired pattern to be formed with the photomask of the first embodiment.

When the reduction ratio of a reduction projection optical system of an exposure apparatus is M, in a regular photomask, a pattern having a size M times the size of a desired pattern (in general, having a designed value on a wafer) is drawn on a substrate (transparent substrate) formed of a material having a high transmittance with respect to exposure light, using a material, such as chromium film serving as a complete light-shielding portion with respect to the exposure light. However, in this specification, for simplification, the present invention is described, using the size on a wafer rather than using the size on the mask, which is a size M times the size on a wafer, unless otherwise specified. In this embodiment, when describing pattern formation, the description is based on the positive resist process, unless otherwise specified. That is to say, the description is based on the assumption that an exposed portion of the resist film is removed. On the other hand, when a negative resist process is assumed to be used, the description is totally the same as in the case of the positive resist process, except that the exposed portion of the resist film becomes a resist pattern. In this embodiment, the transmittance is expressed by an effective transmittance when the transmittance of the transparent substrate is taken as 100%, unless otherwise specified.

FIG. 10B is a plan view of the photomask of the first embodiment, more specifically, a photomask for forming the desired pattern shown in FIG. 10A. As shown in FIG. 10B, high transmittance phase shifters (light-transmitting portions) are provided so as to correspond to resist-removed portions in the desired pattern. Furthermore, a low transmittance phase shifter (semi-light-shielding portion) having a low transmittance (6 to 15%) that does not allow the resist film to be exposed is used as the light-shielding mask pattern surrounding the high transmittance phase shifter, instead of the complete light-shielding portion that completely shields exposure light. Openings (peripheral portion) having a small width that is not provided with the low transmittance phase shifter are provided in the vicinity of the high transmittance phase shifters. The high transmittance phase shifters and the low transmittance phase shifter transmit exposure light in the same phase, whereas the openings transmits exposure light in an phase opposite to those of the high transmittance phase shifters and the low transmittance phase shifter.

In the first embodiment, for example, as shown in FIG. 9B, the openings are arranged in such a manner that the sides of the openings are in contact with the corresponding sides of the rectangular high transmittance phase shifter in a region having a predetermine size or less from each side of the rectangular high transmittance phase shifter.

FIG. 10C is a cross-sectional view taken along line AA' in FIG. 10B, that is a cross-sectional view of the photomask of the first embodiment. As shown in FIG. 10C, the photomask shown in FIG. 10B is realized in the following manner. A phase shift film 11 having a low transmittance (about 6 to 15%) that does not allow the resist film to be exposed and having a phase difference of 180 degrees (more specifically (150+360×n) degrees or more and (210+360×n) degrees or less (where n is an integer)) with respect to exposure light between this film and the transparent substrate 10 (opening) is formed on the portion of the transparent substrate 10 in the low transmittance phase shifter (semi-light-shielding portion) formation region. Thus, the low transmittance phase shifter is formed. The portion of the transparent substrate 10 in a light-transmitting portion formation region is dug down by a thickness that causes a phase difference of 180 degrees (more specifically (150+360×n) degrees or more and (210+360×n) degrees or less (where n is an integer)) with respect to exposure light between this region and the transparent substrate 10 (opening). Thus, the dug portion 10a of the transparent substrate 10 makes it possible to form the light-transmitting portion serving as the high transmittance phase shifter. Therefore, an outline enhancement mask having the following structure can be realized. The high transmittance phase shifter (light-transmitting portion) and the low transmittance phase shifter (semi-light-shielding portion) made of the phase shift film 11 sandwich the peripheral portion not provided with the phase shift film 11 (the surface of the transparent substrate 10 is exposed), that is, the openings. As the phase shift film 11, a metal-containing oxide film such as ZrSiO, CrAlO, TaSiO, MoSiO or TiSiO can be used. However, in order to obtain contrast enhancement by the outline enhancement method, it is necessary to limit the width of the openings to a predetermined size or less.

In the above description, as shown in FIG. 11A, it is assumed that the phase shift film 11 serving as the low transmittance phase shifter is a single layered film. In this case, the optical constant of the phase shift film 11 is determined by the material, so that the thickness of the phase shift film 11 is determined by the amount of the phase shift. On the other hand, the transmittance depends on not only the optical constant, but also the film thickness, so that for the material of the phase shift film 11, a material having an appropriate optical constant, more specifically, a material that can achieve exactly the predetermined transmittance with the thickness that can transmit exposure light in a phase opposite to that of the transparent substrate 10 (opening) is not necessarily present. Therefore, in the photomask according to the first embodiment, as shown in FIG. 11B, it is preferable that the phase shift film 11 has a two layered structure in which a transmittance adjusting film 11A having a low transmittance and a phase adjusting film 11B having a high transmittance are laminated sequentially in order to achieve an arbitrary transmittance in the phase shift film 11. More specifically, the transmittance of the transmittance adjusting film 11A with respect to exposure light is lower than that of the transparent substrate 10. The phase adjusting film 11B transmits exposure light in a phase opposite to that of the transparent substrate 10 (opening). As the transmittance adjusting film 11A, a thin film (having a thickness of 30 nm or less) made of a metal such as Zr, Cr, Ta, Mo or Ti or a thin film (having a thickness of 30 nm or less) made of a metal alloy such as a Ta—Cr alloy, a Zr—Si alloy, a Mo—Si alloy or a Ti—Si alloy can be used. As the phase adjusting film 11B, an oxide film such as $SiO_2$ film can be used.

In this specification, a transmittance adjusting film refers to a film that has relatively a low transmittance per unit thickness with respect to exposure light and can set the transmittance with respect to exposure light to a desired value by adjusting the thickness without affecting the phase change with respect to the exposure light. A phase adjusting film refers to a film that has relatively a high transmittance per unit thickness with respect to exposure light and can set the phase difference with respect to exposure light between this film and the transparent substrate (opening) to a desired value by adjusting the thickness without affecting the transmittance change with respect to the exposure light.

Next, a method for forming a pattern using the photomask of the first embodiment will be described. As described with reference to the principle of the outline enhancement method, when transferring a mask pattern in a reduced size with an exposure apparatus, it is preferable to use an oblique incident exposure light source in order to form an image having a high contrast with the outline enhancement mask. Herein, "oblique incident exposure" refers to light sources shown in FIGS. 12B to 12D in which vertical incident components are removed, as opposed to a regular exposure light source as shown in FIG. 12A. Representative oblique incident exposure light sources are an annular exposure light source shown in FIG. 12B and a quadrupole exposure light source shown in FIG. 12C. Although it depends slightly on a desired pattern, in general, quadrupole exposure light sources are more advantageous in enhancement of the contrast and enlargement of the DOF than annular exposure light sources. However, quadrupole exposure light sources have such side effects that a pattern shape is distorted from the mask shape, so that in such a case, it is preferable to use an annular-quadrupole mixed type exposure light source as shown in FIG. 12D. The annular-quadrupole mixed type exposure light source is characterized by having a feature of a quadrupole light source that the center of the light source and the light sources on the XY axis are removed when assuming the XY coordinate with the center of the light source (center of a regular exposure light source) as the origin, and having a feature of an annular light source that a circle is used as the contour of the light source.

FIGS. 13A to 13D are cross-sectional views showing the processes of a method forming patterns with the photomask of the first embodiment.

First, as shown in FIG. 13A, after a film 101 to be processed such as a metal film or an insulating film is formed on a substrate 100, as shown in FIG. 13B, a positive resist film 102 is formed on the film 101 to be processed.

Next, as shown in FIG. 13C, the photomask of the first embodiment including a low transmittance phase shifter made of the phase shift film 11 and a light-transmitting portion functioning as a high transmittance phase shifter by the dug portion 10a is irradiated with exposure light 103 with an oblique incident exposure light source to expose the resist film 102 with transmitted light 104 transmitted through the photomask. In this case, as the mask pattern, the low transmittance phase shifter (semi-light-shielding portion) is used, so that the entire resist film 102 is exposed with weak energy. However, as shown in FIG. 13C, only a latent image portion 102a of the resist film 102 corresponding to the light-transmitting portion (dug portion 10a) in the photomask is irradiated with the exposure energy that is sufficient to dissolve the resist film 102 in a developing process.

Next, the latent image portion 102a is removed by performing development with respect to the resist film 102, so that as shown in FIG. 13D, a resist pattern 105 is formed. In this case, in the exposure process shown in FIG. 13C, light around the light-transmitting portion is canceled, so that a portion corresponding to the opening (peripheral portion) in the resist film 102 is substantially not irradiated with exposure energy. Therefore, the contrast in the light intensity distribution between the light transmitted through the light-transmitting portion and the light transmitted through the peripheral portion, in other words, the contrast in the light intensity distribution between the light with which the latent image portion 102a is irradiated and the light with which the periphery of the latent portion 102a is irradiated can be enhanced. Therefore, the energy distribution in the latent portion 102a is changed sharply, so that a resist pattern 105 having a sharp shape can be formed.

Next, a method for producing a photomask of the first embodiment will be described with reference to the drawings.

FIGS. 14A to 14E are cross-sectional views showing the processes of a method producing the photomask of the first embodiment. FIG. 14F is a plan view corresponding to the cross-sectional view of FIG. 14C, and FIG. 14G is a plan view corresponding to the cross-sectional view of FIG. 14E.

First, as shown in FIG. 14A, a phase shift film 11 having a predetermined transmittance (e.g., 6 to 15%) with respect to exposure light is formed on a transparent substrate 10 made of a material having light-transmitting properties with respect to exposure light, such as quartz. As the phase shift film 11, a metal-containing oxide film such as ZrSiO, CrAlO, TaSiO, MoSiO or TiSiO can be used. Furthermore, the phase shift film 11 generates a phase difference of (150+360×n) degrees or more and (210+360×n) degrees or less (where n=an integer) with respect to exposure light between this film and the transparent substrate 10 (opening). In this embodiment, the phase shift film 11 may have a two layered structure of a transmittance adjusting film and a phase adjusting film, as described above.

Next, as shown in FIG. 14B, a first resist pattern 12 that covers the low transmittance phase shifter (semi-light-shielding portion) formation region is formed on the transparent substrate 10. That is, a first resist pattern 12 having a removed portion in each of the high transmittance phase shifter (light-transmitting portion) formation region and the opening (peripheral portion) formation region is formed on the transparent substrate 10. Thereafter, the phase shift film 11 is etched with the first resist pattern 12 as a mask to pattern the phase shift film 11. Then, the first resist pattern 12 is removed. Thus, as shown in FIGS. 14C and 14F, the portion corresponding to each of the high transmittance phase shifter formation region and the opening formation region in the phase shift film 11 is removed.

Figure 14D:
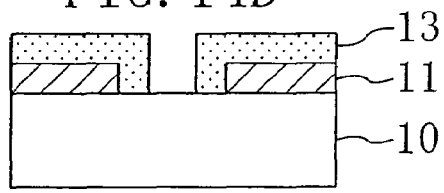
Figure 14E:
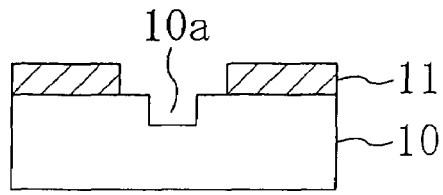
Figure 14F:
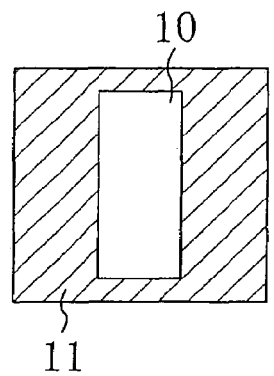
Figure 14G:
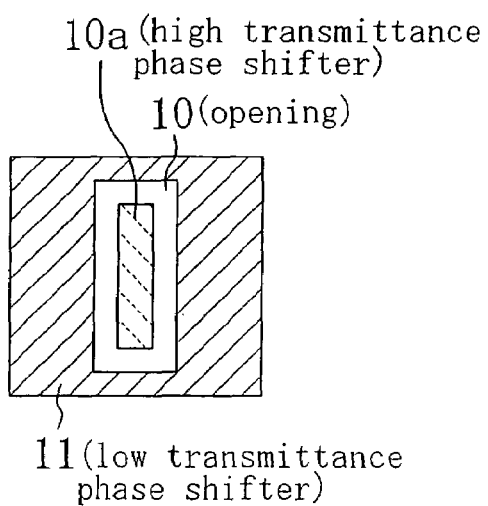

Next, as shown in FIG. 14D, a second resist pattern 13 that covers the low transmittance phase shifter formation region and the opening formation region is formed on the transparent substrate 10. That is, a second resist pattern 13 having a removed portion in the high transmittance phase shifter formation region is formed. Thereafter, the transparent substrate 10 is etched with the second resist pattern 13 as a mask. Then, the second resist pattern 13 is removed. Thus, as shown in FIGS. 14E and 14G, the dug portion 10a that generates a phase inversion of 180 degrees (more specifically, (150+360×n) degrees or more and (210+360×n) degrees or less (where n is an integer)) is formed in the portion corresponding to the high transmittance phase shifter formation region in the transparent substrate 10, and thus the photomask of the first embodiment is completed. That is to say, the photomask of the first embodiment having a plane structure of the outline enhancement mask can be easily formed by, as a mask blank, preparing a transparent substrate in which a phase shift film is deposited, that is, the same substrate as the conventional half-tone phase-shifting mask, and then performing etching with respect to the phase shift film and the transparent substrate sequentially.

As described above, according to the first embodiment, the phase shift film 11 that transmits exposure light at a low transmittance with a phase inversion is formed on the portion of the transparent substrate 10 in the low transmittance phase shifter (semi-light-shielding portion) formation region. Furthermore, the portion of the transparent substrate 10 in the light-transmitting portion formation region is dug down by the thickness that causes the exposure light to have a phase inversion so that a light-transmitting portion is formed. Therefore, the opening that is not provided with the phase shift film 11, that is, the peripheral portion that transmits exposure light in the phase opposite to that of the light-transmitting portion is sandwiched by the light-transmitting portion that serves as the high transmittance phase shifter by the dug portion 10a and the low transmittance phase shifter that transmits exposure light in the same phase as that of the light-transmitting portion and is made of the phase shift film 11. As a result, the contrast in the light intensity distribution between the light-transmitting portion and the peripheral portion can be enhanced by mutual interference between the light transmitted through the peripheral portion and the light transmitted through the light-transmitting portion. This contrast enhancement effect also can be obtained when a fine isolated resist-removed portion (i.e., a fine isolated space pattern) is formed with oblique incident exposure (off-axis illumination), for example, in the positive resist process. That is to say, a combination of the photomask of this embodiment and oblique incident exposure can miniaturize isolated space patterns and isolated line patterns or dense patterns at the same time.

According to the first embodiment, after the phase shift film 11 is formed on the transparent substrate 10, the phase shift film 11 and the transparent substrate 10 are etched selectively, and therefore a mask pattern with any shape can be easily realized that has the low transmittance phase shifter and the opening, and a light-transmitting portion with any shape can be easily realized that serves as the high transmittance phase shifter.

According to the first embodiment, an opening with any shape can be formed by processing the phase shift film 11 constituting the low transmittance phase shifter, so that as the pattern layout of the outline enhancement mask, not only the type shown in FIGS. 10B and 10C, that is, the type shown in FIG. 9B, but also all the types shown in FIGS. 9A to 9F, for example, can be realized.

In the first embodiment, it is preferable that the transmittance of the phase shift film 11, that is, the low transmittance phase shifter is 6% or more and 15% or less. Thus, the contrast enhancement effect can be obtained reliably while preventing a reduction in thickness of the resist film in pattern formation.

In the first embodiment, it is preferable that the phase shift film 11 has a two layered structure in which the transmittance adjusting film 11A having a low transmittance and the phase adjusting film 11B having a high transmittance are laminated sequentially. Thus, a combination of a desired phase change and a desired transmittance can be selected arbitrarily for the phase shift film 11. A combination of the material of the transmittance adjusting film 11A and the material of the phase adjusting film 11B makes it possible to improve the selection ratio at etching for processing the phase shift film 11.

In the first embodiment, the description is based on the use of the positive resist process, but the negative resist process can be used, instead of the positive resist process. In this case, in either one of the processes, as the exposure light source, the i line (wavelength 365 nm), KrF excimer laser light (wavelength 248 nm), ArF excimer laser light (wavelength 193 nm), or $F_2$ excimer laser light (wavelength 157 nm) can be used, for example.

First Variation of the First Embodiment

Hereinafter, a photomask of a first variation of the first embodiment and a method for producing the photomask will be described with reference to the accompanying drawings.

The first variation of the first embodiment is different from the first embodiment in the following aspects. In the first embodiment, the outline enhancement mask having a layout in which the high transmittance phase shifter and the opening are adjacent as shown, for example, in FIGS. 9A to 9C is described. In the first variation of the first embodiment, the outline enhancement mask having a layout in which the high transmittance phase shifter (light-transmitting portion) and the opening (peripheral portion) are apart as shown, for example, in FIGS. 9D to 9F is described.

FIGS. 15A to 15E are cross-sectional views showing the processes of a method producing a photomask of the first variation example of the first embodiment. FIG. 15F is a plan view corresponding to the cross-sectional view of FIG. 15C, and FIG. 15G is a plan view corresponding to the cross-sectional view of FIG. 15E.

First, as shown in FIG. 15A, a phase shift film 11 having a predetermined transmittance (e.g., 6 to 15%) with respect to exposure light is formed on a transparent substrate 10 made of a material having light-transmitting properties with respect to exposure light, such as quartz. The phase shift film 11 generates a phase difference of (150+360×n) degrees or more and (210+360×n) degrees or less (where n=an integer) with respect to exposure light between this film and the transparent substrate 10 (opening). In this example, the phase shift film 11 may have a two layered structure of a transmittance adjusting film and a phase adjusting film (see the first embodiment).

Next, as shown in FIG. 15B, a first resist pattern 12 that covers a low transmittance phase shifter (semi-light-shielding portion) formation region is formed on the transparent substrate 10. That is, a first resist pattern 12 having a removed portion in each of a high transmittance phase shifter (light-transmitting portion) formation region and an opening (peripheral portion) formation region is formed. In this example, the opening formation region and the high transmittance phase shifter formation region are apart. In other words, the first resist pattern 12 is interposed between the opening formation region and the high transmittance phase shifter formation region. Thereafter, the phase shift film 11 is etched with the first resist pattern 12 as a mask to pattern the phase shift film 11. Then, the first resist pattern 12 is removed. Thus, as shown in FIGS. 15C and 15F, the portion corresponding to each of the high transmittance phase shifter formation region and the opening formation region in the phase shift film 11 is removed.

Figure 15D:
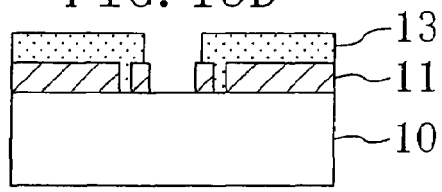
Figure 15E:
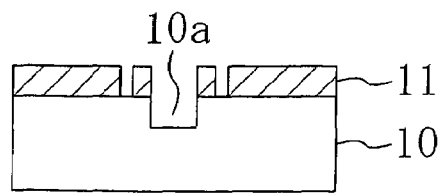
Figure 15F:
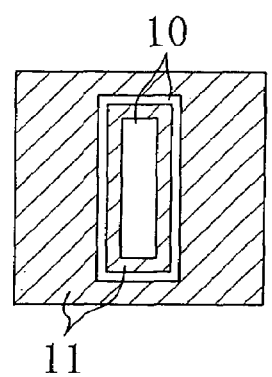
Figure 15G:
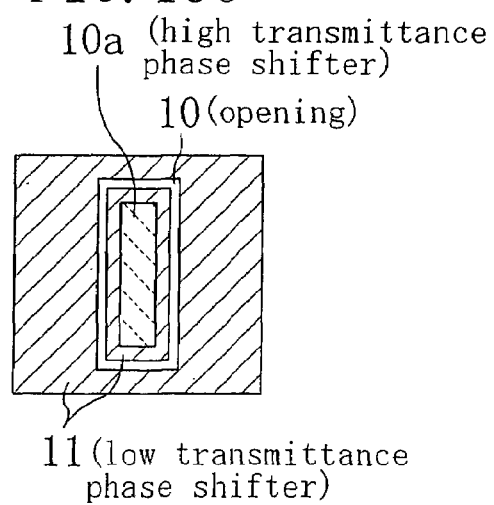

Next, as shown in FIG. 15D, a second resist pattern 13 that covers the low transmittance phase shifter formation region including the opening formation region and that has a removed portion in the high transmittance phase shifter formation region is formed on the transparent substrate 10. Thereafter, the transparent substrate 10 is etched with the second resist pattern 13 and the patterned phase shift film 11 as masks. Then, the second resist pattern 13 is removed. Thus, as shown in FIGS. 15E and 15G, a dug portion 10a that generates a phase inversion of 180 degrees (more specifically, (150+360×n) degrees or more and (210+360×n) degrees or less (where n is an integer)) is formed in the portion corresponding to the high transmittance phase shifter formation region in the transparent substrate 10, and thus the photomask of the first variation of the first embodiment is completed.

According to the first variation of the first embodiment, the following advantages can be obtained, in addition to those of the first embodiment. Since the patterned phase shift film 11 is used as a mask for etching the transparent substrate 10 in a self-alignment manner, photomask process can be performed precisely.

Second Variation of the First Embodiment

Hereinafter, a photomask of a second variation of the first embodiment and a method for producing the photomask will be described with reference to the accompanying drawings.

The second variation of the first embodiment is different from the first embodiment in the following aspects. In the first embodiment, the outline enhancement mask having a layout in which the high transmittance phase shifter (light-transmitting portion) and the opening (peripheral portion) are adjacent as shown, for example, in FIGS. 9A to 9C is described. In the second variation of the first embodiment as well as the first variation of the first embodiment, the outline enhancement mask having a layout in which the high transmittance phase shifter and the opening are apart as shown, for example, in FIGS. 9D to 9F is described.

FIGS. 16A to 16E are cross-sectional views showing the processes of a method producing a photomask of the second variation example of the first embodiment. FIG. 16F is a plan view corresponding to the cross-sectional view of FIG. 16C, and FIG. 16G is a plan view corresponding to the cross-sectional view of FIG. 16E.

First, as shown in FIG. 16A, a phase shift film 11 having a predetermined transmittance (e.g., 6 to 15%) with respect to exposure light is formed on a transparent substrate 10 made of a material having light-transmitting properties with respect to exposure light, such as quartz. The phase shift film 11 generates a phase difference of (150+360×n) degrees or more and (210+360×n) degrees or less (where n=an integer) with respect to exposure light between this film and the transparent substrate 10 (opening). In this example, the phase shift film 11 may have a two layered structure of a transmittance adjusting film and a phase adjusting film (see the first embodiment).

Next, as shown in FIG. 16B, a first resist pattern 12 that covers a low transmittance phase shifter (semi-light-shielding portion) formation region and a high transmittance phase shifter (light-transmitting portion) formation region is formed on the transparent substrate 10. That is, a first resist pattern 12 having a removed portion in an opening (peripheral portion) formation region is formed on the transparent substrate 10. Thereafter, the phase shift film 11 is etched with the first resist pattern 12 as a mask to pattern the phase shift film 11. Then, the first resist pattern 12 is removed. Thus, as shown in FIGS. 16C and 16F, the portion corresponding to the opening formation region in the phase shift film 11 is removed.

Figure 16D:
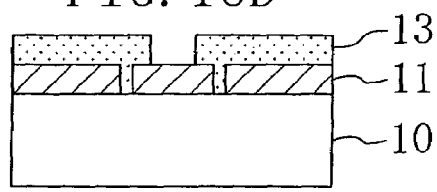
Figure 16E:
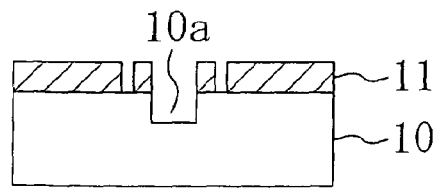
Figure 16F:
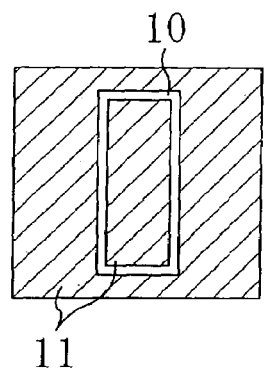
Figure 16G:
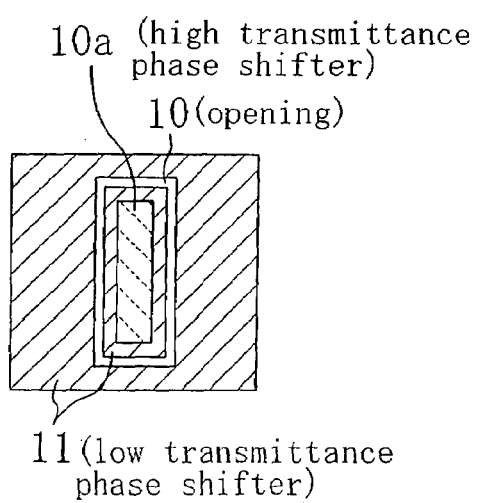

Next, as shown in FIG. 16D, a second resist pattern 13 that covers the low transmittance phase shifter formation region and the opening formation region is formed on the transparent substrate 10. That is to say, a second resist pattern 13 that has a removed portion in the high transmittance phase shifter formation region is formed on the transparent substrate 10. Thereafter, the phase shift film 11 and the transparent substrate 10 are etched sequentially with the second resist pattern 13 as a mask. Then, the second resist pattern 13 is removed. Thus, as shown in FIGS. 16E and 16G, the portion corresponding to the high transmittance phase shifter formation region in the phase shift film 11 is removed. Furthermore, a dug portion 10a that generates a phase inversion of 180 degrees (more specifically, (150+360×n) degrees or more and (210+360×n) degrees or less (where n is an integer)) is formed in the portion corresponding to the high transmittance phase shifter formation region in the transparent substrate 10, and thus the photomask of the second variation of the first embodiment is completed.

According to the second variation of the first embodiment, the following advantages can be obtained, in addition to those of the first embodiment. In this variation, the process of removing the portion corresponding to the opening formation region in the phase shift film 11 (see FIG. 16C) and the process of removing the portion corresponding to the high transmittance phase shifter formation region in the phase shift film 11 (see FIG. 16E) are performed separately. Therefore, if the opening is apart from the high transmittance phase shifter with a small distance, in other words, if the phase shift film 11 having a small width is left between the opening and the high transmittance phase shifter, the margin for photomask process becomes large.

In the second variation of the first embodiment, before performing the process of removing the portion corresponding to the opening formation region in the phase shift film 11, the process of removing the portion corresponding to the high transmittance phase shifter formation region in the phase shift film 11 (including the process of forming a dug portion 10a in the transparent substrate 10).may be performed.

Third Variation of the First Embodiment

Hereinafter, a photomask of a third variation of the first embodiment and a method for producing the photomask will be described with reference to the accompanying drawings.

The third variation of the first embodiment is different from the first embodiment in the following aspects. In the first embodiment, the outline enhancement mask having a layout in which the high transmittance phase shifter (light-transmitting portion) and the opening (peripheral portion) are adjacent as shown, for example, in FIGS. 9A to 9C is described. In the third variation of the first embodiment, the outline enhancement mask having a layout in which the high transmittance phase shifter and the opening are apart as shown, for example, in FIGS. 9D to 9F is described. Moreover, in the first embodiment, the phase shift film 11 that will serve as the low transmittance phase shifter (semi-light-shielding portion) is assumed to be a single layered film, as shown in FIG. 11A. However, in the third variation of the first embodiment, the phase shift film 11, for example, as shown in FIG. 11B is assumed to have a two layered structure in which a transmittance adjusting film 11A having a low transmittance and a phase adjusting film 11B having a high transmittance are laminated sequentially.

FIGS. 17A and 17B are a plan view and a cross-sectional view of the photomask of the third variation example of the first embodiment, respectively. As shown in FIGS. 17A and 17B, the light-transmitting portion serving as a high transmittance phase shifter due to the dug portion 10a of the transparent substrate 10 and the opening that is not provided with the phase shift film 11, that is, the peripheral portion are apart. The phase shift film 11 serving as a low transmittance phase shifter includes a transmittance adjusting film 11A having a low transmittance, which is a lower layer, and a phase adjusting film 11B having a high transmittance, which is an upper layer. In this example, the transmittance adjusting film 11A is formed of a single layered thin film that generates a phase difference of (−30+360×n) degrees or more and (30+360×n) degrees or less (where n=an integer) with respect to exposure light between this film and the transparent substrate 10 (opening). That is to say, the transmittance adjusting film 11A generates only a slight phase change in the transmitted light. As the transmittance adjusting film 11A, a thin film (having a thickness of 30 nm or less) made of a metal such as Zr, Cr, Ta, Mo or Ti or a thin film (having a thickness of 30 nm or less) made of a metal alloy such as a Ta—Cr alloy, a Zr—Si alloy, a Mo—Si alloy or a Ti—Si alloy can be used. As the phase adjusting film 11B, an oxide film such as $SiO_2$ film can be used.

In the first embodiment including this variation, the dug portion 10a makes it possible to form a high transmittance phase shifter having a sufficiently high transmittance (e.g., 90 to 100%). However, due to light scattering on the etched surface of the transparent substrate 10 or the like, the effective transmittance of the high transmittance phase shifter is slightly lower than that of the opening (i.e., transparent substrate 10). Consequently, the transmittance of the opening is the highest, so that requirements for miniaturization of the opening become strict.

The following advantages can be obtained by removing the phase adjusting film 11B from the portion formed between the opening and the high transmittance phase shifter (dug portion 10a) in the phase shift film 11, in other words, by having only the transmittance adjusting film 11A left between the peripheral portion and the light-transmitting portion, as shown in the plan view of FIG. 17C and the cross-sectional view of FIG. 17D.

First, when the thickness of the transmittance adjusting film 11A is sufficiently small, the light transmitted through the opening has substantially the same phase as that of the light transmitted through the removed portion of the phase adjusting film 11B (i.e., the portion in which only the transmittance adjusting film 11A is formed in the transparent substrate 10). In this state, the region obtained by combining the opening and the removed portion of the phase adjusting film 11B is substantially equivalent to the region having a transmittance averaged in proportion to the area of each element. In this case, the average of the transmittance of the opening and the transmittance of the removed portion of the phase adjusting film 11B is smaller than the transmittance of the opening, so that the structure shown in FIG. 17D is equivalent to the structure shown in FIG. 17C (a quasi-opening having an effective transmittance lower than that of the opening is formed in the vicinity of a high transmittance phase shifter). That is to say, the transmittance (effective transmittance) of the opening including the removed portion of the phase adjusting film 11B is smaller than 1, so that a margin for size control of the opening can be increased.

Furthermore, when the transmittance adjusting film 11A is made of a single layered thin film, compared with the case where a transmittance adjusting film having a multilayered structure is used, the peeling of the transmittance adjusting film 11A is prevented when the transmittance adjusting film 11A having a small width is formed between the opening and the high transmittance phase shifter.

SECOND EMBODIMENT

Hereinafter, a photomask according to a second embodiment of the present invention, a method for producing the photomask and a method for forming a pattern using the photomask will be described with reference to the accompanying drawings. The photomask of the second embodiment is a photomask of a reduction projection exposure system to realize the above-described outline enhancement method.

FIG. 18A shows an example of a desired pattern to be formed with the photomask of the second embodiment.

In this embodiment, when describing pattern formation, the description is based on the positive resist process, unless otherwise specified. That is to say, the description is based on the assumption that an exposed portion of the resist film is removed. On the other hand, when a negative resist process is assumed to be used, the description is totally the same as in the case of the positive resist process, except that the exposed portion of the resist film becomes a resist pattern. In this embodiment, the transmittance is expressed by an effective transmittance when the transmittance of the transparent substrate is taken as 100%, unless otherwise specified.

FIG. 18B is a plan view of the photomask of the second embodiment, more specifically, a photomask for forming the desired pattern shown in FIG. 18A. As shown in FIG. 18B, high transmittance phase shifters (light-transmitting portions) are provided so as to correspond to resist-removed portions in the desired pattern. Furthermore, a low transmittance phase shifter (semi-light-shielding portion) having a low transmittance (6 to 15%) that does not allow the resist film to be exposed is used as the light-shielding mask pattern surrounding the high transmittance phase shifter, instead of the complete light-shielding portion that completely shields exposure light. Openings (peripheral portion) having a small width that is not provided with the low transmittance phase shifter are provided in the vicinity of the high transmittance phase shifters. In the second embodiment, a transmittance adjusting film having a lower transmittance with respect to exposure light than that of the transparent substrate is formed in the opening, and thus the transmittance of the opening is adjusted to a smaller value than that of the transmittance of the transparent substrate. Hereinafter, this opening is referred to as a "transmittance adjusting portion". The high transmittance phase shifter and the low transmittance phase shifter transmit exposure light in the same phase, whereas the transmittance adjusting portion transmits exposure light in a phase opposite to the high transmittance phase shifter and the low transmittance phase shifter.

In the second embodiment, the transmittance adjusting portions (openings) are arranged in such a manner that the sides of the transmittance adjusting portions are in contact with the corresponding sides of the rectangular high transmittance phase shifter in a region having a predetermine size or less from each side of the rectangular high transmittance phase shifter, for example, as shown in FIG. 9B.

FIG. 18C is a cross-sectional view taken along line AA' in FIG. 18B, that is a cross-sectional view of the photomask of the second embodiment. As shown in FIG. 18C, the photomask shown in FIG. 18B is realized in the following manner. A semi-light-shielding film (transmittance adjusting film) 21 that has a lower transmittance with respect to exposure light than that of the transparent substrate 20 and a phase adjusting film 22 are formed sequentially on the portion of the transparent substrate 20 in a region other than the light-transmitting portion formation region. The phase adjusting film 22 generates a phase difference of 180 degrees (more specifically (150+360×n) degrees or more and (210+360×n) degrees or less (where n is an integer)) with respect to exposure light between this portion and a multilayered structure of the transparent substrate 20 and the transmittance adjusting film 21 (i.e., transmittance adjusting portion (peripheral portion)). Thus, a phase shift film having a multilayered structure of the transmittance adjusting film 21 and the phase adjusting film 22 and having a low transmittance (about 6% to 15%) that does not allow the resist film to be exposed is formed, and thus a semi-light-shielding portion serving as a low transmittance phase shifter is formed. The phase adjusting film 22 is not formed in the transmittance adjusting portion. It is preferable that the transmittance adjusting film 21 is a thin film, but may be a thick film having an arbitrary thickness. Furthermore, the portion of the transparent substrate 20 in a light-transmitting portion formation region is dug down by a thickness that causes a phase difference of 180 degrees (more specifically (150+360×n) degrees or more and (210+360×n) degrees or less (where n is an integer)) with respect to exposure light between this region and the multilayered structure of the transparent substrate 20 and the transmittance adjusting film 21 (i.e., transmittance adjusting portion). Thus, the dug portion 20a of the transparent 20 makes it possible to form the light-transmitting portion serving as a high transmittance phase shifter. Therefore, the high transmittance phase shifter (light-transmitting portion) and the low transmittance phase shifter (semi-light-shielding portion) made of the multilayered structure of the transmittance adjusting film 21 and the phase adjusting film 22 (the phase shift film) sandwich the transmittance adjusting portion not provided with the phase adjusting film 22 (i.e., having a single layered structure of the transmittance adjusting film 21), and thus an outline enhancement mask is realized. As the transmittance adjusting film 21, a thin film (having a thickness of 30 nm or less) made of a metal such as Zr, Cr, Ta, Mo or Ti or a thin film (having a thickness of 30 nm or less) made of a metal alloy such as a Ta—Cr alloy, a Zr—Si alloy, a Mo—Si alloy or a Ti—Si alloy can be used. As the phase adjusting film 22, an oxide film such as $Sio_2$ film can be used. However, in order to enhance contrast by the outline enhancement method, it is necessary to limit the width of the transmittance adjusting portion to a predetermined size or less.

Next, a method for forming a pattern using the photomask of the second embodiment will be described.

FIGS. 19A to 19D are cross-sectional views showing the processes of a method forming patterns with the photomask of the second embodiment.

First, as shown in FIG. 19A, after a film 201 to be processed such as a metal film or an insulating film is formed on a substrate 200, as shown in FIG. 19B, a positive resist film 202 is formed on the film to be processed 201.

Next, as shown in FIG. 19C, the photomask of the second embodiment including the low transmittance phase shifter made of the multilayered structure (phase shift film) of the transmittance adjusting film 21 and the phase adjusting film 22, a transmittance adjusting portion having a single layered structure of the transmittance adjusting film 21, and a light-transmitting portion functioning as a high transmittance phase shifter by the dug portion 20a is irradiated with exposure light 203 with an oblique incident exposure light source to expose the resist film 202 with transmitted light 204 transmitted through the photomask. In this case, as the mask pattern, the low transmittance phase shifter (semi-light-shielding portion) is used, so that the entire resist film 202 is exposed with weak energy. However, as shown in FIG. 19C, only a latent image portion 202a of the resist film 202 corresponding to the light-transmitting portion (dug portion 20a) in the photomask is irradiated with exposure energy that is sufficient to dissolve the resist film 202 in a developing process.

Next, the latent image portion 202a is removed by performing development with respect to the resist film 202, so that as shown in FIG. 19D, a resist pattern 205 is formed. In this case, in the exposure process shown in FIG. 19C, light around the light-transmitting portion is canceled, so that a-portion corresponding to the periphery of the light-transmitting portion (transmittance adjusting portion) in the resist film 202 is substantially not irradiated with exposure energy. Therefore, the contrast in the light intensity distribution between the light transmitted through the light-transmitting portion and the light transmitted through the transmittance adjusting portion, in other words, the contrast in the light intensity distribution between the light with which the latent image portion 202a is irradiated and the light with which the periphery of the latent portion 202a is irradiated can be enhanced. Therefore, the energy distribution in the latent portion 202a is changed sharply, so that a resist pattern 205 having a sharp shape can be formed.

Next, a method for producing a photomask of the second embodiment will be described with reference to the drawings.

FIGS. 20A to 20E are cross-sectional views showing the processes of a method producing the photomask of the second embodiment. FIG. 20F is a plan view corresponding to the cross-sectional view of FIG. 20C, and FIG. 20G is a plan view corresponding to the cross-sectional view of FIG. 20E.

First, as shown in FIG. 20A, a transmittance adjusting film 21 having a transmittance lower than that of the transparent substrate 20 with respect to exposure light and a phase adjusting film 22 are formed sequentially on a transparent substrate 20 made of a material having light-transmitting properties with respect to exposure light, such as quartz. The phase adjusting film 22 generates a phase difference of $(150+360 \times n)$ degrees or more and $(210+360 \times n)$ degrees or less (where n=an integer) with respect to exposure light between this film and the multilayered structure of the transparent substrate 20 and the transmittance adjusting film 21. The phase shift film having a multilayered structure including the transmittance adjusting film 21 and the phase adjusting film 22 constitutes a semi-light-shielding portion having a predetermined transmittance (e.g., 6 to 15%) with respect to exposure light.

Next, as shown in FIG. 20B, a first resist pattern 23 that covers the low transmittance phase shifter (semi-light-shielding portion) formation region is formed on the transparent substrate 20. That is, a first resist pattern 23 having a removed portion in each of the high transmittance phase shifter (light-transmitting portion) formation region and the transmittance adjusting portion (peripheral portion) formation region is formed on the transparent substrate 20. Thereafter, the phase adjusting film 22 is etched with the first resist pattern 23 as a mask to pattern the phase adjusting film 22. Then, the first resist pattern 23 is removed. Thus, as shown in FIGS. 20C and 20F, the portion corresponding to each of the high transmittance phase shifter formation region and the opening formation region in the phase adjusting film 22 is removed.

Figure 20D:
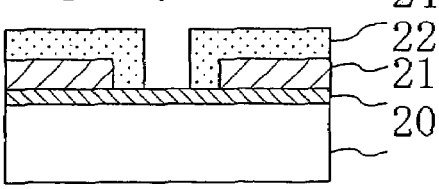
Figure 20E:
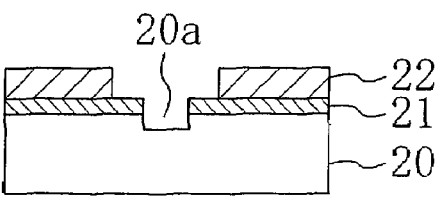
Figure 20F:
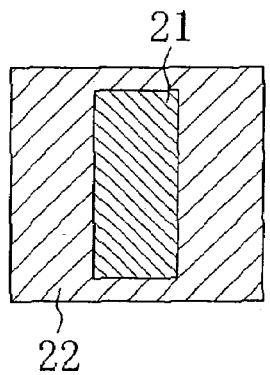
Figure 20G:
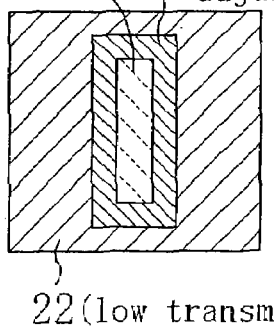

Next, as shown in FIG. 20D, a second resist pattern 24 that covers the low transmittance phase shifter formation region and the transmittance adjusting portion formation region is formed on the transparent substrate 20. That is, a second resist pattern 24 having a removed portion in the high transmittance phase shifter formation region is formed. Thereafter, the transmittance adjusting film 21 and the transparent substrate 20 are etched sequentially with the second resist pattern 24 as a mask. Then, the second resist pattern 24 is removed. Thus, as shown in FIGS. 20E and 20G, the portion corresponding to the high transmittance phase shifter formation region in the transmittance adjusting film 21 is removed. Furthermore, the dug portion 20a that generates a phase inversion of 180 degrees (more specifically, $(150+360 \times n)$ degrees or more and $(210+360 \times n)$ degrees or less (where n is an integer)) between this portion and the multilayered structure of the transparent substrate 20 and the transmittance adjusting film 21 (i.e., the transmittance adjusting portion) is formed in the portion corresponding to the high transmittance phase shifter formation region in the transparent substrate 20, and thus the photomask of the second embodiment is completed. That is to say, the photomask of the second embodiment having a plane structure of the outline enhancement mask can be easily formed by, as a mask blank, preparing a transparent substrate in which a phase shift film including a transmittance adjusting film and a phase adjusting film is deposited, and then performing etching with respect to the phase adjusting film, the transmittance adjusting film and the transparent substrate sequentially.

As described above, according to the second embodiment, the phase shift film (a multilayered structure of the transmittance adjusting film 21 and the phase adjusting film 22) that transmits exposure light at a low transmittance with a phase inversion is formed on the portion of the transparent substrate 20 in the low transmittance phase shifter (semi-light-shielding portion) formation region. Furthermore,.the portion of the transparent substrate 20 in the light-transmitting portion formation region is dug down by a thickness that causes the exposure light to have a phase inversion so that a light-transmitting portion is formed. Furthermore, a single layered structure of the transmittance adjusting film 21 is formed on the portion of the transparent substrate 20 in the transmittance adjusting film formation region. Therefore, the transmittance adjusting portion having a single layered structure of the transmittance adjusting film 21, that is, the peripheral portion that transmits exposure light in the phase opposite to that of the light-transmitting portion is sandwiched by the light-transmitting portion that serves as the high transmittance phase shifter by the dug portion 20a and the low transmittance phase shifter that transmits exposure light in the same phase as that of the light-transmitting portion and is made of the phase shift film. As a result, the contrast in the light intensity distribution between the light-transmitting portion and the peripheral portion can be enhanced by mutual interference between the light transmitted through the peripheral portion and the light transmitted through the light-transmitting portion. This contrast enhancement effect also can be obtained when a fine isolated resist-removed portion (i.e., a fine isolated space pattern) is formed with oblique incident exposure, for example, in the positive resist process. That is to say, a combination of the photomask of this embodiment and oblique incident exposure can miniaturize isolated space patterns and isolated line patterns or dense patterns at the same time.

According to the second embodiment, the phase shift film serving as a low transmittance phase shifter has a multilayered structure of the transmittance adjusting film 21 having a low transmittance and the phase adjusting film 22 having a high transmittance. Therefore, a combination of a desired phase change and a desired transmittance can be selected arbitrarily for the phase shift film. A combination of the material of the transmittance adjusting film 21 and the material of the phase adjusting film 22 makes it possible to improve the selection ratio at etching for processing the phase shift film.

According to the second embodiment, a single layered structure of the transmittance adjusting film 21 is formed on the portion of the transparent substrate 20 in the peripheral portion formation region, so that the transmittance of the peripheral portion is lower than that of the transparent substrate 20, and therefore the peripheral portion serves as a transmittance adjusting portion. That is to say, the transmittance of the peripheral portion can be adjusted to a desired value by the transmittance adjusting film 21. Therefore, it is avoided that the transmittance of the peripheral portion is the highest on the photomask, so that the degree of miniaturization required for the peripheral portion can be reduced. In other words, the problem that the upper limit of the size of the peripheral portion, i.e., the opening in the outline enhancement mask is small, which makes it difficult to produce a photomask, can be prevented.

According to the second embodiment, after the transmittance adjusting film 21 and the phase adjusting film 22 are formed sequentially on the transparent substrate 20, the phase adjusting film 22, the transmittance adjusting film 21 and the transparent substrate 20 are etched selectively, and therefore a mask pattern with any shape can be easily realized that has the low transmittance phase shifter (semi-light-shielding portion) and the transmittance adjusting portion (peripheral portion), and a light-transmitting portion with any shape can be easily realized that serves as the high transmittance phase shifter.

According to the second embodiment, an opening (transmittance adjusting portion) having any shape can be formed by processing the phase adjusting film 22 constituting the low transmittance phase shifter, so that as the layout of the outline enhancement mask, not only the type shown in FIGS. 18B and 18C, that is, the type shown in FIG. 9B, but also all the types shown in FIGS. 9A to 9F, for example, can be realized.

In the second embodiment, it is preferable that the transmittance of the phase shift film having a multilayered structure of the transmittance adjusting film 21 and the phase adjusting film 22 is 6% or more and 15% or less. Thus, the contrast enhancement effect can be obtained reliably while preventing a reduction in thickness of the resist film in pattern formation.

In the second embodiment, the description is based on the use of the positive resist process, but the negative resist process can be used, instead of the positive resist process. In this case, in either one of the processes, as the exposure light source, the i line (wavelength 365 nm), KrF excimer laser light (wavelength 248 nm), ArF excimer laser light (wavelength 193 nm), or $F_2$ excimer laser light (wavelength 157 nm) can be used, for example.

In the second embodiment, it is preferable that the transmittance adjusting film 21 is made of a single layered film that generates a phase difference of (−30+360×n) degrees or more and (30+360×n) degrees or less (where n=an integer) between this film and the transparent substrate 20. By doing this, photomask process can be performed easily only by preparing a mask blank for a regular half-tone phase-shifting mask in which a transmittance adjusting film made of a single layered thin film and a phase shift film made of a phase adjusting film are formed on a transparent substrate, and etching each of the phase adjusting film, the transmittance adjusting film and the transparent substrate. In this case, as the transmittance adjusting film 21, for example, a metal thin film is used, the transmittance adjusting film 21 can be utilized as an etching mask having a high selection ratio with respect to the transparent substrate 20 made of quartz or the like in substrate etching for forming the dug portion 20a in the transparent substrate 20, which is advantageous.

First Variation of the Second Embodiment

Hereinafter, a photomask of a first variation of the second embodiment and a method for producing the photomask will be described with reference to the accompanying drawings.

The first variation of the second embodiment is different from the second embodiment in the following aspects. In the second embodiment, the outline enhancement mask having a layout in which the high transmittance phase shifter (light-transmitting portion) and the opening (transmittance adjusting portion) are adjacent as shown, for example, in FIGS. 9A to 9C is described. In the first variation of the second embodiment, the outline enhancement mask having a layout in which the high transmittance phase shifter and the opening are apart as shown, for example, in FIGS. 9D to 9F is described.

FIGS. 21A to 21E are cross-sectional views showing the processes of a method producing a photomask of the first variation example of the second embodiment. FIG. 21F is a plan view corresponding to the cross-sectional view of FIG. 21C, and FIG. 21G is a plan view corresponding to the cross-sectional view of FIG. 21E.

First, as shown in FIG. 21A, a transmittance adjusting film 21 having a lower transmittance with respect to exposure light than that of a transparent substrate 20 and a phase adjusting film 22 are formed sequentially on the transparent substrate 20 made of a material having light-transmitting properties with respect to exposure light, such as quartz. The phase adjusting film 22 generates a phase difference of (150+360×n) degrees or more and (210+360×n) degrees or less (where n=an integer) with respect to exposure light between this film and a multilayered structure of the transparent substrate 20 and the transmittance adjusting film 21 (i.e., transmittance adjusting portion). The phase shift film made of a multilayered structure of the transmittance adjusting film 21 and the phase adjusting film 22 is a semi-lightshielding portion having a predetermined transmittance (6% to 15%) with respect to exposure light.

Next, as shown in FIG. 21B, a first resist pattern 23 that covers a low transmittance phase shifter (semi-light-shielding portion) formation region is formed on the transparent substrate 20. That is, a first resist pattern 23 having a removed portion in each of a high transmittance phase shifter (light-transmitting portion) formation region and a transmittance adjusting portion (peripheral portion) formation region is formed. In this example, the transmittance adjusting portion formation region and the high transmittance phase shifter formation region are apart. In other words, the first resist pattern 23 is interposed between the transmittance adjusting portion formation region and the high transmittance phase shifter formation region. Thereafter, the phase adjusting film 22 is etched with the first resist pattern 23 as a mask to pattern the phase adjusting film 22. Then, the first resist pattern 23 is removed. Thus, as shown in FIGS. 21C and 21F, the portion corresponding to each of the high transmittance phase shifter formation region and the transmittance adjusting portion formation region in the phase adjusting film 22 is removed.

Figure 21D:
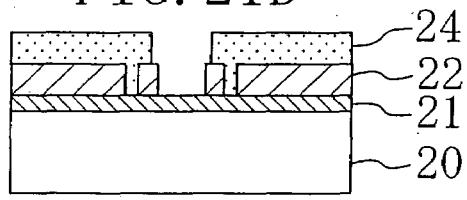
Figure 21E:
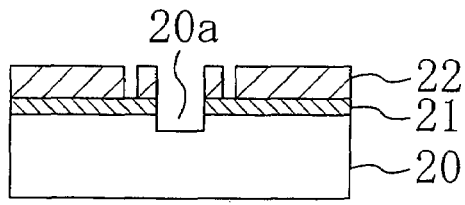
Figure 21F:
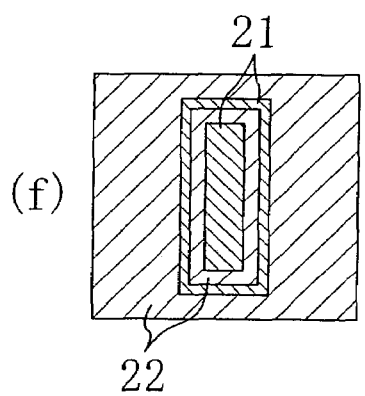
Figure 21G:
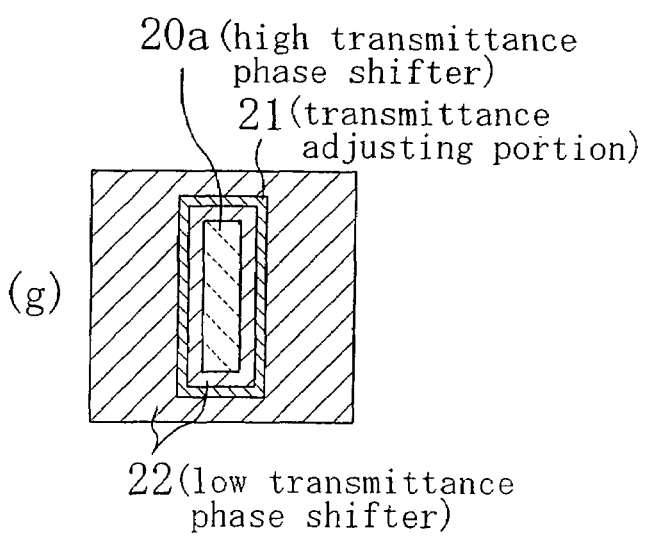

Next, as shown in FIG. 21D, a second resist pattern 24 that covers the low transmittance phase shifter formation region including the transmittance adjusting portion formation region and that has a removed portion in the high transmittance phase shifter formation region is formed on the transparent substrate 20. Thereafter, the transmittance adjusting film 21 and the transparent substrate 20 are etched sequentially with the second resist pattern 24 and the patterned phase adjusting film 22 as masks. Then, the second resist pattern 24 is removed. Thus, as shown in FIGS. 21E and 21G, the portion corresponding to the high transmittance phase shifter formation region in the transmittance adjusting film 21 is removed. Furthermore, a dug portion 20a that generates a phase inversion of 180 degrees (more specifically, (150+360×n) degrees or more and (210+360×n) degrees or less (where n is an integer)) is formed in the portion corresponding to the high transmittance phase shifter formation region in the transparent substrate 20, and thus the photomask of the first variation of the second embodiment is completed.

According to the first variation of the second embodiment, the following advantages can be obtained, in addition to those of the second embodiment. Since the patterned phase adjusting film 22 is used as a mask for etching the transparent substrate 20 in a self-alignment manner, photomask process can be performed precisely.

Second Variation of the Second Embodiment

Hereinafter, a photomask of a second variation of the second embodiment and a method for producing the photomask will be described with reference to the accompanying drawings.

The second variation of the second embodiment is different from the second embodiment in the following aspects. In the second embodiment, the outline enhancement mask having a layout in which the high transmittance phase shifter (light-transmitting portion) and the opening (transmittance adjusting portion) are adjacent as shown, for example, in FIGS. 9A to 9C is described. In the second variation of the second embodiment as well as the first variation of the second embodiment, the outline enhancement mask having a layout in which the high transmittance phase shifter and the transmittance adjusting portion are apart as shown, for example, in FIGS. 9D to 9F is described.

FIGS. 22A to 22E are cross-sectional views showing the processes of a method producing a photomask of the second variation example of the second embodiment. FIG. 22F is a plan view corresponding to the cross-sectional view of FIG. 22C, and FIG. 22G is a plan view corresponding to the cross-sectional view of FIG. 22E.

First, as shown in FIG. 22A, a transmittance adjusting film 21 having a lower transmittance with respect to exposure light than that of a transparent substrate 20 and a phase adjusting film 22 are formed sequentially on the transparent substrate 20 made of a material having light-transmitting properties with respect to exposure light, such as quartz. The phase adjusting film 22 generates a phase difference of (150+360×n) degrees or more and (210+360×n) degrees or less (where n=an integer) with respect to exposure light between this film and a multilayered structure of the transparent substrate 20 and the transmittance adjusting film 21. (i.e., transmittance adjusting portion). The phase shift film made of a multilayered structure of the transmittance adjusting film 21 and the phase adjusting film 22 is a semi-light-shielding portion having a predetermined transmittance (6% to 15%) with respect to exposure light.

Next, as shown in FIG. 22B, a first resist pattern 23 that covers a region a low transmittance phase shifter (semi-light-shielding portion) formation region and a high transmittance phase shifter (light-transmitting portion) formation region is formed on the transparent substrate 20. That is, a first resist pattern 23 having a removed portion in a transmittance adjusting portion (peripheral portion) formation region is formed. Thereafter, the phase adjusting film 22 is etched with the first resist pattern 23 as a mask to pattern the phase adjusting film 22. Then, the first resist pattern 23 is removed. Thus, as shown in FIGS. 22C and 22F, the portion corresponding to the transmittance adjusting portion formation region in the phase adjusting film 22 is removed.

Figure 22D:
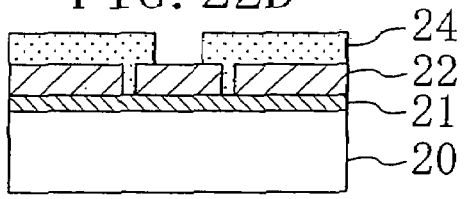
Figure 22E:
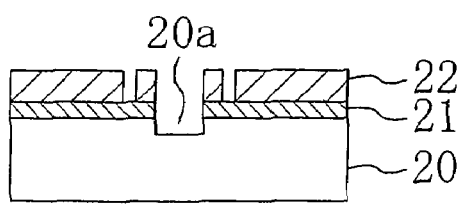
Figure 22F:
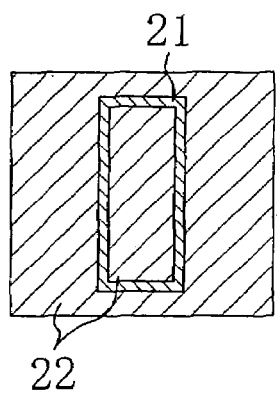
Figure 22G:
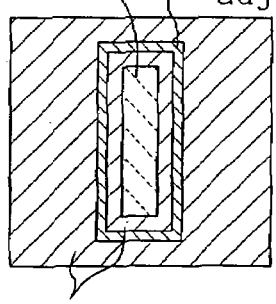

Next, as shown in FIG. 22D, a second resist pattern 24 that covers the low transmittance phase shifter formation region and the transmittance adjusting portion formation region is formed on the transparent substrate 20. That is to say, a second resist pattern 24 that has a removed portion in the high transmittance phase shifter formation region is formed on the transparent substrate 20. Thereafter, the phase adjusting film 22, the transmittance adjusting film 21 and the transparent substrate 20 are etched sequentially with the second resist pattern 24 as a mask. Then, the second resist pattern 24 is removed. Thus, as shown in FIGS. 22E and 22G, the portion corresponding to the high transmittance phase shifter formation region in each of the transmittance adjusting film 21 and the phase adjusting film 22 is removed. Furthermore, a dug portion 20a that generates a phase inversion of 180 degrees (more specifically, (150+360×n) degrees or more and (210+360×n) degrees or less (where n is an integer)) between this portion and a multilayered structure of the transparent substrate 20 and the transmittance adjusting film 21 (i.e., transmittance adjusting portion) is formed in the portion corresponding to the high transmittance phase shifter formation region in the transparent substrate 20, and thus the photomask of the second variation of the second embodiment is completed.

According to the second variation of the second embodiment, the following advantages can be obtained, in addition to those of the second embodiment. In this variation, the process of removing the portion corresponding to the transmittance adjusting portion formation region in the phase adjusting film 22 (see FIG. 22C) and the process of removing the portion corresponding to the high transmittance phase shifter formation region in the phase adjusting film 22

(see FIG. 22E) are performed separately. Therefore, if the transmittance adjusting portion is apart from the high transmittance phase shifter with a small distance, in other words, if the phase adjusting film 22 having a small width is left between the transmittance adjusting portion and the high transmittance phase shifter, the margin for photomask process becomes large.

In the second variation of the second embodiment, before performing the process of removing the portion corresponding to the transmittance adjusting portion formation region in the phase adjusting film 22, the process of removing the portion corresponding to the high transmittance phase shifter formation region in the phase adjusting film 22 (including the process of removing the portion corresponding to the high transmittance phase shifter formation region in the transmittance adjusting film 21 and forming a dug portion 20a in the transparent substrate 20) may be performed.

THIRD EMBODIMENT

Hereinafter, a photomask according to a third embodiment of the present invention, a method for producing the photomask and a method for forming a pattern using the photomask will be described with reference to the accompanying drawings. The photomask of the third embodiment is a photomask of a reduction projection exposure system to realize the above-described outline enhancement method.

FIG. 23A shows an example of a desired pattern to be formed with the photomask of the third embodiment.

In this embodiment, when describing pattern formation, the description is based on the positive resist process, unless otherwise specified. That is to say, the description is based on the assumption that an exposed portion of the resist film is removed. On the other hand, when a negative resist process is assumed to be used, the description is totally the same as in the case of the positive resist process, except that the exposed portion of the resist film becomes a resist pattern. In this embodiment, the transmittance is expressed by an effective transmittance when the transmittance of the transparent substrate is taken as 100%, unless otherwise specified.

FIG. 23B is a plan view of the photomask of the third embodiment, more specifically, a photomask for forming the desired pattern shown in FIG. 23A. As shown in FIG. 23B, high transmittance phase shifters (light-transmitting portions) are provided so as to correspond to resist-removed portions in the desired pattern. Furthermore, a low transmittance phase shifter (semi-light-shielding portion) having a low transmittance (about 6 to 15%) that does not allow the resist film to be exposed is used as the light-shielding mask pattern surrounding the high transmittance phase shifter, instead of the complete light-shielding portion that completely shields exposure light. Openings (peripheral portion) having a small width that is not provided with the low transmittance phase shifter are provided in the vicinity of the high transmittance phase shifters. The high transmittance phase shifter and the low transmittance phase shifter transmit exposure light in the same phase, whereas the openings transmits exposure light in a phase opposite to the high transmittance phase shifter and the low transmittance phase shifter.

In the third embodiment, for example, as shown in FIG. 9B, the openings are arranged in such a manner that the sides of the openings are in contact with the corresponding sides of the rectangular high transmittance phase shifter in a region having a predetermine size or less from each side of the rectangular high transmittance phase shifter.

FIG. 23C is a cross-sectional view taken along line AA' in FIG. 23B, that is, a cross-sectional view of the photomask of the third embodiment. As shown in FIG. 23C, the photomask shown in FIG. 23B is realized in the following manner. A phase adjusting film 31 and a semi-light-shielding film (transmittance adjusting film) 32 having a lower transmittance with respect to exposure light than that of the transparent substrate 30 are formed sequentially on the portion of the transparent substrate 30 in the low transmittance phase shifter formation region. The phase adjusting film 31 generates a phase difference of 180 degrees (more specifically (150+360×n) degrees or more and (210+360×n) degrees or less (where n is an integer)) with respect to exposure light between this film and the transparent substrate 30 (opening). Thus, a phase shift film having a multilayered structure of the phase adjusting film 31 and the transmittance adjusting film 32 and having a low transmittance (about 6% to 15%) that does not allow the resist film to be exposed is formed, and thus a semi-light-shielding portion serving as the low transmittance phase shifter is formed. In this embodiment, it is assumed that the transmittance adjusting film 32 transmits light at a low transmittance and a phase change of light by the thickness of the transmittance adjusting film 32 is only small. Furthermore, a single layered structure of the phase adjusting film 31 is formed on the portion of the transparent substrate 30 in the light-transmitting portion formation region, and thus a light-transmitting portion serving as the high transmittance phase shifter is formed. Therefore, the high transmittance phase shifter (light-transmitting portion) and the low transmittance phase shifter (semi-light-shielding portion) made of the multilayered structure of the phase adjusting film 31 and the transmittance adjusting film 32 (the phase shift film) sandwich the peripheral portion, that is, the opening (the surface of the transparent substrate 30 is exposed) that is not provided with the phase adjusting film 31, and thus an outline enhancement mask is realized. As the phase adjusting film 31, an oxide film such as $SiO_2$ film can be used. As the phase adjusting film 32, a thin film (having a thickness of 30 nm or less) made of a metal such as Zr, Cr, Ta, Mo or Ti or a thin film (having a thickness of 30 nm or less) made of a metal alloy such as a Ta—Cr alloy, a Zr—Si alloy, a Mo—Si alloy or a Ti—Si alloy can be used. However, in order to enhance contrast by the outline enhancement method, it is necessary to limit the width of the opening to a predetermined size or less.

Next, a method for forming a pattern using the photomask of the third embodiment will be described.

FIGS. 24A to 24D are cross-sectional views showing the processes of a method forming patterns with the photomask of the third embodiment.

First, as shown in FIG. 24A, after a film 301 to be processed such as a metal film or an insulating film is formed on a substrate 300, as shown in FIG. 24B, a positive resist film 302 is formed on the film to be processed 301.

Next, as shown in FIG. 24C, the photomask of the third embodiment including the low transmittance phase shifter made of the multilayered structure (phase shift film) of the phase adjusting film 31 and the transmittance adjusting film 32 and a light-transmitting portion functioning as a high transmittance phase shifter by the single layered structure of the phase adjusting film 31 is irradiated with exposure light 303 with an oblique incident exposure light source to expose the resist film 302 with transmitted light 304 transmitted through the photomask. In this case, as the mask pattern, the low transmittance phase shifter (semi-light-shielding portion) is used, so that the entire resist film 302 is exposed with weak energy. However, as shown in FIG. 24C, only a latent image portion 302a of the resist film 302 corresponding to the light-transmitting portion in the photomask is irradiated with exposure energy that is sufficient to dissolve the resist film 302 in a developing process.

Next, the latent image portion 302a is removed by performing development with respect to the resist film 302, so that as shown in FIG. 24D, a resist pattern 305 is formed. In this case, in the exposure process shown in FIG. 24C, light around the light-transmitting portion is canceled, so that a portion corresponding to the opening portion (peripheral portion) in the resist film 302 is substantially not irradiated with exposure energy. Therefore, the contrast in the light intensity distribution between the light transmitted through the light-transmitting portion and the light transmitted through the peripheral portion, in other words; the contrast in the light intensity distribution between the light with which the latent image portion 302a is irradiated and the light with which the periphery of the latent portion 302a is irradiated can be enhanced. Therefore, the energy distribution in the latent portion 302a is changed sharply, so that a resist pattern 305 having a sharp shape can be formed.

Next, a method for producing a photomask of the third embodiment will be described with reference to the drawings.

FIGS. 25A to 25E are cross-sectional views showing the processes of a method producing the photomask of the third embodiment. FIG. 25F is a plan view corresponding to the cross-sectional view of FIG. 25C, and FIG. 25G is a plan view corresponding to the cross-sectional view of FIG. 25E.

First, as shown in FIG. 25A, a phase adjusting film 31 and a transmittance adjusting film 32 having a transmittance lower than that of the transparent substrate 30 with respect to exposure light are formed sequentially on a transparent substrate 30 made of a material having light-transmitting properties with respect to exposure light, such as quartz. The phase adjusting film 31 generates a phase difference of (150+360×n) degrees or more and (210+360×n) degrees or less (where n=an integer) with respect to exposure light between this film and the transparent substrate 30 (opening). The phase shift film having a multilayered structure including the phase adjusting film 31 and the transmittance adjusting film 32 constitutes a semi-light-shielding portion having a predetermined transmittance (e.g., 6 to 15%) with respect to exposure light. In this embodiment, for example, a light-shielding film (chromium film or the like used as a light-shielding film of a regular photomask) that has come to have a low transmittance by making the film thickness small can be used as the transmittance adjusting film 32.

Next, as shown in FIG. 25B, a first resist pattern 33 that covers the low transmittance phase shifter (semi-light-shielding portion) formation region and the high transmittance phase shifter (light-transmitting portion) formation region is formed on the transparent substrate 30. That is, a first resist pattern 33 having a removed portion in the opening (peripheral portion) formation region is formed on the transparent substrate 30. Thereafter, the transmittance adjusting film 32 and the phase adjusting film 31 are etched with the first resist pattern 33 as a mask. Then, the first resist pattern 33 is removed. Thus, as shown in FIGS. 25C and 25F, the portion corresponding to the opening formation region in the multilayered structure (phase shift film) of the phase adjusting film 31 and the transmittance adjusting film 32 is removed.

Figure 25D:
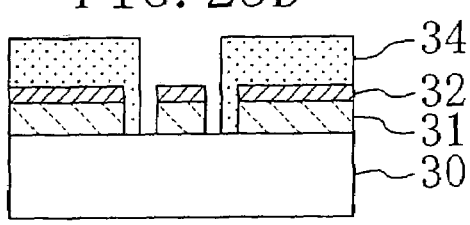
Figure 25E:
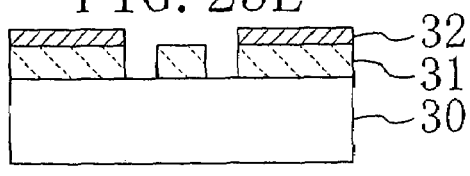
Figure 25F:
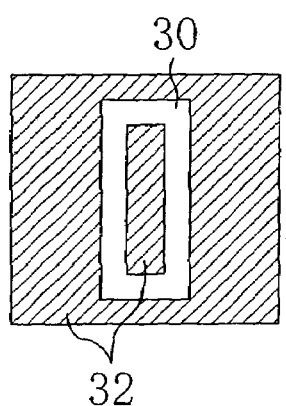
Figure 25G:
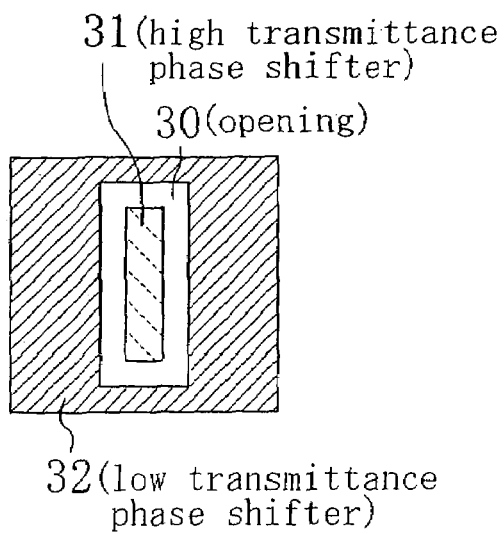

Next, as shown in FIG. 25D, a second resist pattern 34 that covers at least the low transmittance phase shifter formation region and has a removed portion in the high transmittance phase shifter formation region is formed on the transparent substrate 30. Thereafter, the transmittance adjusting film 32 is etched with the second resist pattern 34 as a mask. Then, the second resist pattern 34 is removed. Thus, as shown in FIGS. 25E and 25G, the portion corresponding to the high transmittance phase shifter formation region in the transmittance adjusting film 32 is removed, and thus the photomask of the third embodiment is completed. That is to say, the photomask of the third embodiment having a plane structure of the outline enhancement mask can be easily formed by, as a mask blank, preparing a transparent substrate in which a phase adjusting film that generates a phase inversion of 180 degrees and a thin light-shielding film (transmittance adjusting film) are deposited sequentially, and then performing etching with respect to the light-shielding film and the phase adjusting film sequentially.

As described above, according to the third embodiment, the phase shift film (a multilayered structure of the phase adjusting film 31 and the transmittance adjusting film 32) that transmits exposure light at a low transmittance with a phase inversion is formed on the portion of the transparent substrate 30 in the low transmittance phase shifter (semi-light-shielding portion) formation region. Furthermore, a single layered structure of the phase adjusting film 31 is formed on the portion of the transparent substrate 30 in the light-transmitting portion formation region so that a light-transmitting portion is formed. Therefore, the opening that is not provided with the phase shift film, that is, the peripheral portion that transmits exposure light in the phase opposite to that of the light-transmitting portion is sandwiched by the light-transmitting portion that serves as the high transmittance phase shifter by the single layered structure of the phase adjusting film 31 and the low transmittance phase shifter that transmits exposure light in the same phase as that of the light-transmitting portion and made of the phase shift film. As a result, the contrast in the light intensity distribution between the light-transmitting portion and the peripheral portion can be enhanced by mutual interference between the light transmitted through the peripheral portion and the light transmitted through the light-transmitting portion. This contrast enhancement effect also can be obtained when a fine isolated resist-removed portion (i.e., a fine isolated space pattern) is formed with oblique incident exposure, for example, in the positive resist process. That is to say, a combination of the photomask of this embodiment and oblique incident exposure can miniaturize isolated space patterns and isolated line patterns or dense patterns at the same time.

According to the third embodiment, the phase shift film serving as a low transmittance phase shifter has a multilayered structure of the phase adjusting film 31 having a high transmittance and the transmittance adjusting film 32 having a low transmittance. Therefore, a combination of a desired phase change and a desired transmittance can be selected arbitrarily for the phase shift film. A combination of the material of the phase adjusting film 31 and the material of the transmittance adjusting film 32 makes it possible to improve the selection ratio at etching for processing the phase shift film.

According to the third embodiment, after the phase adjusting film 31 and the transmittance adjusting film 32 are formed sequentially on the transparent substrate 30, the transmittance adjusting film 32 and the phase adjusting film 31 are etched selectively, and therefore a mask pattern with any shape can be easily realized that has the low transmittance phase shifter (semi-light-shielding portion) and the opening (peripheral portion), and a light-transmitting portion with any shape can be easily realized that serves as the high transmittance phase shifter.

According to the third embodiment, an opening with any shape can be formed by processing the multilayered structure (phase shift film) of the phase adjusting film 31 and the transmittance adjusting film 32 constituting the low transmittance phase shifter, so that as the layout of the outline enhancement mask, not only the type shown in FIGS. 23B and 23C, that is, the type shown in FIG. 9B, but also all the types shown in FIGS. 9A to 9F, for example, can be realized.

In the third embodiment, the transmittance adjusting film 32 is made of a thin light-shielding film, that is, a single layered film that generates a phase difference of (−30+360× n) degrees or more and (30+360×n) degrees or less (where n=an integer) between this film and a multilayered structure of the transparent substrate 30 and the phase adjusting film 31. Accordingly, the following advantages can be provided. The photomask process can be performed easily only by preparing a mask blank for a half-tone phase-shifting mask in which a phase shift film including a phase adjusting film, which is a lower layer, and a transmittance adjusting film, which is an upper layer, is formed on a transparent substrate, and etching each of the phase adjusting film and the transmittance adjusting film. In other words, there is an advantage that a conventional technique can be used in the photomask production. Furthermore, since the transmittance adjusting film is a thin light-shielding film, the structure of a mask blank to be prepared is very simple.

Hereinafter, the results of examination with simulations of an influence of a phase change (a phase difference caused between the high transmittance phase shifter and the low transmittance phase shifter) due to the use of the thin light-shielding film as the transmittance adjusting film 32 on the pattern formation will be described with reference to FIGS. 26A to 26C. The simulation conditions are such that the wavelength λ of the exposure light is 0.193 μm (ArF light source), the numerical aperture NA of the projection optical system of the exposure apparatus is 0.6, and annular illumination is used.

FIG. 26A shows a plan view of an outline enhancement mask used in the simulations. As shown in FIG. 26A, the width of the high transmittance phase shifter (light-transmitting portion) and the opening (peripheral portion) is 200 nm and 50 nm, respectively. The transmittance of the high transmittance phase shifter, the opening and the low transmittance phase shifter (semi-light-shielding portion) is 100%, 100% and 7.5%, respectively. The high transmittance phase shifter generates a phase difference of 180 degrees between this portion and the opening, and the low transmittance phase shifter generates a phase difference of 180 to 150 degrees between this portion and the opening.

FIG. 26B shows the simulation results of the light intensity distribution corresponding to line AA' when exposure is performed with respect to the outline enhancement mask shown in FIG. 26A in such a manner that phase differences of 180 degrees, 170 degrees, 160 degrees and 150 degrees are generated by the low transmittance phase shifter between this shifter and the opening. As shown in FIG. 26B, if the phase difference between the high transmittance phase shifter and the low transmittance phase shifter is not more than 30 degree or so, the contrast in the light intensity distribution is not substantially affected.

FIG. 26C shows the simulation results of the focus dependence of the size of the finished pattern (CD: Critical Dimension) when exposure is performed with respect to the outline enhancement mask shown in FIG. 26A in such a manner that phase differences of 180 degrees, 170 degrees, 160 degrees and 150 degrees are generated by the low transmittance phase shifter between this shifter and the opening. As shown in FIG. 26C, if the phase difference between the low transmittance phase shifter and the high transmittance phase shifter is changed, the best focus position in which the CD is the peak is changed. However, even if the phase difference is changed, the unlikelihood of CD change with respect to the focus variation, that is, the depth of focus is substantially not changed. No problem is caused in pattern formation, even if the best focus positions are varied in the same manner at all portions on the photomask. Only the depth of focus is an issue in pattern formation. That is to say, if the phase difference between the low transmittance phase shifter and the high transmittance phase shifter is up to about 30 degrees, there is not problem in terms of the focus characteristics.

Therefore, in this embodiment, when a thin light-shielding film is used as the transmittance adjusting film 32, the outline enhancement mask in a strict sense (the phase difference between the low transmittance phase shifter and the high transmittance phase shifter is 0 degree) cannot be realized, but if the phase difference that is caused by a thin film is about 30 degrees or less, the effect of the outline enhancement method is not lost. More specifically, when Ta, Cr or alloys containing Ta or Cr or the like is used as the material of the light-shielding film, the thickness of the light-shielding film that generates a phase difference of about 30 degrees between this film and the high transmittance phase shifter (light-transmitting portion) with respect to light from an ArF light source is approximately 30 nm or more. This thickness is sufficient to realize a transmittance of 10% or less.

In the third embodiment, it is preferable that the transmittance of the phase shift film having a multilayered structure of the phase adjusting film 31 and the transmittance adjusting film 32 is 6% or more and 15% or less. Thus, the contrast enhancement effect can be obtained reliably while preventing a reduction in thickness of the resist film in pattern formation.

In the third embodiment, the description is based on the use of the positive resist process, but the negative resist process can be used, instead of the positive resist process. In this case, in either one of the processes, as the exposure light source, the i line (wavelength 365 nm), KrF excimer laser light (wavelength 248 nm), ArF excimer laser light (wavelength 193 nm), or $F_2$ excimer laser light (wavelength 157 nm) can be used, for example.

In the third embodiment, the outline enhancement mask having a layout in which the high transmittance phase shifter is adjacent to the opening, for example, as shown in FIGS. 9A to 9C has been described, but the outline enhancement mask can have a layout in which the high transmittance phase shifter is apart from the opening, for example, as shown in FIGS. 9D to 9F.

Furthermore, in the third embodiment, the phase difference between the high transmittance phase shifter and the low transmittance phase shifter can be substantially zero by depositing another phase adjusting film on the transmittance adjusting film 32.

In the first to third embodiments, it is assumed that all the portions except the opening (which may be the peripheral portion or the transmittance adjusting portion) and the high transmittance phase-shifter (light-transmitting portion) are made of a low transmittance phase shifter (semi-light-shielding portion). However, the portion in the photomask that is apart from each of the opening and the high transmittance phase shifter by a sufficient distance, that is, a distance (=2×λ/NA (λ is the wavelength of exposure light, and NA is the numerical aperture of a reduction projection optical system of an exposure apparatus)) that allows an influence of optical interference effects from each of the opening and the high transmittance phase shifter to be ignored may be a complete light-shielding portion.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A photomask on a transparent substrate comprising:
a first phase shifter having a semi-light-shielding property with respect to exposure light;
a second phase shifter surrounded by the first phase shifter and having a light-transmitting property with respect to exposure light; and
an opening surrounded by the first phase shifter and positioned in a periphery of the second phase shifter,
wherein the first phase shifter and the second phase shifter transmit the exposure light in a same phase, and
the opening transmits the exposure light in a phase opposite to that of the first phase shifter and the second phase shifter.

2. The photomask according to claim 1,
wherein a first phase shift film is formed on the transparent substrate, as the first phase shifter.

3. The photomask according to claim 1,
wherein a substrate-dug portion is formed by digging the transparent substrate, as the second phase shifter.

4. The photomask according to claim 1,
wherein a second phase shift film is formed on the transparent substrate, as the second phase shifter.

5. The photomask according to claim 1,
wherein in the opening, the first phase shifter and the second phase shifter are not formed.

6. The photomask according to claim 1,
wherein a transmittance with respect to the exposure light of the first phase shifter is 6% or more and 15% or less.

7. The photomask according to claim 1,
wherein a transmittance with respect to the exposure light of the second phase shifter is 60% or more.

8. The photomask according to claim 1,
wherein a first phase shift film is formed on the transparent substrate, as the first phase shifter, and
a substrate-dug portion is formed by digging the transparent substrate, as the second phase shifter.

9. The photomask according to claim 1,
wherein a transmittance with respect to the exposure light of the first phase shifter is lower than a transmittance with respect to the exposure light of the second phase shifter.

10. The photomask according to claim 1,
wherein a transmittance with respect to the exposure light of the first phase shifter is 6% or more and 15% or less, and
a transmittance with respect to the exposure light of the second phase shifter is 60% or more.

11. The photomask according to claim 1,
wherein the second phase shifter has a square shape or rectangular shape, and
the opening comprises a ring-shaped region in contact with the peripheral portion of the second phase shifter.

12. The photomask according to claim 1,
wherein the second phase shifter has a square shape or rectangular shape, and
the opening comprises a plurality of rectangular regions each of which is in contact with each side of the second phase shifter.

13. The photomask according to claim 1,
wherein the second phase shifter has a square shape or rectangular shape,
the opening comprises a ring-shaped region, and
a part of the first phase shifter having a ring shape is present between the opening and the second phase shifter.

14. The photomask according to claim 1,
wherein the second phase shifter has a square shape or rectangular shape,
the opening comprises a plurality of rectangular regions each facing with a side of the second phase shifter, and
a part of the first phase shifter having a ring shape is present between the opening and the second phase shifter.

15. The photomask according to claim 1,
wherein the exposure light transmitted through the first phase shifter and the exposure light transmitted through the opening have a phase difference of $(150+360\times n)$ degrees or more and $(210+360\times n)$ degrees or less (where n=an integer), and
the exposure light transmitted through the second phase shifter and the exposure light transmitted through the opening have a phase difference of $(150+360\times n)$ degrees or more and $(210+360\times n)$ degrees or less (where n=an integer).

16. The photomask according to claim 8,
wherein the first phase shift film is a metal-containing oxide film.

17. The photomask according to claim 8,
wherein the first phase shift film includes a transmittance adjusting film having a transmittance lower than that of the transparent substrate with respect to the exposure light and a phase adjusting film that is formed on the transmittance adjusting film, and transmits the exposure light in a phase opposite to that of the opening.

18. The photomask according to claim 17,
wherein the opening is disposed in a position apart from the second phase shifter by a predetermined distance, and
only the transmittance adjusting film of the first phase shift film is formed between the opening and the second phase shifter.

19. The photomask according to claim 1,
wherein the opening is disposed so as to be in contact with the second phase shifter.

20. The photomask according to claim 1,
wherein the opening is disposed apart from the second phase shifter by a predetermined distance.

* * * * *

UNITED STATES PATENT AND TRADEMARK OFFICE
CERTIFICATE OF CORRECTION

| | |
|---|---|
| PATENT NO. | : 7,282,309 B2 |
| APPLICATION NO. | : 11/598003 |
| DATED | : October 16, 2007 |
| INVENTOR(S) | : Akio Misaka |

It is certified that error appears in the above-identified patent and that said Letters Patent is hereby corrected as shown below:

On the title page

Under section (56) References Cited, FOREIGN PATENT DOCUMENTS, change "JP 10-046806" to -- JP 10-048806 --

Signed and Sealed this

Twenty-fifth Day of March, 2008

JON W. DUDAS
*Director of the United States Patent and Trademark Office*